(12) United States Patent
Hsu et al.

(10) Patent No.: US 10,727,198 B2
(45) Date of Patent: Jul. 28, 2020

(54) SEMICONDUCTOR PACKAGE AND METHOD MANUFACTURING THE SAME

(71) Applicant: Taiwan Semiconductor Manufacturing Co., Ltd., Hsinchu (TW)

(72) Inventors: Feng-Cheng Hsu, New Taipei (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/854,704

(22) Filed: Dec. 26, 2017

(65) Prior Publication Data

US 2019/0006315 A1  Jan. 3, 2019

Related U.S. Application Data

(60) Provisional application No. 62/527,047, filed on Jun. 30, 2017.

(51) Int. Cl.
*H01L 25/065* (2006.01)
*H01L 23/31* (2006.01)
(Continued)

(52) U.S. Cl.
CPC ......... *H01L 25/0652* (2013.01); *H01L 21/56* (2013.01); *H01L 21/561* (2013.01); *H01L 21/568* (2013.01); *H01L 21/6835* (2013.01); *H01L 23/3107* (2013.01); *H01L 23/3128* (2013.01); *H01L 23/3135* (2013.01); *H01L 23/481* (2013.01); *H01L 25/105* (2013.01); *H01L 25/50* (2013.01); *H01L 21/76898* (2013.01); *H01L 23/293* (2013.01); *H01L 2221/6834* (2013.01); *H01L 2221/68327* (2013.01); *H01L 2221/68359* (2013.01); *H01L 2224/0239* (2013.01);
(Continued)

(58) Field of Classification Search
CPC ............. H01L 23/3135; H01L 25/0652; H01L 21/568; H01L 23/3107; H01L 23/481; H01L 25/50
See application file for complete search history.

(56) References Cited

U.S. PATENT DOCUMENTS 9,000,584 B2  4/2015 Lin et al.
9,048,222 B2  6/2015 Hung et al.
(Continued)

OTHER PUBLICATIONS

"Office Action of Taiwan Counterpart Application," dated Jun. 28, 2019, p. 1-p. 5.

*Primary Examiner* — Feifei Yeung Lopez
(74) *Attorney, Agent, or Firm* — JCIPRNET

(57) ABSTRACT

A semiconductor package including an insulating encapsulation, an integrated circuit component, and conductive elements is provided. The integrated circuit component is encapsulated in the insulating encapsulation, wherein the integrated circuit component has at least one through silicon via protruding from the integrated circuit component. The conductive elements are located on the insulating encapsulation, wherein one of the conductive elements is connected to the at least one through silicon via, and the integrated circuit component is electrically connected to the one of the conductive elements through the at least one through silicon via.

20 Claims, 37 Drawing Sheets

(51) Int. Cl.
*H01L 25/00* (2006.01)
*H01L 21/56* (2006.01)
*H01L 23/48* (2006.01)
*H01L 21/683* (2006.01)
*H01L 25/10* (2006.01)
H01L 23/29 (2006.01)
H01L 21/768 (2006.01)

(52) U.S. Cl.
CPC ............... *H01L 2224/02311* (2013.01); *H01L 2224/03462* (2013.01); *H01L 2224/05124* (2013.01); *H01L 2224/11462* (2013.01); *H01L 2224/13101* (2013.01); *H01L 2224/13111* (2013.01); *H01L 2224/13147* (2013.01); *H01L 2224/16225* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06548* (2013.01); *H01L 2225/1041* (2013.01); *H01L 2225/1047* (2013.01); *H01L 2924/1431* (2013.01); *H01L 2924/1433* (2013.01); *H01L 2924/1461* (2013.01); *H01L 2924/18161* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,450 B1* | 6/2016 | Gu | H01L 23/5385 |
| 9,368,460 B2 | 6/2016 | Yu et al. | |
| 9,372,206 B2 | 6/2016 | Wu et al. | |
| 9,496,189 B2 | 11/2016 | Yu et al. | |
| 2003/0135706 A1* | 7/2003 | Lin | G06F 21/6209 |
| | | | 711/163 |
| 2011/0121442 A1* | 5/2011 | Shen | H01L 21/561 |
| | | | 257/686 |
| 2011/0291288 A1* | 12/2011 | Wu | H01L 24/17 |
| | | | 257/774 |
| 2012/0161331 A1* | 6/2012 | Gonzalez | H01L 23/5389 |
| | | | 257/774 |
| 2012/0228780 A1* | 9/2012 | Kim | H01L 23/36 |
| | | | 257/774 |
| 2013/0295725 A1* | 11/2013 | Park | H01L 24/19 |
| | | | 438/124 |
| 2014/0217604 A1* | 8/2014 | Chou | H01L 24/11 |
| | | | 257/774 |
| 2015/0048503 A1* | 2/2015 | Chiu | H01L 23/49816 |
| | | | 257/738 |
| 2016/0099231 A1 | 4/2016 | Yang et al. | |
| 2018/0182744 A1* | 6/2018 | Karhade | H01L 25/105 |

* cited by examiner

SEMICONDUCTOR PACKAGE AND METHOD MANUFACTURING THE SAME

CROSS-REFERENCE TO RELATED APPLICATION

This application claims the priority benefit of U.S. provisional application Ser. No. 62/527,047, filed on Jun. 60, 2017. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many semiconductor integrated circuits are typically manufactured on a single semiconductor wafer. Dies of the wafer may be processed and packaged at the wafer level, and various technologies have been developed for wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
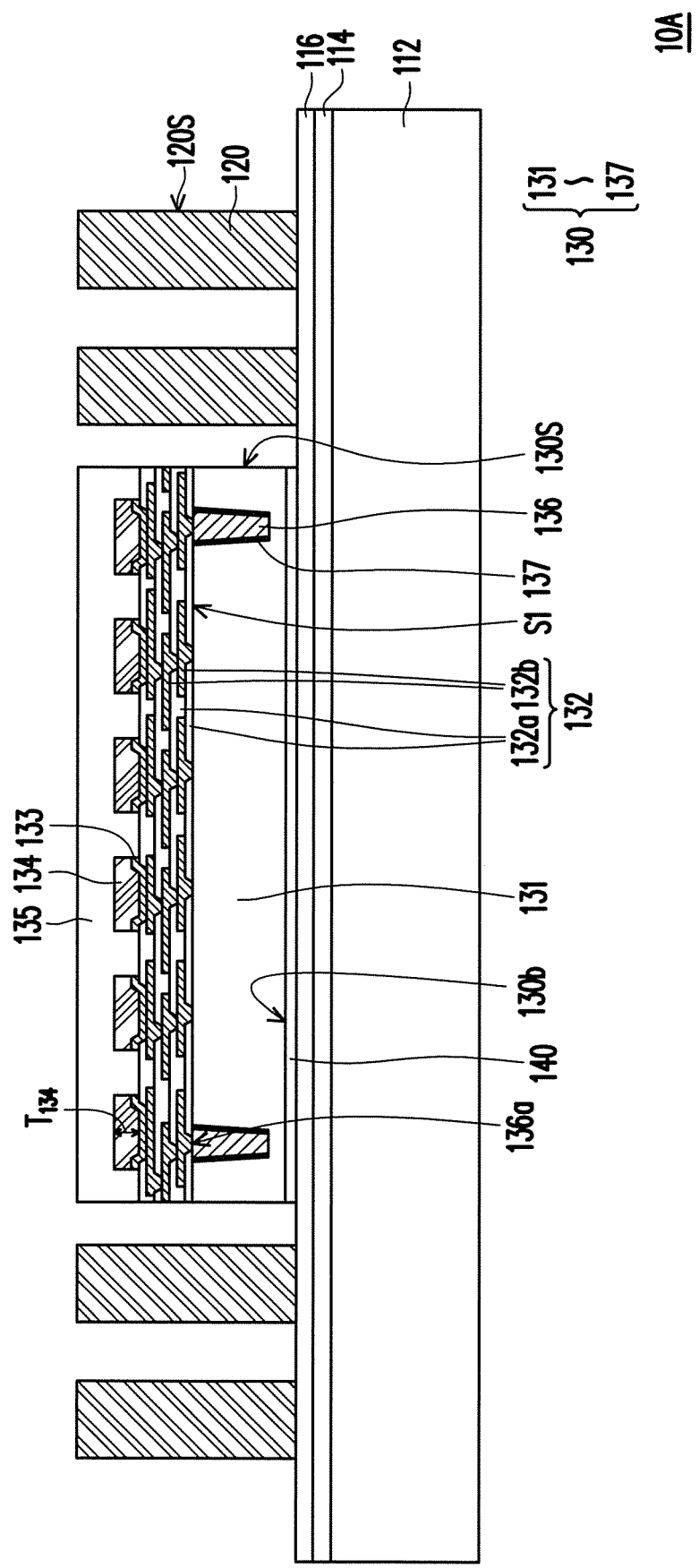
FIG. 1 to FIG. 14 are schematic cross-sectional views of various stages of manufacturing a semiconductor package in accordance with some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 14 are schematic cross-sectional views of various stages of manufacturing a semiconductor package in accordance with some exemplary embodiments of the disclosure. FIG. 15 is a schematic enlarged cross-sectional view illustrating a part of the semiconductor package depicted in FIG. 14, where FIG. 15 illustrates an enlarged cross-sectional view of a portion of the semiconductor package depicted in FIG. 14 indicated by a dotted box A. In FIG. 1 to FIG. 14, a semiconductor package 10A is shown to represent a package structure obtained following the manufacturing method, for example. In some embodiments, two integrated circuit components are shown to represent plural integrated circuit components (or semiconductor devices/dies/chips) of the wafer; and in addition, one or more packages are shown to represent plural semiconductor packages obtained following the semiconductor manufacturing method, the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) and an adhesive layer (such as an ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity.

The debond layer 114 and the buffer layer 116 may be formed by a suitable fabrication technique such as spin-coating, lamination, deposition, or the like.

Figure 37:
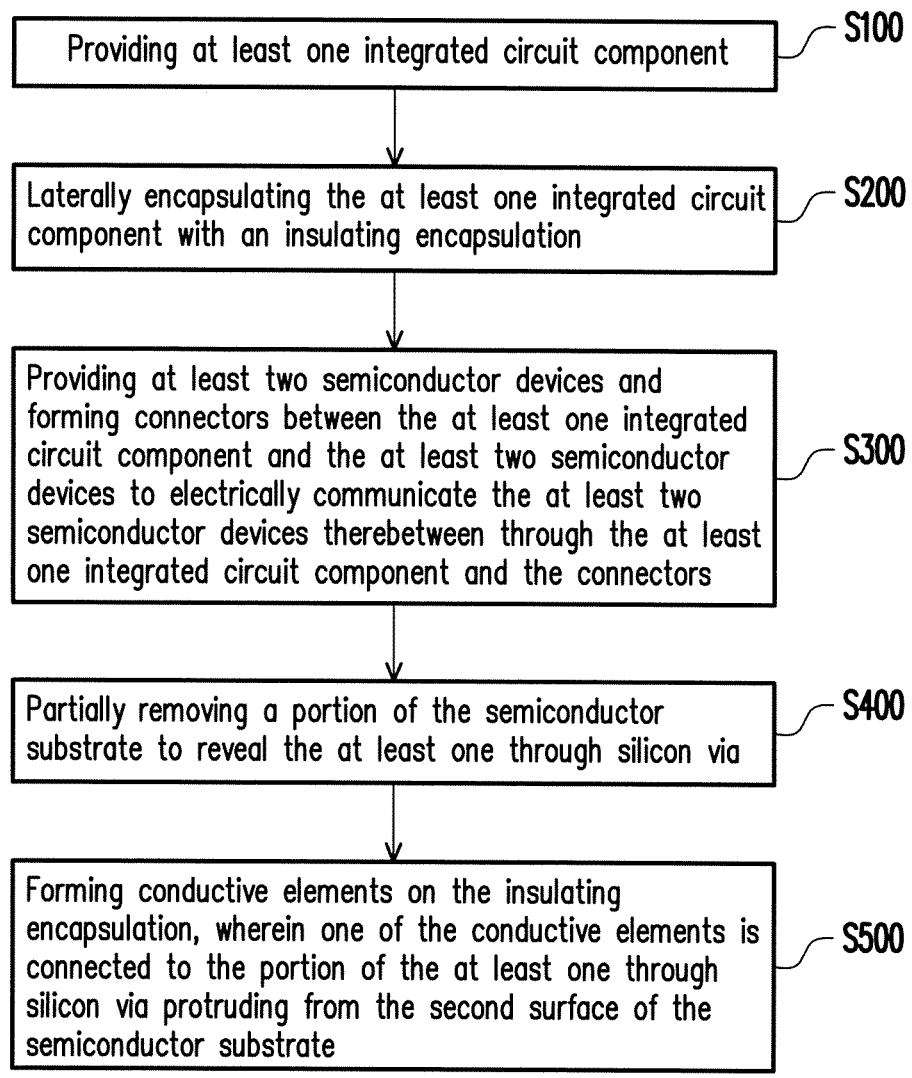
FIG. 37 is a flow chart illustrating a method of manufacturing a semiconductor package in accordance with some exemplary embodiments of the present disclosure.

Continued on FIG. 1, in some embodiments, at least one integrated circuit component 130 is provided and disposed on the buffer layer 116 (also see FIG. 37, step S100). In some embodiments, the integrated circuits component 130 includes a semiconductor substrate 131, an interconnection structure 132, a plurality of connecting pads 133, a plurality of connecting pillars 134, a protection layer 135, and one or more through silicon vias (TSVs) 136. In some embodiments, the semiconductor substrate 131 has a top surface S1, where the interconnection structure 132 is disposed on and covers the top surface S1 of the semiconductor substrate 131. In some embodiments, the connecting pads 133 are disposed on and electrically connected to the interconnection structure 132, where the connecting pads 133 physically contacts the interconnection structure 132. In some embodiments, the connecting pillars 134 are respectively disposed on and electrically connected to the connecting pads 133, where the connecting pillars 134 physically contact the connecting pads 133. In some embodiments, the protection layer 135 covers the interconnection structure 132, the connecting pads 133, and the connecting pillars 134. That is to say, the protection layer 135 prevents any possible damage(s) occurring on the surfaces of the connecting pillar 134 during the transfer of the integrated circuit component 130. In addition, in some embodiments, the protection layer 135 may further act as a passivation layer for providing better planarization and evenness. In some embodiments, the TSVs 136 are embedded in the semiconductor substrate 131 and connected to the interconnection structure 132. In other words, the TSVs 136 are electrically connected to the interconnection structure 132. The numbers of the connecting pads 133 and the connecting pillars 134 can be selected based on demand and are not limited in the disclosure.

In one embodiment, the semiconductor substrate 131 may be a silicon substrate including active components (e.g., diodes, transistors or the like) and passive components (e.g., resistors, capacitors, inductors or the like) formed therein.

In some embodiments, as shown in FIG. 1, the interconnection structure 132 includes one or more inter-dielectric layers 132a and one or more patterned conductive layers 132b stacked alternately. In certain embodiments, the patterned conductive layers 132b are sandwiched between the inter-dielectric layers 132a, where the top surface of the topmost layer of the patterned conductive layers 132b is exposed by the topmost layer of the inter-dielectric layers 132a and physically connected to the connecting pads 133, and the lowest layer of the patterned conductive layers 132b is exposed by the lowest layer of the inter-dielectric layers 132a and physically connected to a top surface 136a of each of the TSVs 136. As shown in FIG. 1, the lowest layer of the inter-dielectric layers 132a is located on the top surface S1 of the semiconductor substrate 131, and the topmost layer of the inter-dielectric layers 132a is at least partially in contact with the protection layer 135. The numbers of the inter-dielectric layers 132a and the patterned conductive layers 132b can be selected based on demand and are not limited in the disclosure.

In one embodiment, the inter-dielectric layers 132a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the inter-dielectric layers 132a may be formed by suitable fabrication techniques such as spin-on coating, chemical vapor deposition (CVD), plasma-enhanced chemical vapor deposition (PECVD) or the like.

In one embodiment, the patterned conductive layers 132b may be made of conductive materials formed by electroplating or deposition, such as copper, copper alloy, aluminum, aluminum alloy, or combinations thereof, which may be patterned using a photolithography and etching process. In some embodiments, the patterned conductive layers 132b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In one embodiment, the connecting pads 133 may be made of aluminum or alloys thereof or the like, and may be formed by an electroplating process. The disclosure is not limited thereto.

In one embodiment, the connecting pillars 134 may include copper pillars, copper alloy pillars or other suitable metal pillars, and may be formed by an electroplating process or the like. In one embodiment, a thickness $T_{134}$ of the connecting pillars 134 may approximately range from 3 μm to 10 μm. In an alternative embodiment, the thickness $T_{134}$ of the connecting pillars 134 may approximately range from 10 μm to 30 μm. In an alternative embodiment, the thickness $T_{134}$ may approximately range from 30 μm to 100 μm. The disclosure is not limited thereto.

In one embodiment, the protection layer 135 may be made of a polybenzoxazole (PBO) layer, a polyimide (PI) layer, or other suitable polymers, which may be patterned using a photolithography and/or etching process. In an alternative embodiment, the protection layer 135 may be made of inorganic materials (such as silicon oxide, silicon nitride, silicon oxynitride or the like) or any suitable dielectric material.

In one embodiment, the TSVs 136 may include copper, nickel, titanium, tungsten, or alloys thereof or the like, and may be formed by a photolithography and/or etching process and a deposition process. In one embodiment, a maximum length L1 (see FIG. 15) of the top surface 136a of the TSVs 136 may approximately range from 3 μm to 15 μm. In an alternative embodiment, the maximum length L1 may approximately range from 15 μm to 50 μm.

As shown in FIG. 1, a sidewall (not marked) of each of the TSVs 136 is covered by a liner 137. As shown in FIG. 1, in some embodiments, each of the liner 137 is sandwiched between the semiconductor substrate 131 and the sidewall of one of the TSVs 136. In one embodiment, the liners 137 may be made of inorganic materials (such as silicon oxide, silicon nitride, silicon oxynitride or the like) or any suitable dielectric material, which may be patterned using a photolithography and/or etching process. In some embodiments, a thickness T (see FIG. 15) of the liners 137 may approximately range from 0.5 μm to 2 μm.

In one embodiment, the materials of the patterned conductive layers 132b, the connecting pads 133, the connecting pillars 134, and the TSVs 136 may be the same. In an alternative embodiment, the materials of the patterned conductive layers 132b, the connecting pads 133, the connecting pillars 134, and the TSVs 136 may be different from each other. In one embodiment, the materials of the inter-dielectric layers 132a, the protection layer 135, and the liners 137 may be the same. In an alternative embodiment, the materials of the inter-dielectric layers 132a, the protection layer 135, and the liners 137 may be different from each other. The disclosure is not limited thereto. Additionally, in an alternative embodiment, the integrated circuits component 130 may not have the TSVs and liners.

In some embodiments, the integrated circuits component 130 is manufactured through a front end of line (FEOL) process. However, the disclosure is not limited thereto. It should be appreciated that the illustration of the integrated circuits component 130 and other components throughout all figures is schematic and is not in scale.

Note that, as shown in FIG. 1, only one integrated circuit component 130 is presented for illustrative purposes, however, it should be noted that the number of the integrated circuit component can be one or more than one, the disclosure is not limited thereto. In certain embodiments, additional integrated circuit component(s) may be provided, and the additional integrated circuit component(s) and the integrated circuit component 130 may be the same type or different types. For example, the additional integrated circuit component(s) may include digital chips, analog chips or mixed signal chips, such as application-specific integrated circuit ("ASIC") chips, sensor chips, wireless and radio frequency (RF) chips, MEMS chips, CIS chips, pre-assembled packages, memory chips, logic chips or voltage regulator chips. The disclosure is not limited thereto.

As shown in FIG. 1, in some embodiments, a connecting film 140 is provided to a backside 130b of the integrated circuit component 130 and the buffer layer 116. Due to the connecting film 140, the integrated circuit component 130 is stably adhered to the buffer layer 116. In certain embodiments, the connecting film 140 may include a die attach film; however the disclosure is not limited thereto.

Continued on FIG. 1, in some embodiments, one or more conductive pillars 120 are formed on the buffer layer 116. As shown in FIG. 1, the conductive pillars 120 are arranged aside of the integrated circuit component 130. In some embodiments, the conductive pillars 120 are through integrated fan-out (info) vias. In certain embodiments, the conductive pillars 120 are arranged along but not on a cutting line (not shown) between two semiconductor package 10A. In one embodiment, the material of the conductive pillars 120 may include a metal material such as copper or copper alloys, or the like. However, the disclosure is not limited thereto. In one embodiment, the conductive pillars 120 may be formed prior to disposing the integrated circuit component 130 on the buffer layer 116. In an alternative embodiment, the conductive pillars 120 may be formed after disposing the integrated circuit component 130 on the buffer layer 116, the disclosure is not limited thereto.

In some embodiments, the conductive pillars 120 are formed by photolithography, plating, photoresist stripping processes or any other suitable method. In one embodiment, the conductive pillars 120 may be formed by forming a mask pattern having openings (not shown), where the mask pattern covers a portion of the buffer layer 116 and exposes another portion of the buffer layer 116 with the openings; forming a metallic material to fill the openings so as to form the conductive pillars 120 by electroplating or deposition; and then removing the mask pattern. The material of the mask pattern may include a positive photo-resist or a negative photo-resist. However, the disclosure is not limited thereto.

In an alternative embodiment, the conductive pillars 120 may be formed by forming a seed layer (not shown) on the buffer layer 116; forming the mask pattern with openings exposing portions of the seed layer; forming the metallic material on the exposed portions of the seed layer to form the conductive pillars 120 by plating; removing the mask pattern; and then removing portions of the seed layer exposed by using the conductive pillars 120 as an etching mask. For example, the seed layer may be a titanium/copper composited layer. For simplification, only four conductive pillars 120 are presented in FIG. 1 for illustrative purposes. However, it should be noted that less or more than four conductive pillars 120 may be formed; the disclosure is not limited thereto. The number of the conductive pillars can be selected based on the demand.

Figure 2:
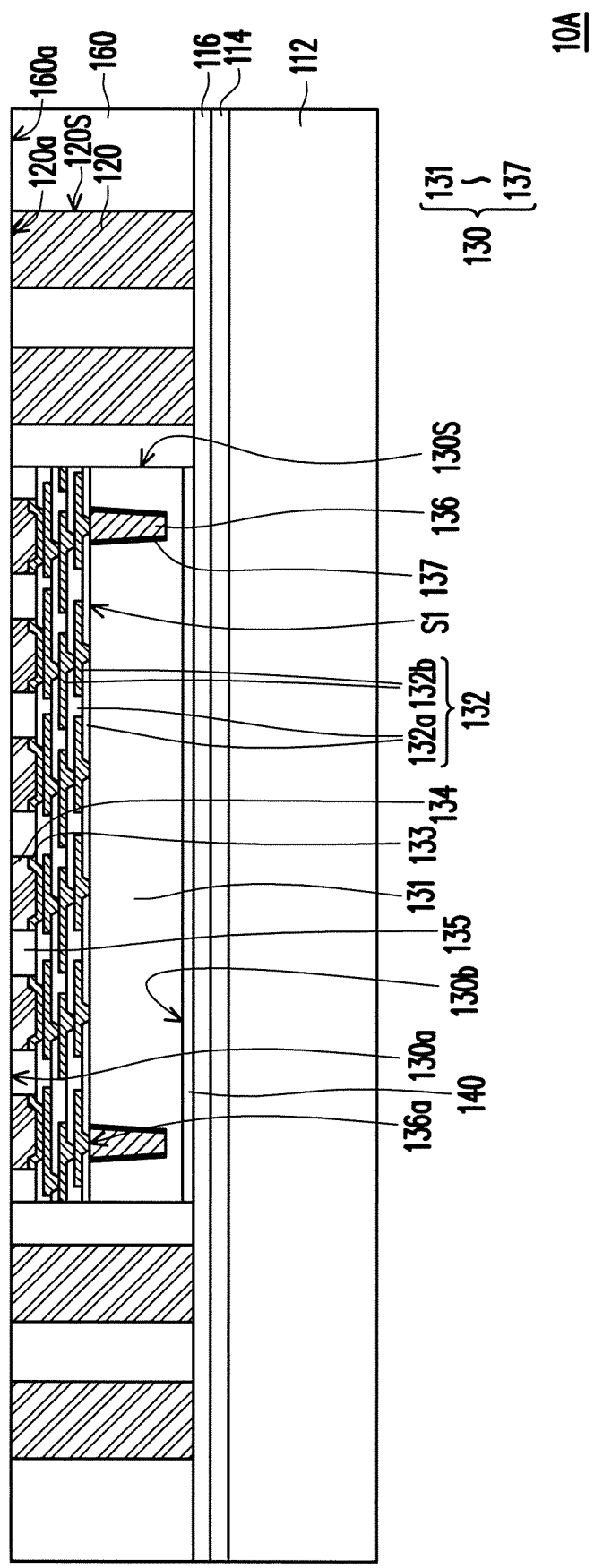

Referring to FIG. 2, in some embodiments, the insulating encapsulation 160 is formed on the buffer layer 116 and over the carrier 112. In some embodiments, the conductive pillars 120, the integrated circuit component 130 and the connecting film 140 are encapsulated in an insulating encapsulation 160 (also see FIG. 37, step S200). As shown in FIG. 2, the insulating encapsulation 160 at least fills up the gaps between the conductive pillars 120 and between the conductive pillars 120, the integrated circuit component 130 and the connecting film 140. In some embodiments, the insulating encapsulation 160 covers a top surface (not marked) of the buffer layer 116, sidewalls 120S of the conductive pillars 120, a sidewall 130S of the integrated circuit component 130 and a sidewall (not marked) of the connecting film 140. That is, the insulating encapsulation 160 wraps the sidewalls 120S of the conductive pillars 120, the sidewall 130S of the integrated circuit component 130 and the sidewall of the connecting film 140.

As shown in FIG. 2, in some embodiments, the top surfaces 120a of the conductive pillars 120 and a top surface 130a of the integrated circuit component 130 are exposed by a top surface 160a of the insulating encapsulation 160. The top surface 130a is opposite to the backside 130b. In some embodiments, the top surfaces 120a of the conductive pillars 120 and the top surface 130a of the integrated circuit component 130 exposed by the top surface 160a of the insulating encapsulation 160 become substantially levelled with the top surface 160a of the insulating encapsulation 160. In other words, the top surface 160a of the insulating encapsulation 160, the top surfaces 120a of the conductive pillars 120 and the top surface 130a of the integrated circuit component 130 are coplanar with each other. In some embodiments, the material of the insulating encapsulation 160 may include polymer material (e.g., epoxy resin, and the like) either with or without hardeners, fillers (e.g., silica filler, glass filler, aluminum oxide, silicon oxide, and the like), adhesion promoters, combinations thereof, and the like.

In some embodiments, the insulating encapsulation 160 is formed by an over-molding process followed by a planarizing process. For example, the formation of the insulating encapsulation 160 may include forming an insulating encapsulation material (not shown) by over-molding to encapsulate the conductive pillars 120, the integrated circuit component 130 and the connecting film 140, and then planarizing insulating encapsulation material, the conductive pillars 120, and the integrated circuit component 130 until the top surfaces of the connecting pillars 134 and the protection layer 135 of the integrated circuit component 130 and the top surfaces 120a of the conductive pillars 120 being exposed by the planarized insulating encapsulation material to form the insulating encapsulation 160. That is, after the planarizing process, the protection layer 135 of the integrated circuit component 130 is partially removed to expose the connecting pillars 134 of the integrated circuit component 130, and the insulating encapsulation material is partially removed to expose the top surfaces of the conductive pillars 120, the connecting pillars 134 and the protection layer 135. In other words, as shown in FIG. 2, the top surfaces of the conductive pillars 120, the connecting pillars 134 and the protection layer 135 are exposed by the top surface 160a of the insulating encapsulation 160. In certain embodiments, after the planarization, the top surface 160a of the insulating encapsulation 160, the top surfaces 120a of the conductive pillars 120, and the top surface 130a the integrated circuit component 130 (e.g. the top surfaces of the connecting pillars 134 and the protection layer 135) become substantially levelled with and coplanar to each other.

In some embodiments, the planarizing step may include a grinding process, fly cutting process, or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method.

Figure 3:
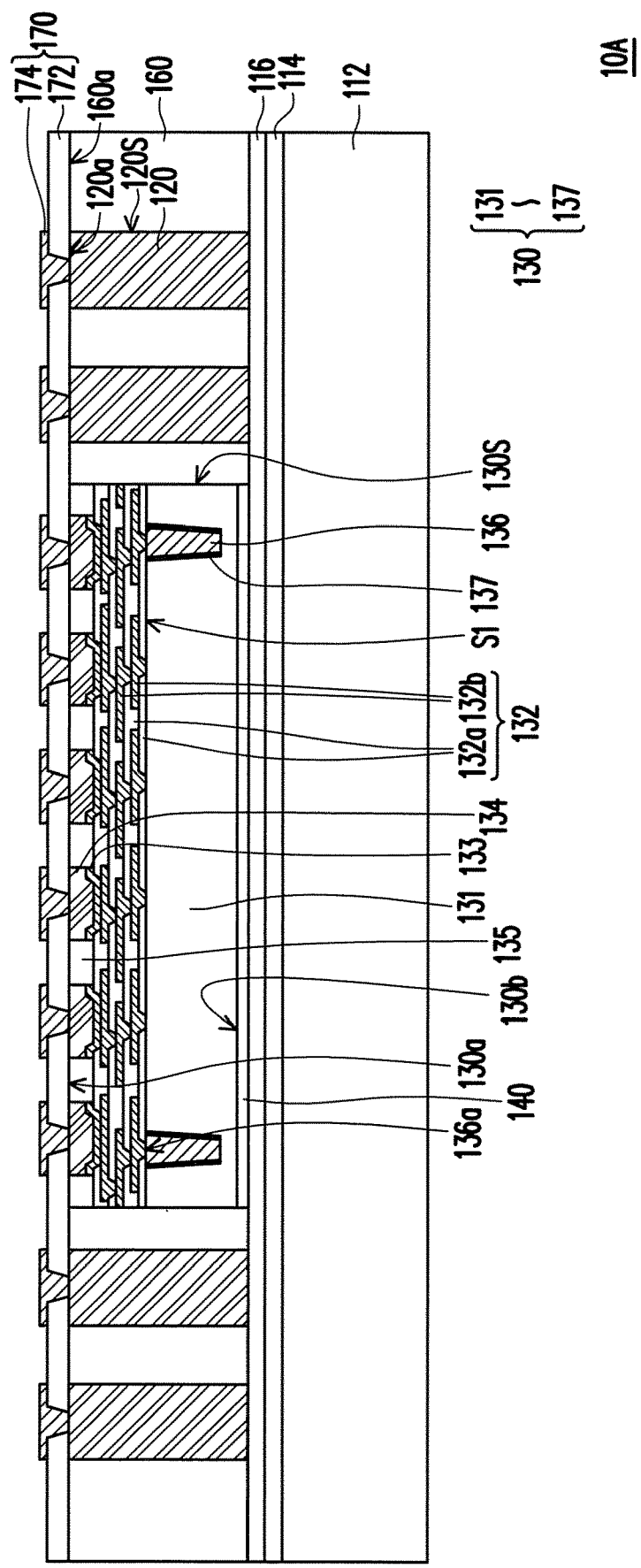

Referring to FIG. 3, in some embodiments, a dielectric layer 172 and a metallization layer 174 are sequentially formed on the carrier 112, where the metallization layer 174 is connected to the conductive pillars 120 and the integrated circuit component 130. In some embodiments, the metallization layer 174 is electrically connected to the integrated circuit component 130 through the connecting pillars 134 and the connecting pads 133, and the interconnection structure 132. In some embodiments, the metallization layer 174 is electrically connected to the conductive pillars 120 by direct contact. In other words, through the metallization layer 174, the integrated circuit component 130 is electrically connected to at least a portion of the conductive pillars 120.

In one embodiment, the dielectric layer 172 is formed by forming a dielectric material layer (not shown) on the top surfaces 120a of the conductive pillars 120, the top surface 130a of the integrated circuit component 130 and the top surface 160a of the insulating encapsulation 160, and patterning the dielectric material layer to form a plurality of openings (not marked) exposing the top surfaces 120a of the conductive pillars 120 and portions of the top surface 130a of the integrated circuit component 130 (e.g., the top surfaces of the connecting pillars 134). Then, the metallization layer 174 is formed by forming a metallization material layer (not shown) on the dielectric layer 172 (where the metallization material layer filling into the openings formed in the dielectric layer 172 to physically contact the top surfaces 120a of the conductive pillars 120 and the top surface of the connecting pillars 134 of the integrated circuit component 130), and then patterning the metallization material layer to form the metallization layer 174. Due to the configuration of the dielectric layer 172 and the metallization layer 174, a routing function is provided to the semiconductor package 10A, such that the dielectric layer 172 and the metallization layer 174 is referred as a redistribution circuit structure 170.

In some embodiments, the material of the dielectric layer 172 may include polyimide, epoxy resin, acrylic resin, phenol resin, ABF-based resin, benzocyclobutene (BCB), polybenzooxazole (PBO), or any other suitable polymer-based dielectric material, and the dielectric layer 172 may be formed by deposition. In some embodiments, the material of the metallization layer 174 may include aluminum, titanium, copper, nickel, tungsten, and/or alloys thereof, and the metallization layer 174 may be formed by electroplating or deposition.

In certain embodiments, the dielectric layer 172 and the metallization layer 174 together referred as a redistribution circuit structure 170. In some embodiments, the redistribution circuit structure 170 is a front-side redistribution layer electrically connected to the integrated circuit component 130 and the conductive pillars 120. In certain embodiments, as the underlying insulating encapsulation 160 provides better planarization and evenness, the later-formed redistribution circuit structure 170, especially the metallization layer with thin line width or tight spacing, can be formed with uniform line-widths or even profiles, resulting in improved line/wiring reliability.

In some embodiments, as shown in FIG. 3, the redistribution circuit structure 170 includes one dielectric layer 172 and one metallization layer 174; however the disclosure is not limited thereto. The numbers of the dielectric layer 172 and the metallization layer 174 is not limited in this disclosure.

In certain embodiments (not shown), the redistribution circuit structure 170 may include a plurality of dielectric layers (e.g., a plurality of the dielectric layer 172) and a plurality of metallization layers (e.g., a plurality of the metallization layer 174). The formation of the redistribution circuit structure 170 includes sequentially forming one or more dielectric layers and one or more metallization layers in alternation. In certain embodiments, the metallization layers are sandwiched between the dielectric layers, where the top surface of the topmost layer of the metallization layers is exposed by a topmost layer of the dielectric layers, and a bottom surface of the lowest layer of the metallization layers is exposed by the lowest layer of the dielectric layers. In one embodiment, the top surface of the topmost layer of the metallization layers exposed by a topmost layer of the dielectric layer may be connected to an later-formed component(s), and the bottom surface of the lowest layer of the metallization layers exposed by the lowest layer of the dielectric layers is connected to an underlying component (e.g. the integrated circuit component 130).

In an alternative embodiment, a plurality of pads (not shown) may be disposed on some of the top surface of the topmost layer of the metallization layers exposed by the topmost layer of the dielectric layers for electrically connecting with the later-formed components. In some embodiments, the above-mentioned pads include under-ball metallurgy (UBM) patterns for ball mount and/or connection pads for mounting of passive components. In one embodiment, the material of the pads may include copper, nickel, titanium, tungsten, or alloys thereof or the like, and may be formed by an electroplating process. The shape and number of the pads is not limited in this disclosure.

Figure 4:
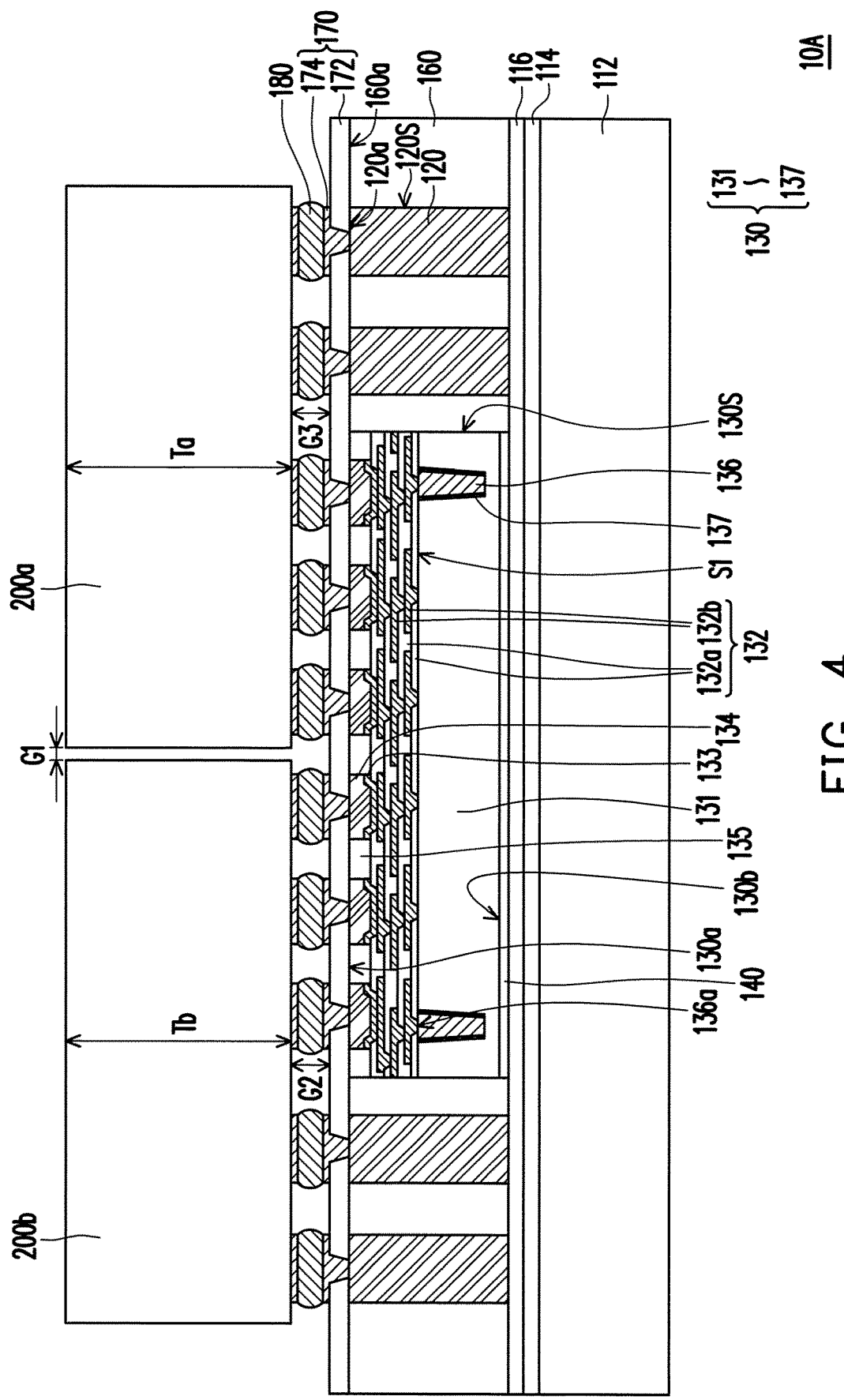

Referring to FIG. 4, in some embodiments, semiconductor devices 200a, 200b are provided and then are disposed on the redistribution circuit structure 170 (also see FIG. 37, step S300). In some embodiments, through the redistribution circuit structure 170, the semiconductor device 200a is electrically connected to the integrated circuit component 130 and a group of the conductive pillars 120, while the semiconductor device 200b is electrically connected to the integrated circuit component 130 and another group of the conductive pillars 120. As shown in FIG. 4, the semiconductor device 200a and the semiconductor device 200b are mounted on the redistribution circuit structure 170 by forming a plurality of connectors 180 between the semiconductor devices 200a, 200b and the redistribution circuit structure 170. In some embodiments, the connectors 180 are made of solder materials, such as solder joints. In some embodiments, the semiconductor device 200a and the semiconductor device 200b are bonded to the redistribution circuit structure 170 with the connectors 180 therebetween through flip chip bonding technology and/or surface mount technology. The disclosure is not limited thereto.

In some embodiments, a height Ta of the semiconductor device 200a is substantially equal to a height Tb of the semiconductor device 200b, as shown in FIG. 4. In an alternative embodiment, a height Ta of the semiconductor device 200a is different from a height Tb of the semiconductor device 200b; the disclosure is not limited thereto.

In some embodiments, as shown in FIG. 4, a gap G1 between the semiconductor device 200a and the semiconductor device 200b may approximately range from 30 μm to 800 μm. In an alternative embodiment, the gap G1 may approximately range from 800 μm to 2 mm. In an alternative embodiment, the gap G1 may be approximately above 2 mm.

In some embodiments, as shown in FIG. 4, a gap G2 between the semiconductor device 200a and the redistribution circuit structure 170 and/or a gap G3 between the semiconductor device 200b and the redistribution circuit structure 170 may approximately range from 20 μm to 50 μm. In an alternative embodiment, the gap G2 and/or the G3 may approximately range from 50 μm to 100 μm. In an alternative embodiment, the gap G2 and/or the G3 may approximately range from 100 μm to 300 μm. The gap G2 and gap G3 can be the same or different, the disclosure is not limited thereto.

For example, the semiconductor device 200a and the semiconductor device 200b may include digital chips, analog chips or mixed signal chips, such as application-specific integrated circuit ("ASIC") chips, sensor chips, wireless and radio frequency (RF) chips, MEMS chips, CIS chips, pre-assembled packages, memory chips, logic chips or voltage regulator chips. The disclosure is not limited thereto. In one embodiment, the semiconductor device 200a and the semiconductor device 200b may be the same type. In one embodiment, the semiconductor device 200a and the semiconductor device 200b may be different types.

In the disclosure, semiconductor device 200a and the semiconductor device 200b are electrically communicated to each other through the integrated circuit component 130 in the semiconductor package 10A. In some embodiments, the semiconductor device 200a outputs an electric signal to the semiconductor device 200b through the integrated circuit component 130, and the semiconductor device 200b receives the electric signal by-passed from the integrated circuit component 130 as an input for data processing or storing, where the semiconductor device 200b may further output an electric signal to the integrated circuit component 130 for further purposes. In an alternative embodiment, the semiconductor device 200b outputs an electric signal to the semiconductor device 200a through the integrated circuit component 130, and the semiconductor device 200a receives the electric signal by-passed from the integrated circuit component 130 as an input for data processing or storing, where the semiconductor device 200a may further output an electric signal to the integrated circuit component 130 for further purposes. In a further alternative embodiment, for one frame period, the semiconductor device 200a outputs an electric signal to the semiconductor device 200b through the integrated circuit component 130, and the semiconductor device 200b receives the electric signal by-passed from the integrated circuit component 130 as an input for data processing or storing, where the semiconductor device 200b may further output an electric signal to the integrated circuit component 130 for further purposes; and for another frame period, the semiconductor device 200b outputs an electric signal to the semiconductor device 200a through the integrated circuit component 130, and the semiconductor device 200a receives the electric signal by-passed from the integrated circuit component 130 as an input for data processing or storing, where the semiconductor device 200a may further output an electric signal to the integrated circuit component 130 for further purposes. The disclosure is not specifically limited the ways of the electrical communication between the semiconductor device 200a, the semiconductor device 200b, and the integrated circuit component 130.

In some embodiments, an electric signal as input to one of the semiconductor device 200a, the semiconductor device 200b and the integrated circuit component 130 may be provide by the conductive pillars 120 and/or the TSVs 136. Note that, in certain embodiments, the conductive pillars 120 and/or the TSVs 136 may be electrically connected to later-formed components (e.g. conductive balls) that are electrically connected to additional semiconductor device(s) capable of providing electric signals to be processed.

Figure 5:
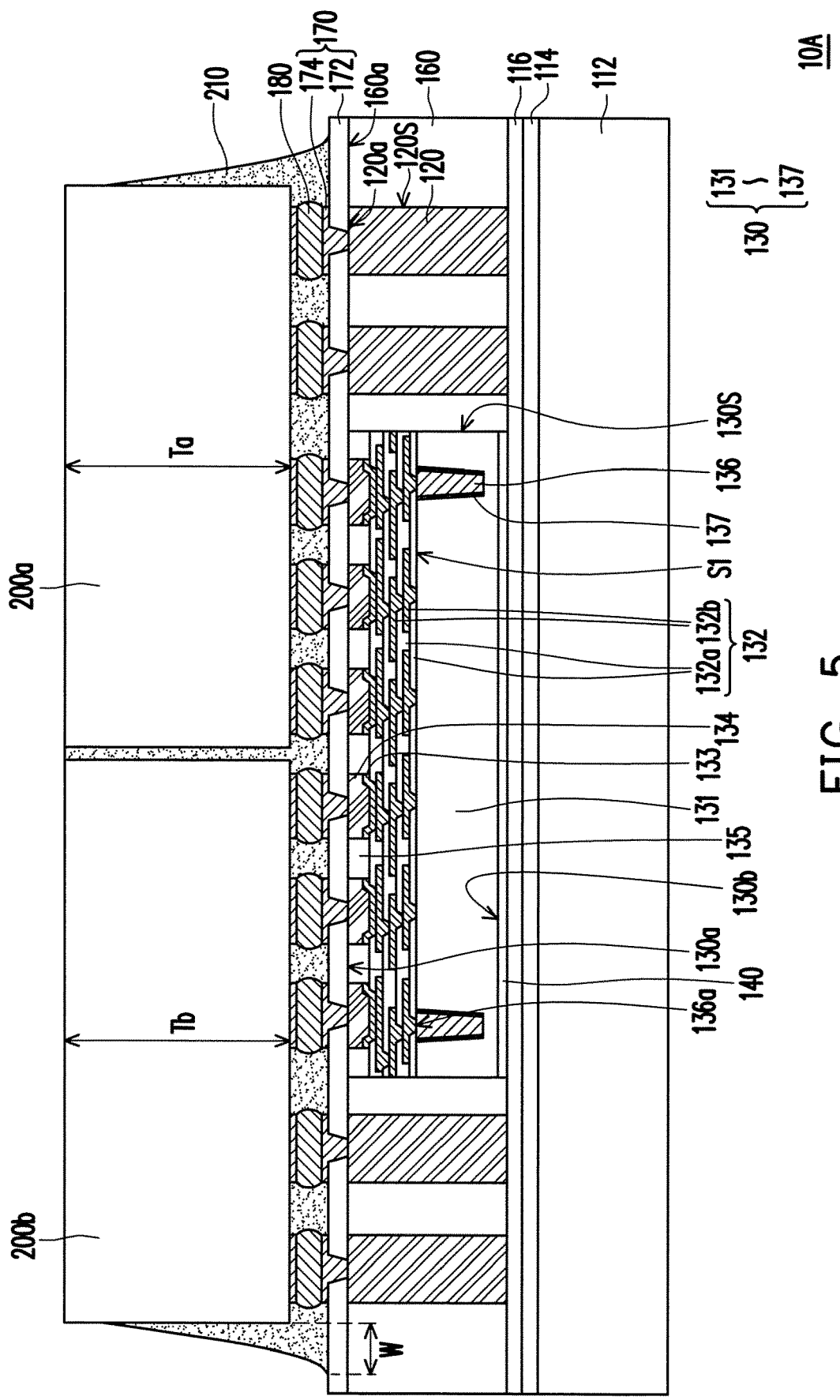

Referring to FIG. 5, in some embodiments, an underfill material 210 is formed between the semiconductor devices 200a, 200b and the redistribution circuit structure 170 and dispensed around the connectors 180. In some embodiments, the underfill material 210 at least fills the gaps between the connectors 180 and between the redistribution circuit structure 170, the connectors 180, the semiconductor device 200a, and the semiconductor device 200b. As shown in FIG. 5, for example, the underfill material 210 is disposed on the redistribution circuit structure 170 and wraps sidewalls of the connectors 180 to provide structural support and protection to the connectors 180. In some embodiments, the underfill material 210 partially covers the sidewalls of the semiconductor device 200a and the semiconductor device 200b and exposes the top surfaces of the semiconductor device 200a and the semiconductor device 200b, as shown in FIG. 5. In an alternative embodiment (not shown), the underfill material 210 completely covers the sidewalls and top surfaces of the semiconductor device 200a and the semiconductor device 200b. In an alternative embodiment (not shown), the underfill material 210 completely covers the sidewalls of the semiconductor device 200a and the semiconductor device 200b and exposes the top surfaces of the semiconductor device 200a and the semiconductor device 200b. The disclosure is not limited thereto.

In one embodiment, as shown in FIG. 5, a maximum width W of the underfill material 210 (from the sidewalls of the semiconductor device 200a and the semiconductor device 200b to the sidewall of the underfill material 210) may approximately range from 30 μm to 200 μm. In an alternative embodiment, the maximum width W may approximately range from 200 μm to 600 μm. In an alternative embodiment, the maximum width W may be approximately above 600 μm.

In one embodiment, the underfill material 210 may be formed by underfill dispensing or any other suitable method. In some embodiments, the underfill material 210 may be a molding compound including polymer material (e.g., epoxy resin, and the like) either with or without hardeners, fillers (e.g., silica filler, glass filler, aluminum oxide, silicon oxide, and the like), adhesion promoters, combinations thereof, and the like. In one embodiment, the materials of the underfill material 210 and the insulating encapsulation 160 may be the same. In an alternative embodiment, the material of the underfill material 210 may be different from the material of the insulating encapsulation 160. The disclosure is not limited thereto.

Figure 6:
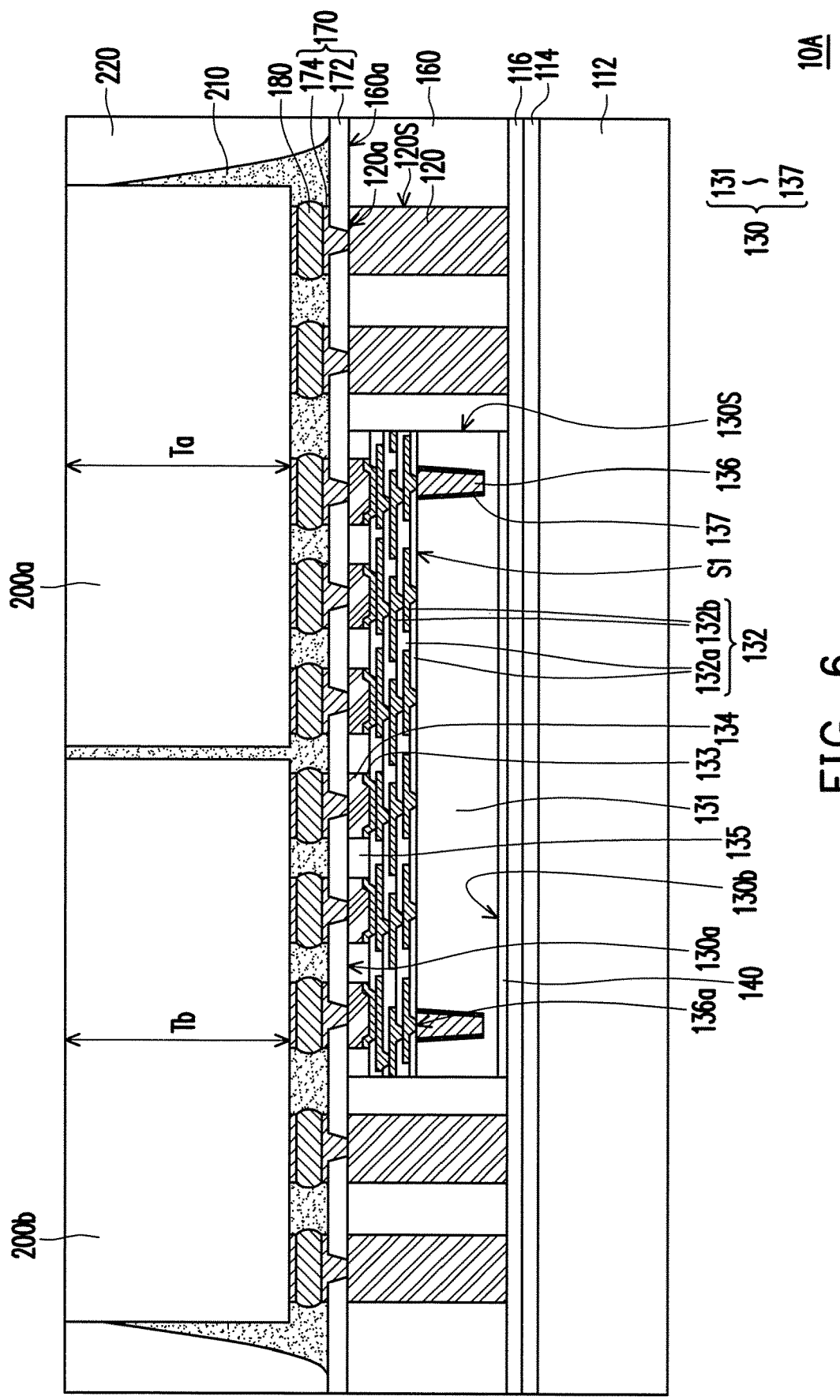

Referring to FIG. 6, in some embodiments, an insulating encapsulation 220 is formed over the carrier 112 for encapsulating the semiconductor device 200a and the semiconductor device 200b. In some embodiments, the insulating encapsulation 220 covers the sidewalls of the semiconductor device 200a, the semiconductor device 200b and the underfill material 210. In some embodiments, as shown in FIG. 6, the insulating encapsulation 220 wraps the sidewalls of the semiconductor device 200a and the semiconductor device 200b and exposes the top surfaces of the semiconductor device 200a and the semiconductor device 200b, however the disclosure is not limited thereto. In an alternative embodiment, the insulating encapsulation 220 wraps the sidewalls and top surfaces of the semiconductor device 200a and the semiconductor device 200b. In one embodiment, the materials of the insulating encapsulation 220 and the insulating encapsulation 160 may be the same. In an alternative embodiment, the material of the insulating encapsulation 220 may be different from the material of the insulating encapsulation 160. In one embodiment, the insulating encapsulation 220 may be formed by an over-molding process followed by a grinding process. A cleaning process may be optionally performed after the grinding process, in addition. The disclosure is not limited thereto.

Figure 7:
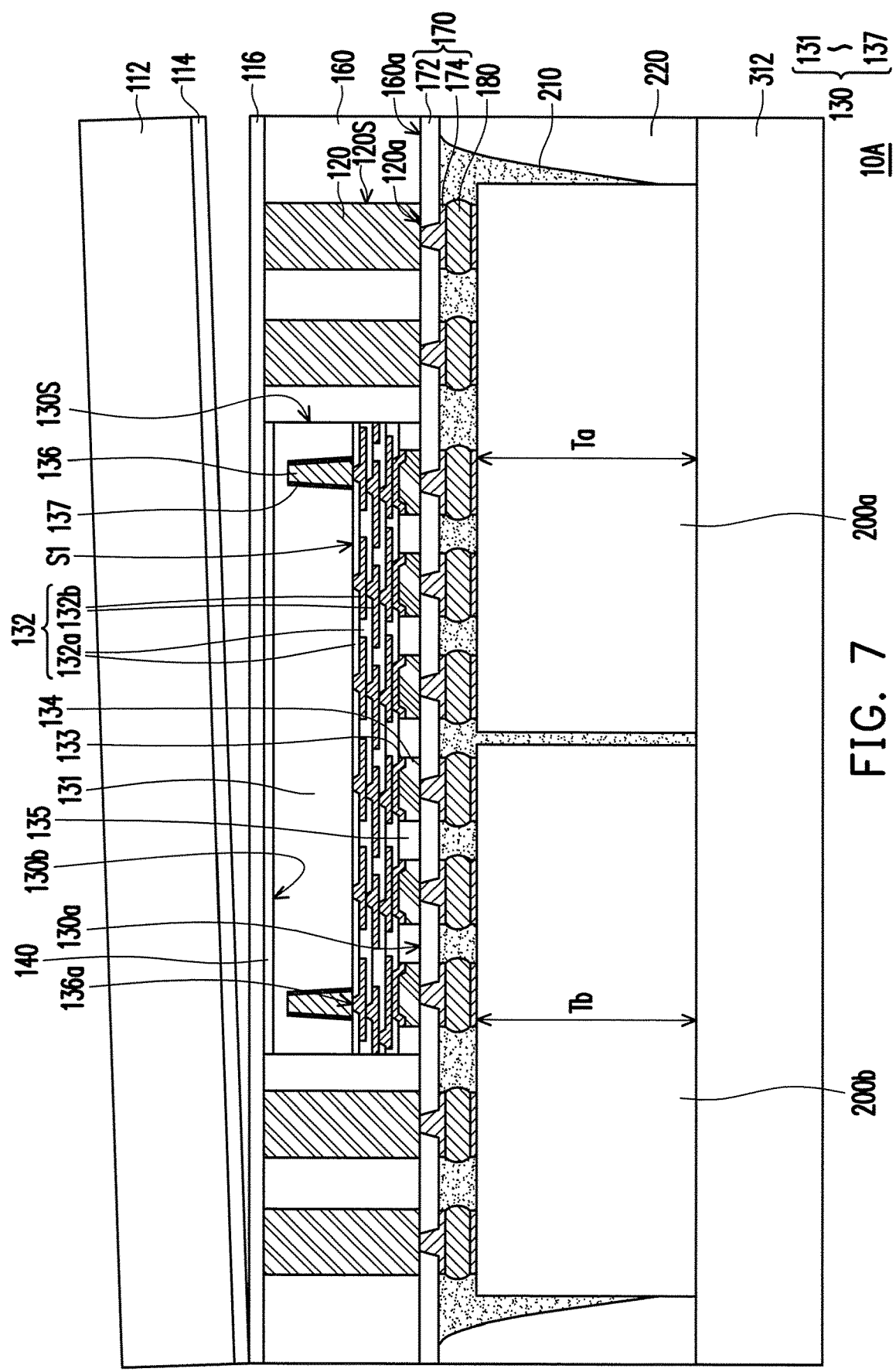

Referring to FIG. 7, in some embodiments, the semiconductor package 10A is flipped (turned upside down) and placed on a carrier 312, and the carrier 112 is debonded from the buffer layer 116. In some embodiments, the buffer layer 116 is easily separated from the carrier 112 due to the debond layer 114, and the buffer layer 116 is exposed. In some embodiments, the carrier 112 is detached from the buffer layer 116 through a debonding process, and the carrier 112 and the debond layer 114 are removed.

In some embodiments, the materials of the carrier 312 and the carrier 112 may be the same, however the disclosure is not limited thereto. In an alternative embodiment, the material of the carrier 312 is different from the material of the carrier 112.

Figure 8:
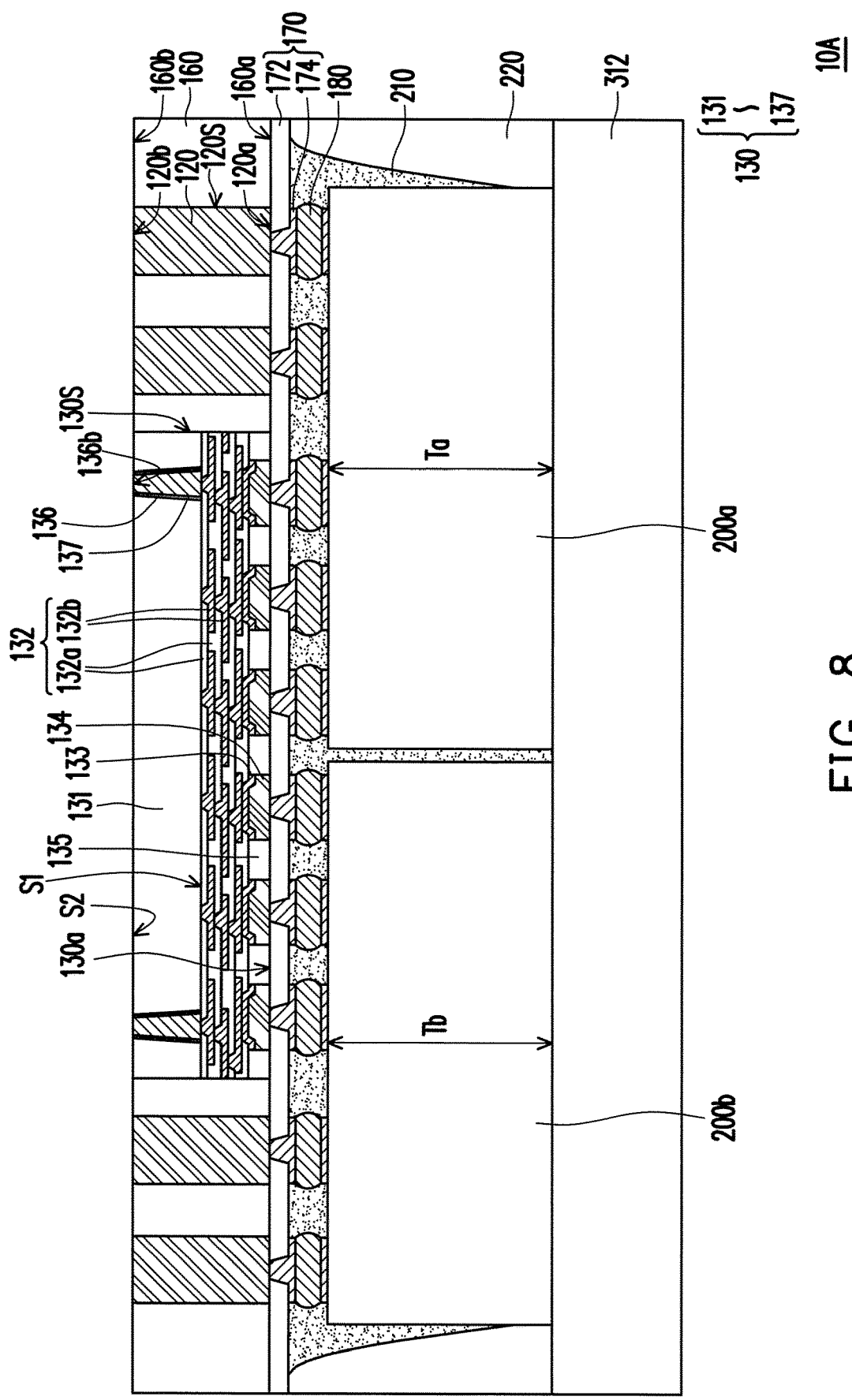

Referring to FIG. 8, in some embodiments, a first planarizing process is performed to expose the conductive pillars 120 and the TSVs 136 (also see FIG. 37, step S400). In some embodiments, the buffer layer 116, a portion of the insulating encapsulation 160, portions of the conductive pillars 120, and a portion of the semiconductor substrate 131 are removed by the first planarizing process, such that a bottom surface S2 of the semiconductor substrate 131, bottom surfaces 136b of the TSVs 136, bottom surfaces 120b of the conductive pillars 120, and a bottom surface 160b of the insulating encapsulation 160 are substantially levelled with each other. In other words, the bottom surface S2 of the semiconductor substrate 131, the bottom surfaces 136b of the TSVs 136, the bottom surfaces 120b of the conductive pillars 120, and the bottom surface 160b of the insulating encapsulation 160 are coplanar to each other. As shown in FIG. 8, the bottom surfaces 136b of the TSVs 136 are accessibly revealed by the bottom surface S2 of the semiconductor substrate 131, and the bottom surfaces 120b of the conductive pillars 120 are accessibly revealed by the bottom surface 160b of the insulating encapsulation 160. In FIG. 8, the bottom surface S2 of the semiconductor substrate 131 is also referred as the backside of the integrated circuit component 130. In some embodiments, the first planarizing process may include a grinding process or the like; however, the disclosure is not limited thereto.

Figure 9:
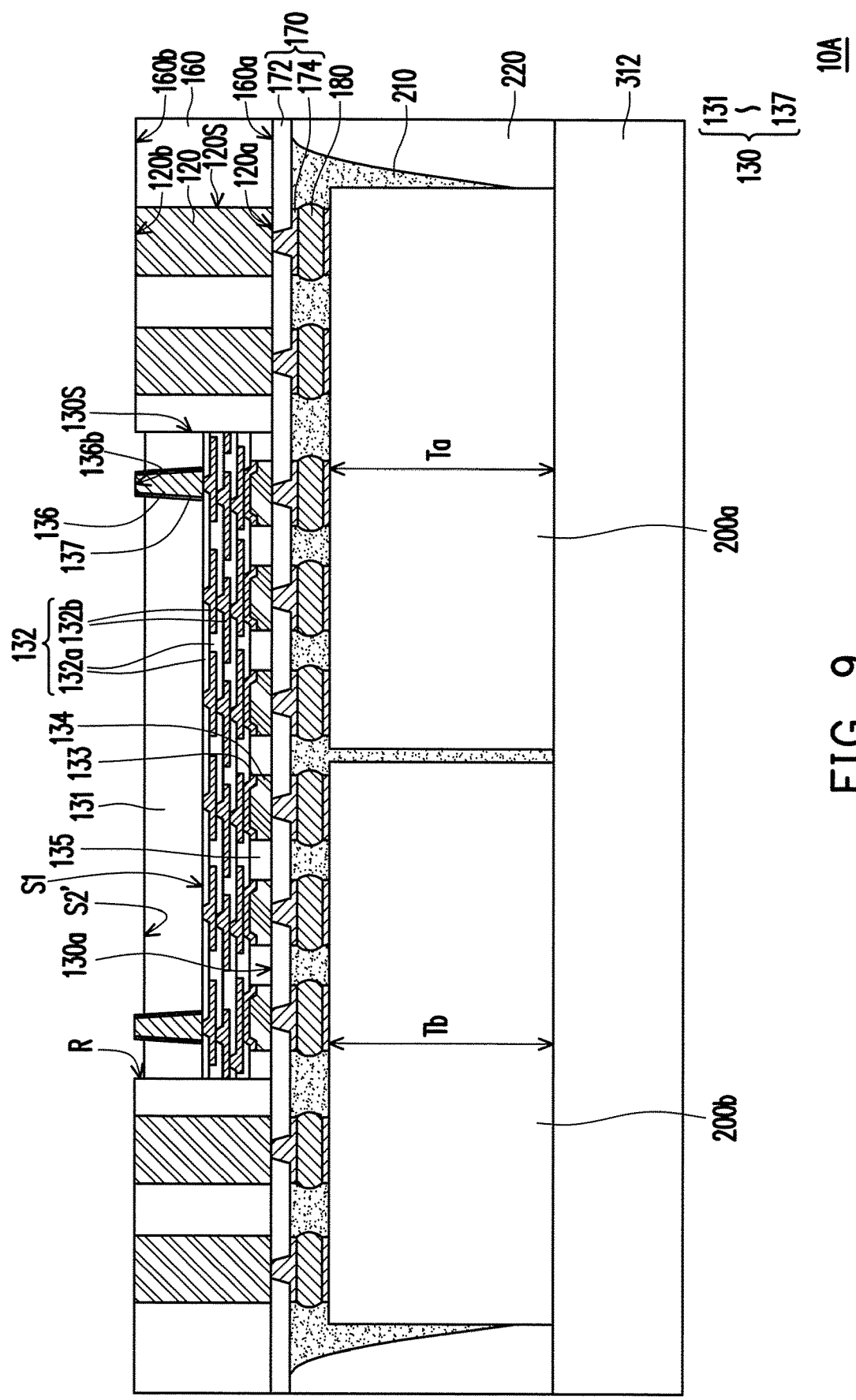

Referring to FIG. 9, in some embodiments, a patterning process is performed to partially remove the semiconductor substrate 131 so as to form a recess R, such that the TSVs 136 partially protrude out of the semiconductor substrate 131. In some embodiments, the semiconductor substrate 131 is partially removed to form a patterned bottom surface S2', such that a portion of each of the TSVs 136 protrudes from the patterned bottom surface S2' of the semiconductor substrate 131. In FIG. 9, the patterned bottom surface S2' of the semiconductor substrate 131 is referred as the backside of the integrated circuit component 130. The patterning process may include an etching process (such as a wet each or a dry etch) or the like, for example. The disclosure is not limited thereto.

As shown in FIG. 9, in some embodiments, the portion of each of the TSVs 136 protruding from the patterned bottom surface S2' of the semiconductor substrate 131 is in the recess R and has a height H1 (see FIG. 15). In some embodiments, the height H1 of the portion of each of the TSVs 136 protruding from the patterned bottom surface S2' of the semiconductor substrate 131 may approximately range from 1 μm to 10 μm. In an alternative embodiment, the height H1 may approximately range from 10 μm to 25 μm. In some embodiments, an angle θ (see FIG. 15) is between the sidewalls (not marked) of the TSVs 136 and the patterned bottom surface S2' of the semiconductor substrate 131. In one embodiment, the angle θ is ranges about from 80° to 90°. That is, for each TSVs 136, an area of the top surface 136a is greater than or substantially equal to an area of the bottom surface 136b in a vertical projection on to the top surface S1 of the semiconductor substrate 131.

As shown in FIG. 9, the liners 137 cover the entire sidewalls of the TSVs 136; however the disclosure is not limited thereto. In one embodiment, the liners 137 may be partially cover the sidewalls of the TSVs 136. In an alternative embodiment (not shown), the liners 137 cover the sidewalls portions of the TSVs 136 being embedded in the semiconductor substrate 131. That is, for example, the liners 137, which are disposed on the sidewalls of the portions of the TSVs 136 protruding from the patterned bottom surface S2' of the semiconductor substrate 131, are removed during the patterning process. The disclosure is not limited thereto.

Figure 10:
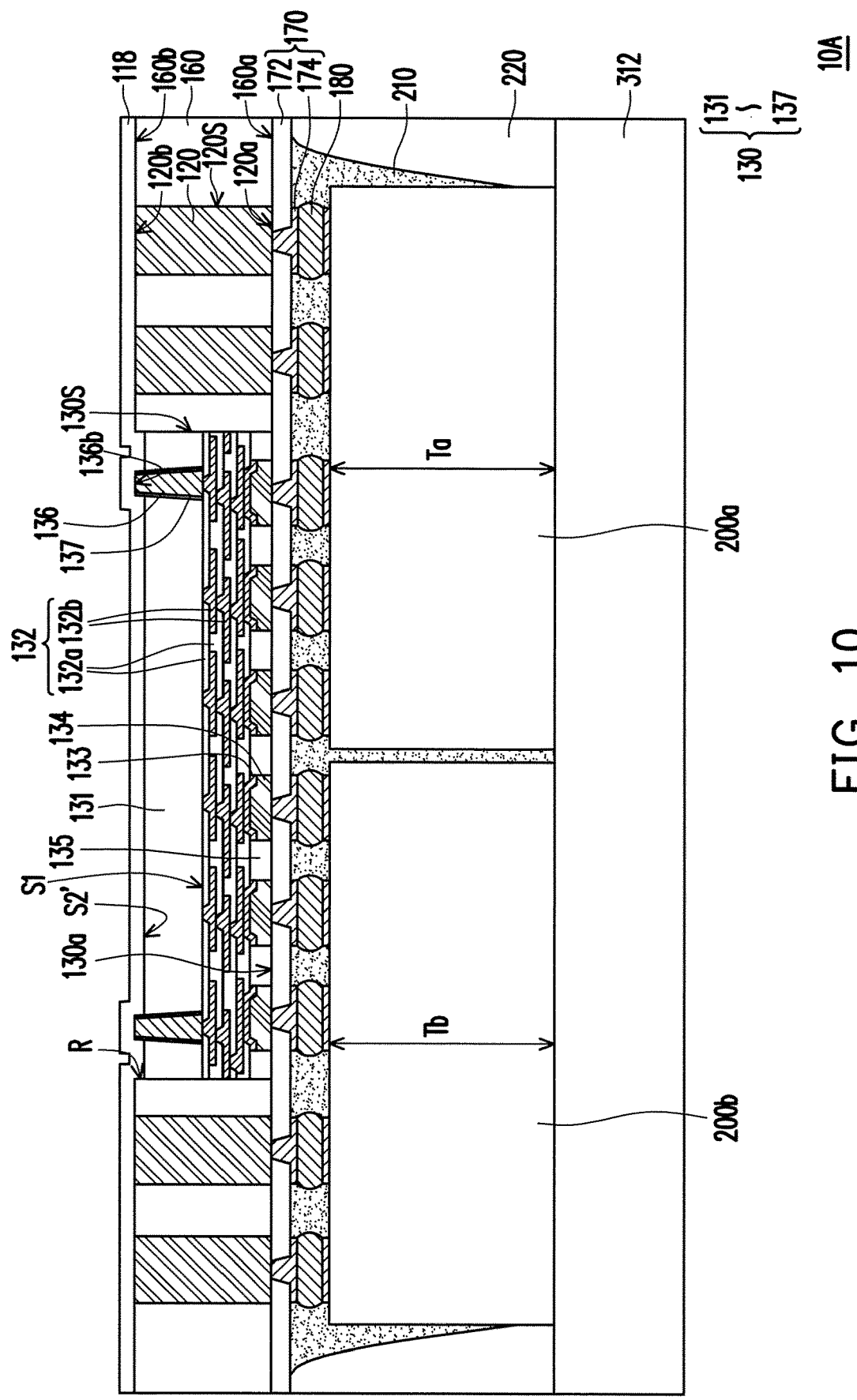

Referring to FIG. 10, in some embodiments, a passivation layer 118 is formed over the carrier 312. In some embodiments, the passivation layer 118 is directly formed on the insulating encapsulation 160, the conductive pillars 120, the integrated circuit component 130, where the bottom surfaces 136b of the TSVs 136, the patterned bottom surface S2' of the semiconductor substrate 131, the bottom surfaces 120b of the conductive pillars 120, and the bottom surface 160b of the insulating encapsulation 160 are covered by and in physical contact with the passivation layer 118. As shown in FIG. 10, a portion of the passivation layer 118 fills into the recess R, where the recess R is fully filled with the passivation layer 118. In some embodiments, a thickness of the passivation layer 118 is greater than the height H1 of the portion of each of the TSVs 136 protruding from the patterned bottom surface S2' of the semiconductor substrate 131.

In some embodiments, the passivation layer 118 may be a dielectric material layer. In some embodiments, the passivation layer 118 may be a polymer layer which made of polyimide, polybenzoxazole (PBO), benzocyclobutene (BCB), or any other suitable polymer-based dielectric material. In some embodiments, the passivation layer 118 may be Ajinomoto Buildup Film (ABF), Solder Resist film (SR), or the like. In one embodiment, the materials of the passivation layer 118 and the buffer layer 116 are the same. In an alternative embodiment, the material of the passivation layer 118 is different from the material of the buffer layer 116. The disclosure is not limited thereto. In some embodiments, the passivation layer 118 may be formed by a suitable fabrication technique such as spin-coating, lamination, deposition, or the like.

Figure 11:
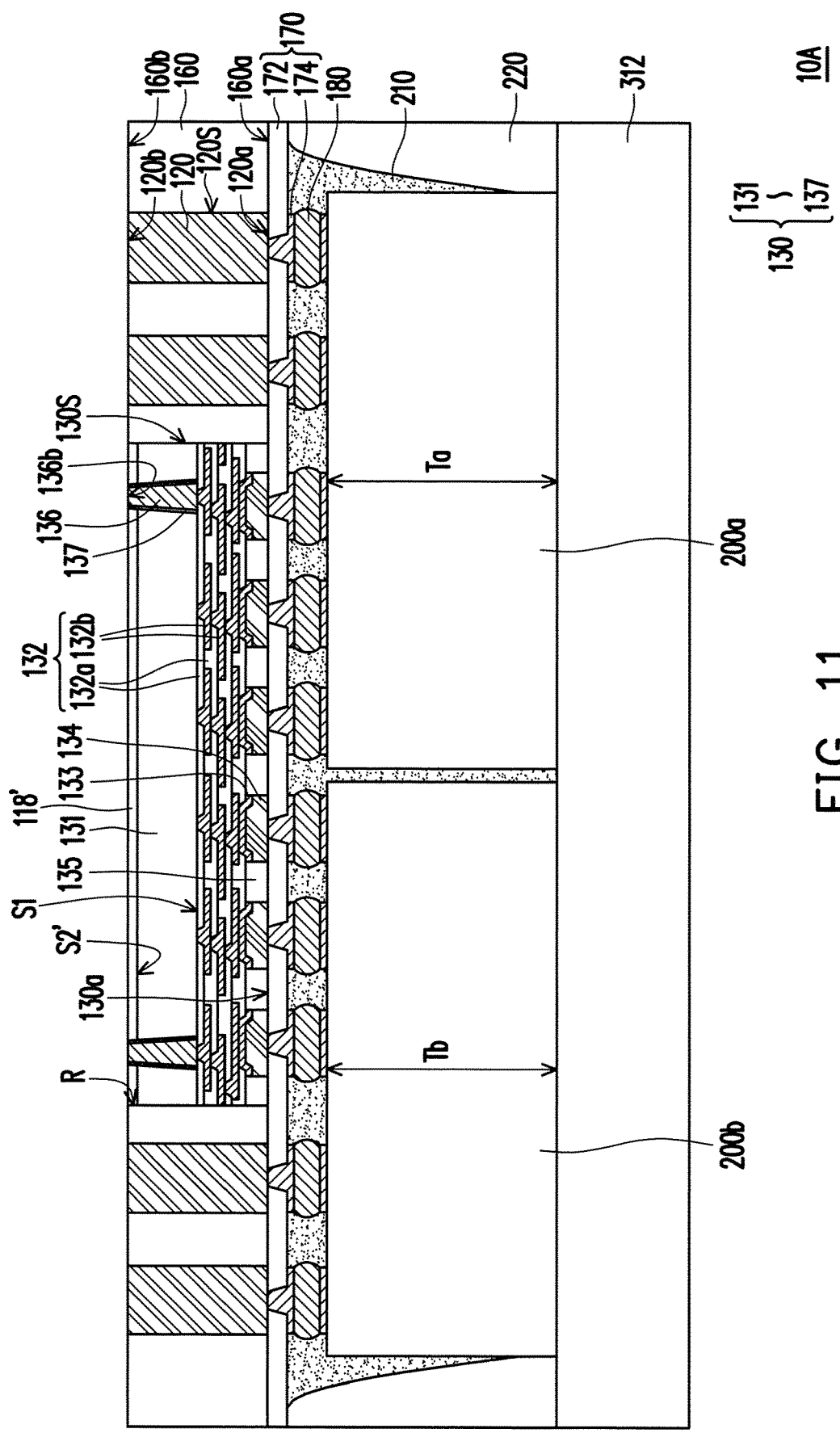

Referring to FIG. 11, in some embodiments, a second planarizing process is performed to form a planarized passivation layer 118', where the planarized passivation layer 118' exposes the bottom surface 160b of the insulating encapsulation 160, the bottom surfaces 120b of the conductive pillars 120, and the bottom surface 136b of the TSVs 136. In some embodiments, during the second planarizing process, the passivation layer 118 located in the recess R is remained in the semiconductor package 10A, while the rest of the passivation layer 118 are removed; and the remained passivation layer 118 is referred as the planarized passivation layer 118'. In some embodiments, the second planarizing process may include a grinding process or the like; and the disclosure is not limited thereto. In some embodiments, a height of the planarized passivation layer 118' is substantially equal to the height H1 of the portion of each of the TSVs 136 protruding from the patterned bottom surface S2' of the semiconductor substrate 131. In other words, the portion of each of the TSVs 136 protruding from the patterned bottom surface S2' of the semiconductor substrate 131 is in the planarized passivation layer 118' and has the height H1.

Figure 12:
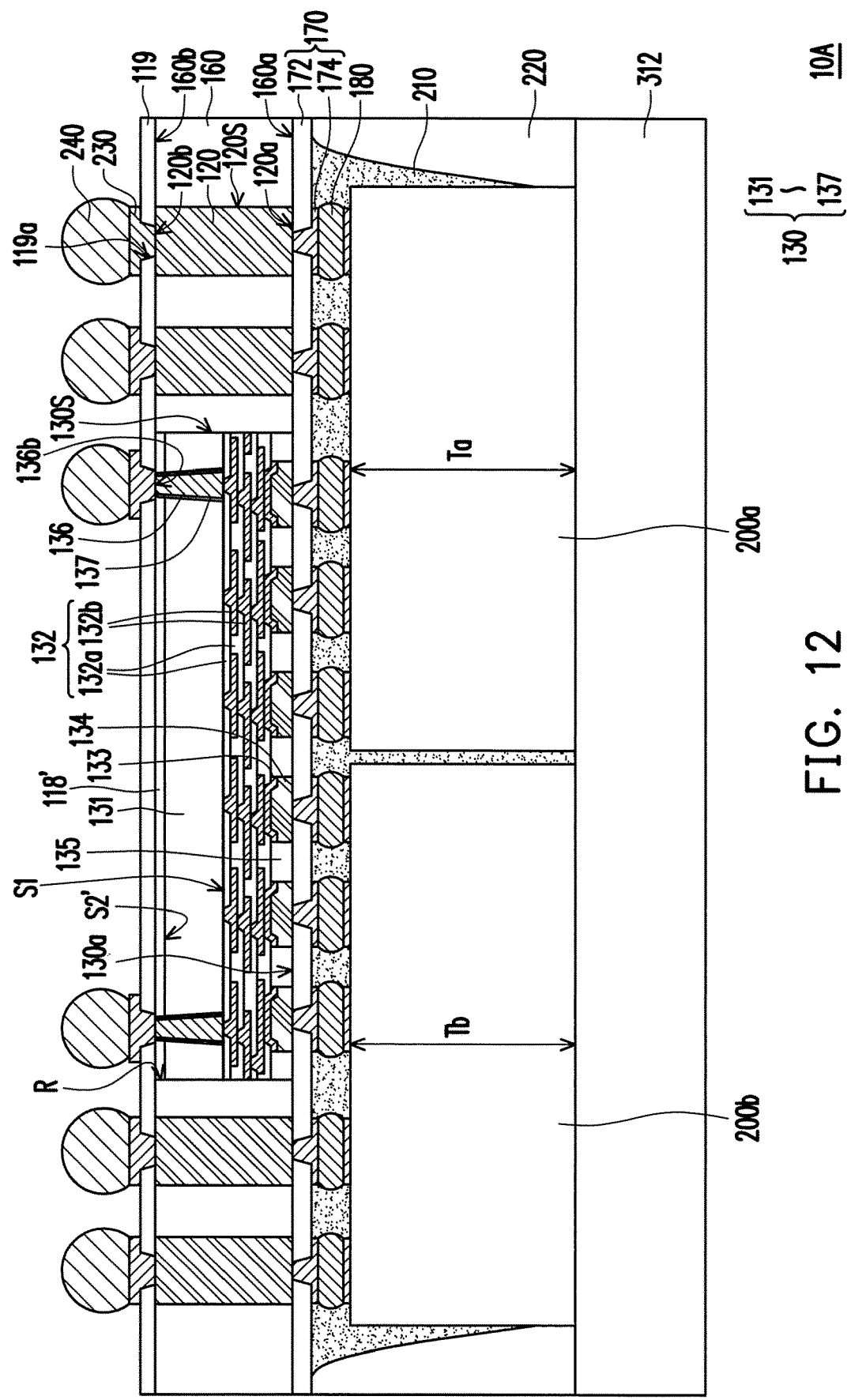

Referring to FIG. 12, in some embodiments, a passivation layer 119 is formed over the carrier 312. In some embodiments, the passivation layer 119 is directly formed on the planarized passivation layer 118', the conductive pillars 120, and the insulating encapsulation 160. In some embodiments, the passivation layer 119 may be a polymer layer which made of polyimide, polybenzoxazole (PBO), benzocyclobutene (BCB), or any other suitable polymer-based dielectric material. In some embodiments, the passivation layer 119 may be Ajinomoto Buildup Film (ABF), Solder Resist film (SR), or the like. In some embodiments, the passivation layer 119 may be formed by a suitable fabrication technique such as spin-coating, lamination, deposition, or the like. The top surface of the passivation layer 119 may be levelled and may have a high degree of planarization and evenness, which is beneficial for later-formed components.

In one embodiment, the materials of the passivation layer 119 and the planarized passivation layer 118' are the same, such that the passivation layer 119 and the planarized passivation layer 118' are considered as a single layer with portions having different heights. In such embodiment, a portion including the passivation layer 119 and the planarized passivation layer 118' overlaying the patterned bottom surface S2' of the semiconductor substrate 131 has a maximum height H2 (see FIG. 15). In some embodiments, the maximum height H2 may approximately range from 1 μm to 50 μm. In one embodiment, a height H3 (e.g., H3=H2−H1, see FIG. 15) of the passivation layer 119 may approximately range from 1 μm to 10 μm. In an alternative embodiment, the height H3 may approximately range from 10 μm to 50 μm.

In an alternative embodiment, the material of the passivation layer 119 is different from the material of the planarized passivation layer 118'. The disclosure is not limited thereto. In some embodiments, the passivation layer 119 and/or the planarized passivation layer 118' prevent any possible damage(s) occurring on the conductive pillars 120 and the TSVs 136.

Continued on FIG. 12, in some embodiments, a plurality of conductive patterns 230 and a plurality of conductive elements 240 are disposed on the passivation layer 119. As shown in FIG. 12, in some embodiments, the conductive patterns 230 are directly disposed on the bottom surfaces 120b of the conductive pillars 120 and the bottom surfaces 136b of the TSVs 136 through contact openings 119a formed in the passivation layer 119. In some embodiments, a maximum length L2 (see FIG. 15) of the contact openings 119a may approximately range from 7 μm to 20 μm. In an alternative embodiment, the maximum length L2 may approximately range from 20 μm to 100 μm. In an alternative embodiment, the maximum length L2 may be approximately above 100 μm.

In some embodiments, some of the conductive elements 240 are electrically connected to the integrated circuit component 130 through some of the conductive patterns 230 and the TSVs 136 (also see FIG. 37, step S500). In some embodiments, some of the conductive elements 240 are electrically connected to the semiconductor device 200a and the semiconductor device 200b through some of conductive patterns 230, the integrated circuit component 130 (e.g. the TSVs 136), the redistribution circuit structure 170, and the connectors 180. In some embodiments, some of the conductive elements 240 are electrically connected to the semiconductor device 200a and the semiconductor device 200b through some of the conductive patterns 230, the conductive pillars 120, the redistribution circuit structure 170, and the connectors 180.

In some embodiments, the conductive patterns 230 may include under-ball metallurgy (UBM) patterns or conductive pads. In some embodiments, the material of the conductive patterns 230 may include copper, nickel, titanium, tungsten, or alloys thereof or the like, and may be formed by an electroplating process.

In some embodiments, the conductive elements 240 may be disposed on the conductive patterns 230 by ball placement process or reflow process. In some embodiments, the conductive elements 240 may be, solder balls or ball grid array (BGA) balls, chip connectors ("C4") or other connectors for connecting to an external device. In some embodiments, the material of the conductive elements 240 may include lead-based materials (such as Sn—Pb base materials) or lead-free material (such as Sn—Ag base or Sn—Ag—Cu base materials) with or without additional impurity (such as Ni, Bi, Sb, Au, etc). The disclosure is not limited thereto.

The numbers of the conductive patterns 230 and the conductive elements 240 may correspond to the numbers of the conductive pillars 120 and the TSVs 136.

Figure 13:
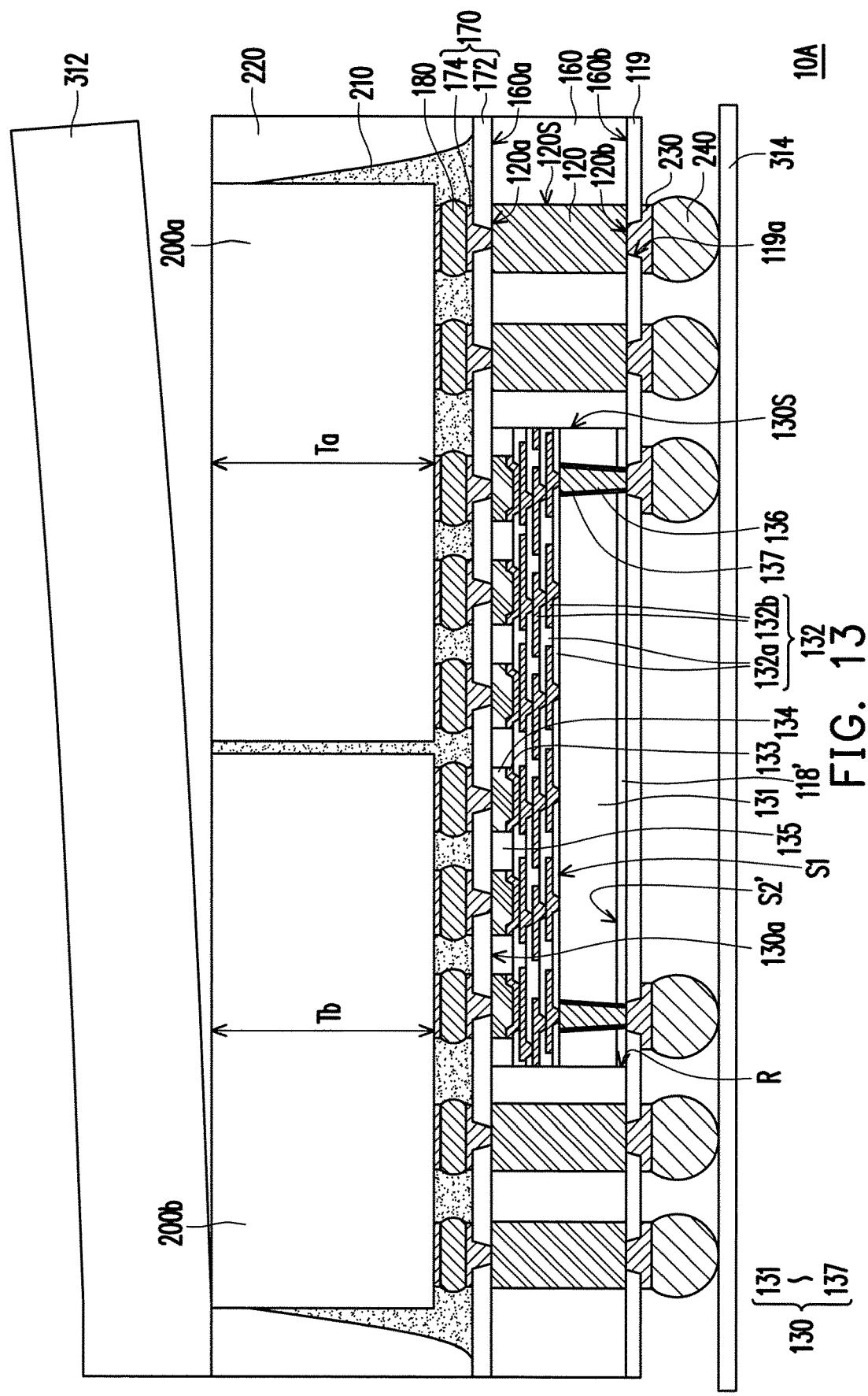

Referring to FIG. 13, in some embodiments, the carrier 312 is flipped (turned upside down) and then debonded from the semiconductor device 200a, the semiconductor device 200b, and the insulating encapsulation 220. In some embodiments, the carrier 312 is detached from the semiconductor device 200a, the semiconductor device 200b and the insulating encapsulation 220 through a debonding process, where the carrier 312 is removed, and the semiconductor device 200a, the semiconductor device 200b and the insulating encapsulation 220 are exposed. During the debonding step, a holding device 314 is adopted to secure the semiconductor package 10A before debonding the carrier 312. As shown in FIG. 13, for example, the holding device 314 may be an adhesive tape, an adhesive carrier or a suction pad.

Figure 14:
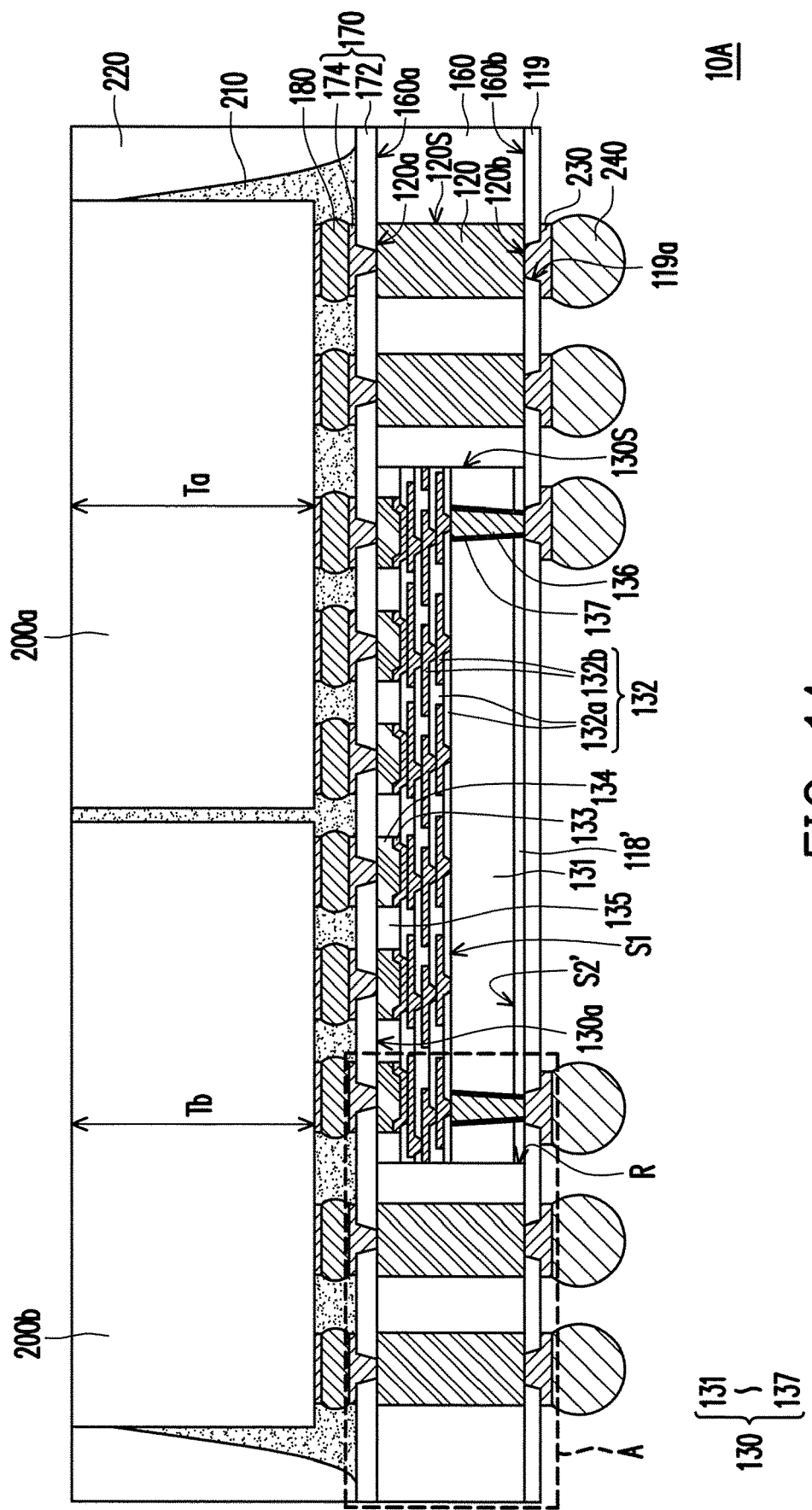
Figure 15:
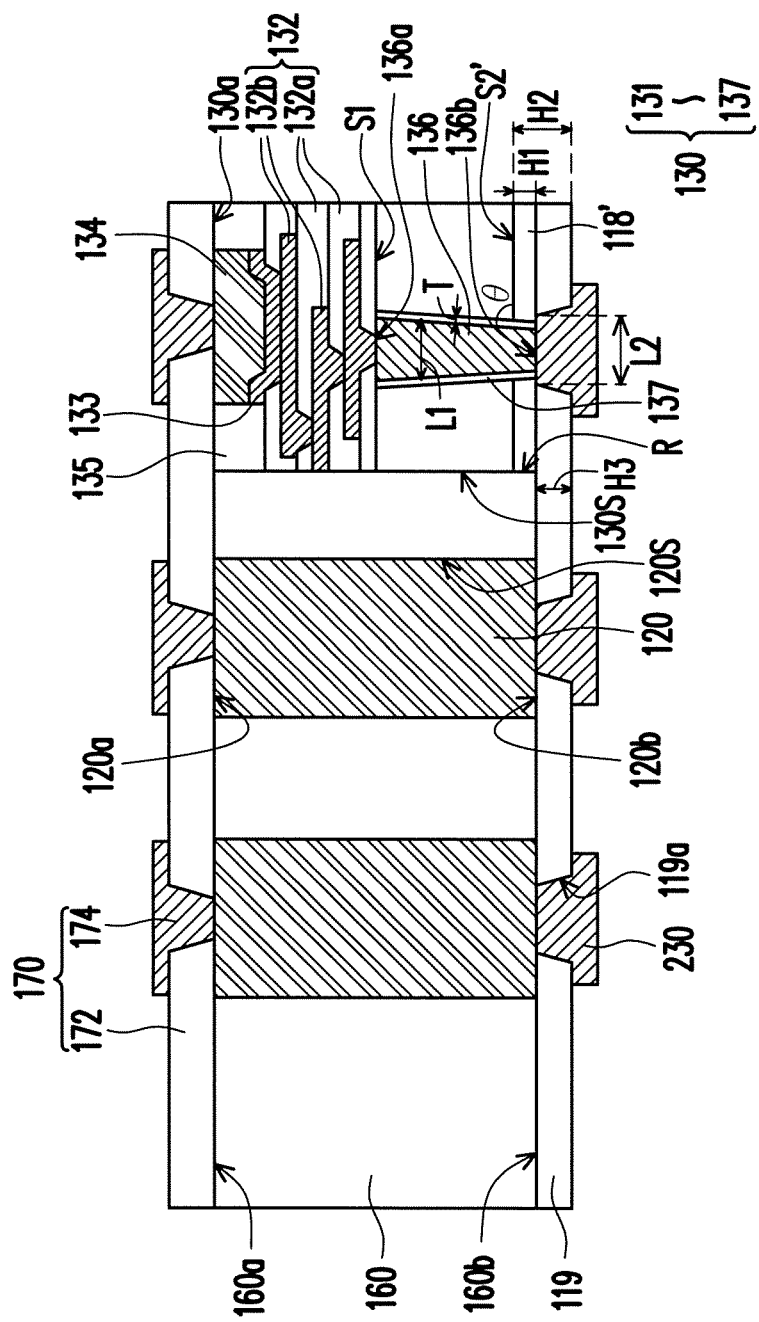
FIG. 15 is a schematic enlarged cross-sectional view illustrating a part of the semiconductor package depicted in FIG. 14.

Referring to FIG. 14, in some embodiments, the conductive elements 240 are released from the holding device 314 to form the semiconductor package 10A. In some embodiments, a dicing process is performed to cut the wafer having a plurality of the semiconductor packages 10A into individual and separated semiconductor packages 10A. In one embodiment, the dicing process is a wafer dicing process including mechanical blade sawing or laser cutting. Up to here, the manufacture of the semiconductor package 10A is completed.

Figure 16:
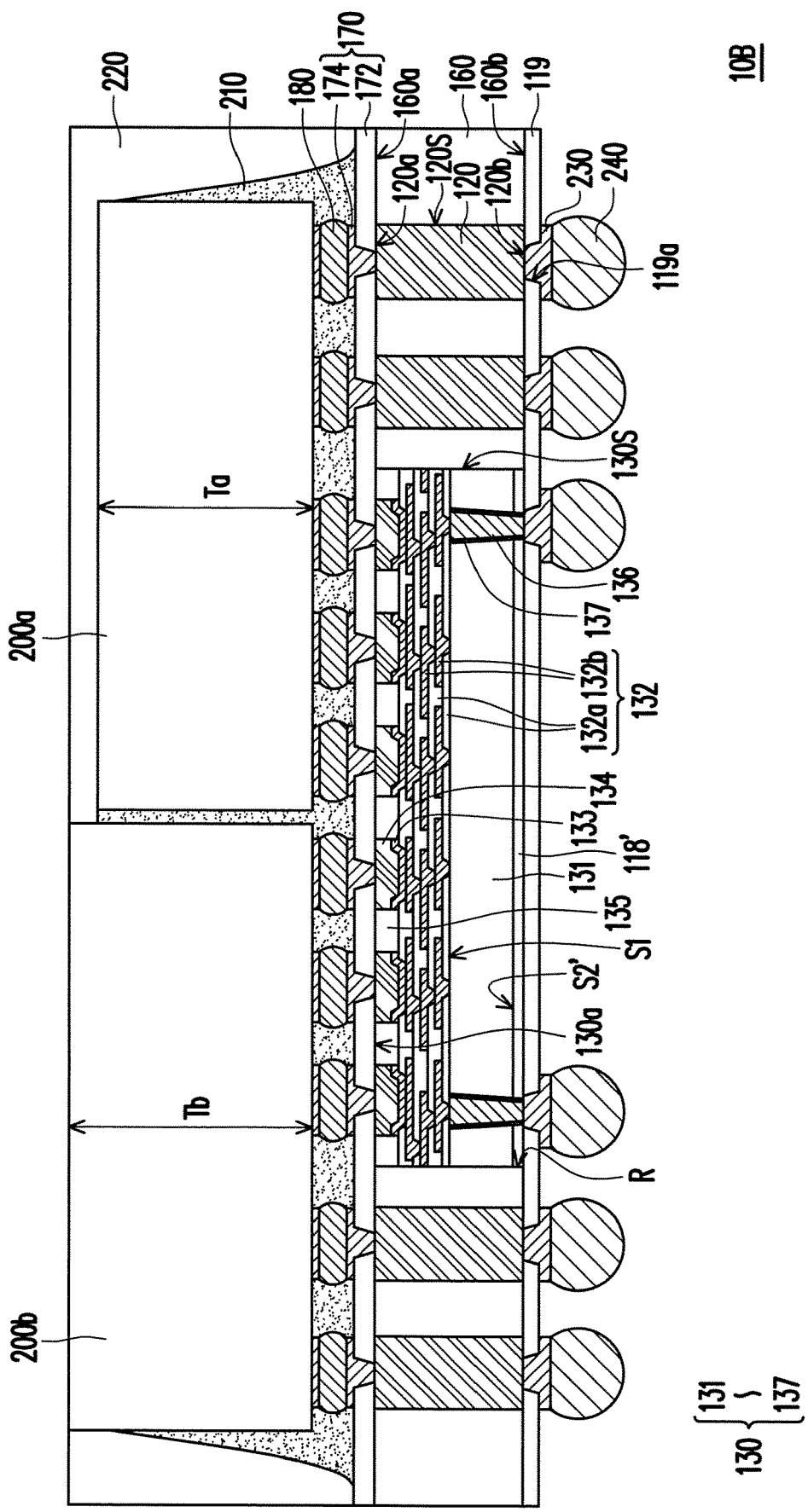
FIG. 16 is a schematic cross-sectional view of a semiconductor package in accordance with some exemplary embodiments of the disclosure.

FIG. 16 is a schematic cross-sectional view of a semiconductor package in accordance with some exemplary embodiments of the disclosure. Referring to FIG. 14 and FIG. 16 together, the semiconductor package 10A depicted in FIG. 14 and the semiconductor package 10B depicted in FIG. 16 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 14 and FIG. 16 together, the difference is that, for the semiconductor package 10B depicted in FIG. 16, the height Ta of the semiconductor device 200a is different from the height Tb of the semiconductor device 200b. As shown in FIG. 16, the height Ta of the semiconductor device 200a is less than the height Tb of the semiconductor device 200b. However, the disclosure is not limited thereto, in an alternative embodiment (not shown), the height Ta of the semiconductor device 200a may be greater than the height Tb of the semiconductor device 200b.

Figure 17:
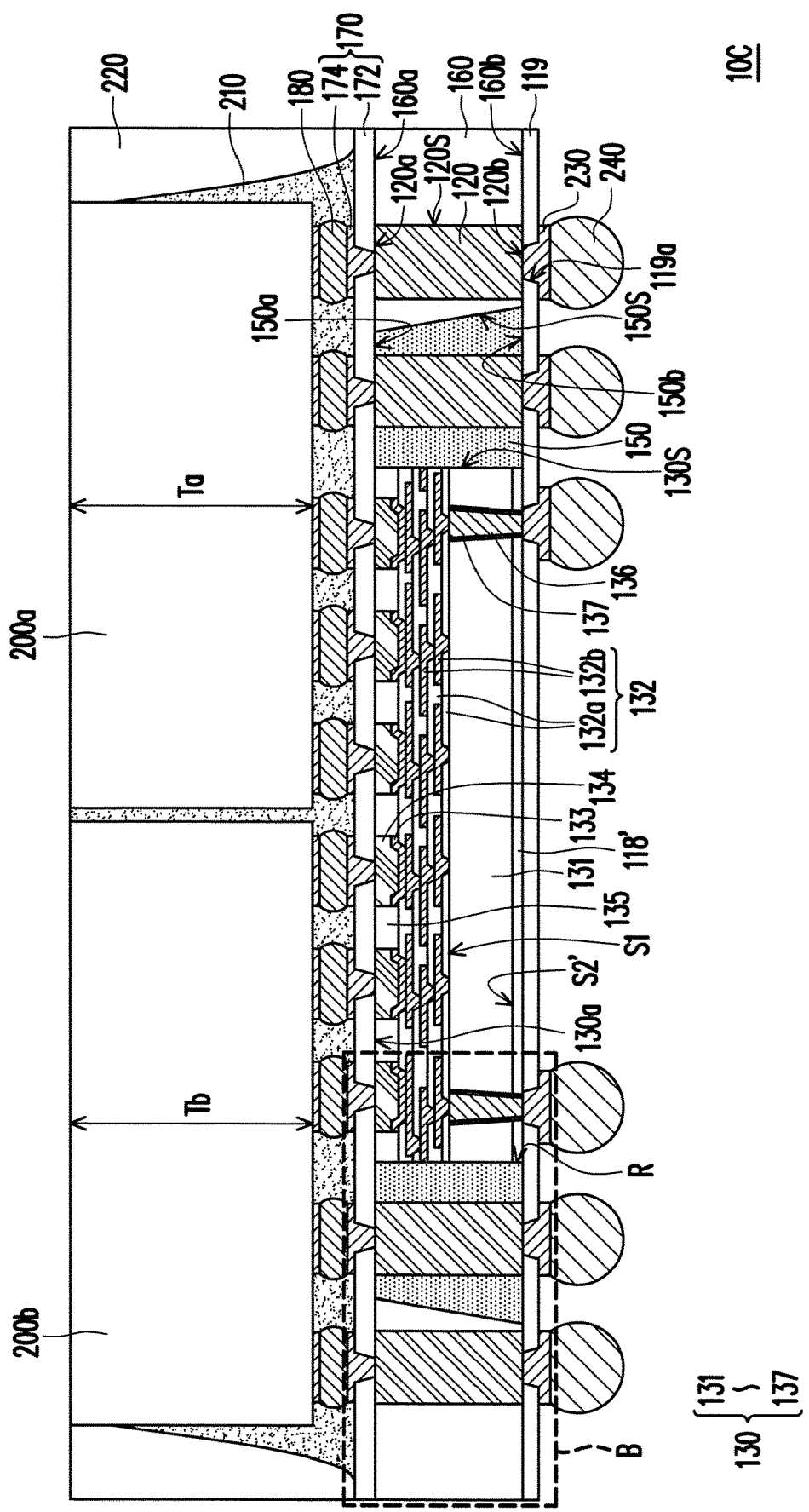
FIG. 17 is a schematic cross-sectional view of a semiconductor package in accordance with some exemplary embodiments of the disclosure.
Figure 18:
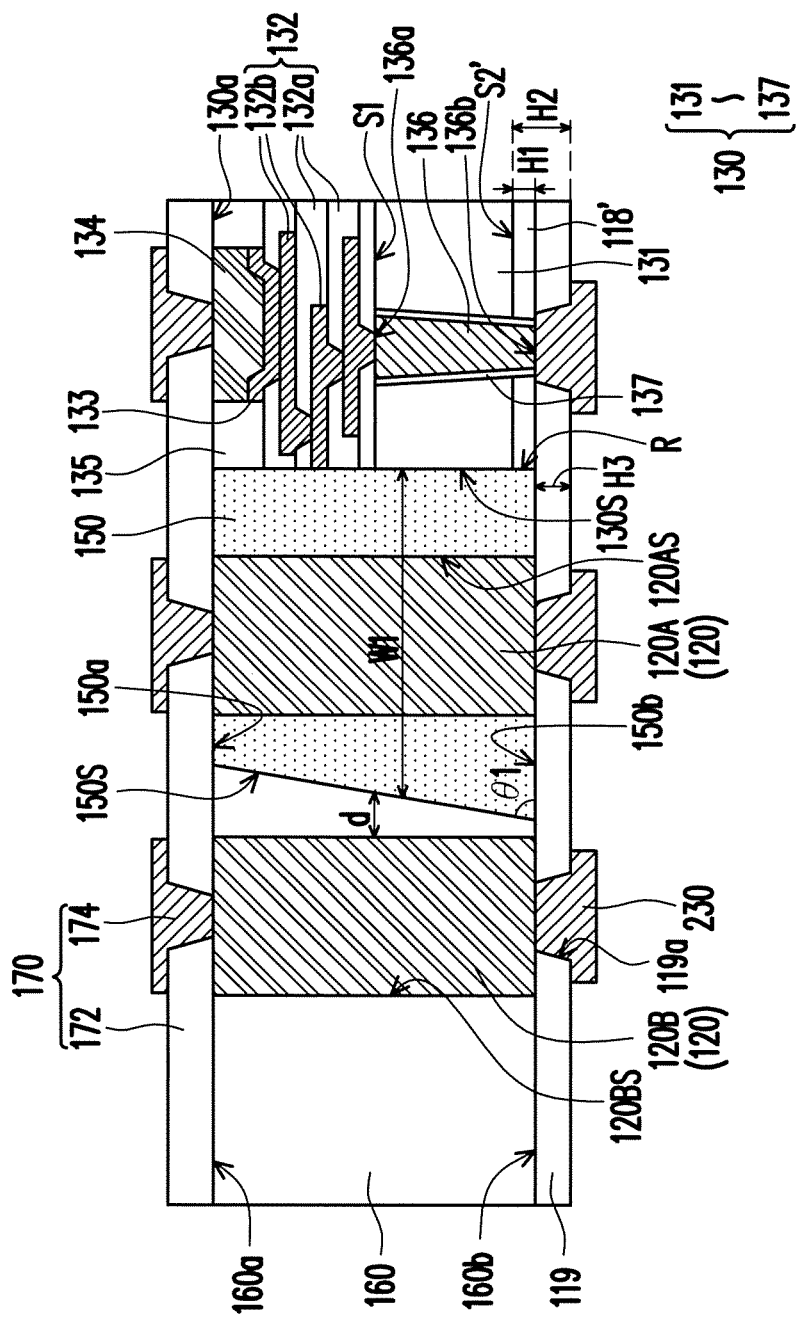
FIG. 18 is a schematic enlarged cross-sectional view illustrating a part of the semiconductor package depicted in FIG. 17.
Figure 19:
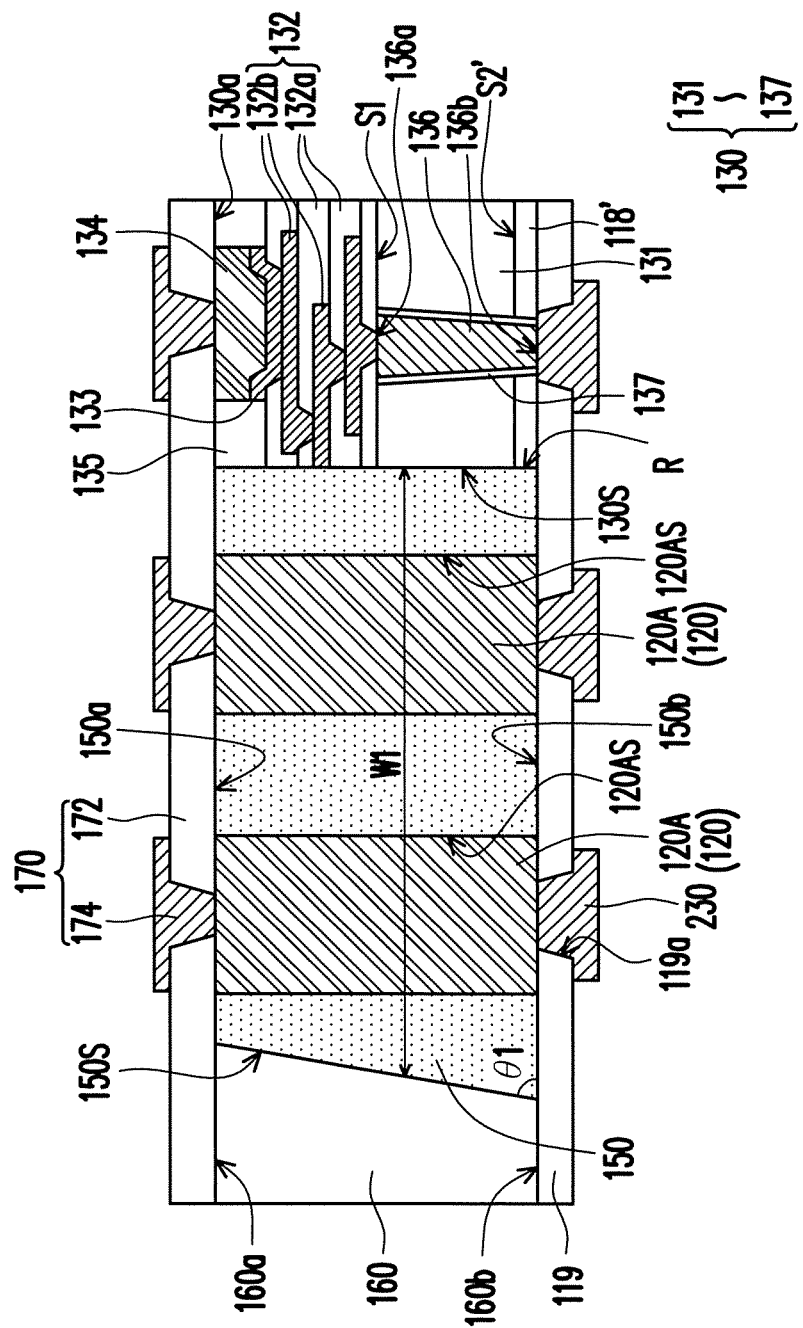
FIG. 19 is a schematic enlarged cross-sectional view illustrating a part of the semiconductor package in accordance with some exemplary embodiments of the disclosure.
Figure 20:
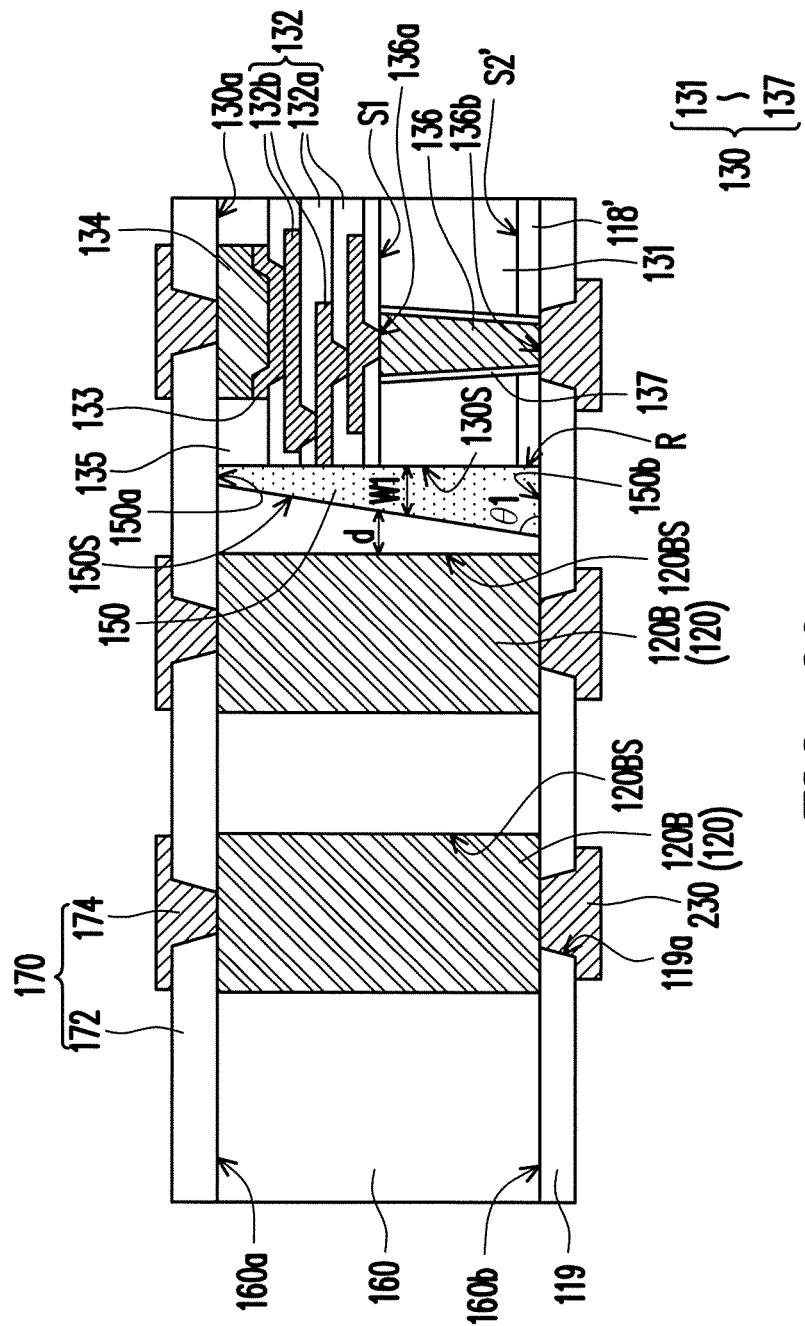
FIG. 20 is a schematic enlarged cross-sectional view illustrating a part of the semiconductor package in accordance with some exemplary embodiments of the disclosure.
Figure 21:
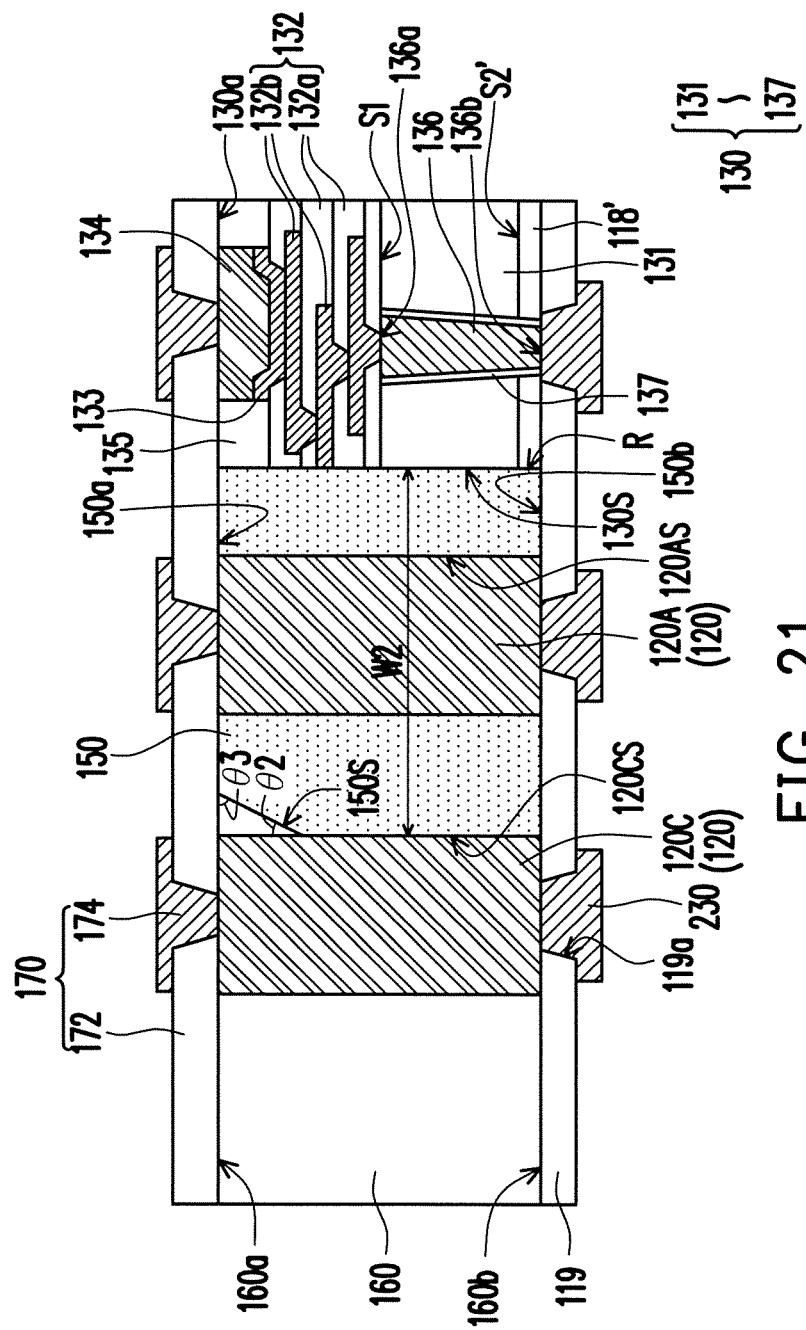
FIG. 21 is a schematic enlarged cross-sectional view illustrating a part of the semiconductor package in accordance with some exemplary embodiments of the disclosure.

FIG. 17 is a schematic cross-sectional view of a semiconductor package in accordance with some exemplary embodiments of the disclosure. FIG. 18 is a schematic enlarged cross-sectional view illustrating a part of the semiconductor package depicted in FIG. 17, where FIG. 18 illustrates an enlarged cross-sectional view of a portion of the semiconductor package depicted in FIG. 17 indicated by a dotted box B. FIG. 19 is a schematic enlarged cross-sectional view illustrating a part of the semiconductor package in accordance with some exemplary embodiments of the disclosure. FIG. 20 is a schematic enlarged cross-sectional view illustrating a part of the semiconductor package in accordance with some exemplary embodiments of the disclosure. FIG. 21 is a schematic enlarged cross-sectional view illustrating a part of the semiconductor package in accordance with some exemplary embodiments of the disclosure. In FIG. 18 to FIG. 21, only certain structural features including the passivation layer 119, the conductive pillars 120, the integrated circuit component 130, the insulating encapsulation 160, the redistribution circuit structure 170, and the conductive patterns 230 are stressed for illustration purposes, and only two conductive pillars 120 are illustrated for easy illustration.

Referring to FIG. 14 and FIG. 17 together, the semiconductor package 10A depicted in FIG. 14 and the semiconductor package 10C depicted in FIG. 17 are similar, the difference is that, for the semiconductor package 10C depicted in FIG. 17, an additional element, e.g. an insulating encapsulation 150, is further formed to warp at least a sidewall 130S of the integrated circuit component 130. The elements similar to or substantially the same as the elements described above will use the same reference numbers, and certain details or descriptions of the same elements and the relationship thereof (e.g. the relative positioning configuration and electrical connection) will not be repeated herein.

Referring to FIG. 17, in some embodiments, prior to the formation of the insulating encapsulation 160 described in FIG. 2, an insulating encapsulation 150 is formed over the carrier 112, and then the previously described manufacturing process as described in FIG. 3 to FIG. 14 above can be performed to obtain the semiconductor package 10C depicted in FIG. 17.

In some embodiments, a top surface 150a of the insulating encapsulation 150 is substantially levelled with the top surface 160a of the insulating encapsulation 160 and the top surfaces 120a of the conductive pillars 120, and a bottom surface 150b of the insulating encapsulation 150 is substantially levelled with the bottom surface 160b of the insulating encapsulation 160, the bottom surfaces 120b of the conductive pillars 120, and the bottom surfaces 136b of the TSVs 136. In other words, the top surface 150a of the insulating encapsulation 150 is coplanar to the top surface 160a of the insulating encapsulation 160 and the top surfaces 120a of the conductive pillars 120, and the bottom surface 150b of the insulating encapsulation 150 is coplanar to the bottom surface 160b of the insulating encapsulation 160, the bottom surfaces 120b of the conductive pillars 120, and the bottom surfaces 136b of the TSVs 136, as shown in FIG. 17.

In some embodiments, the insulating encapsulation 150 includes a glue or a glue material, and the insulating encapsulation 150 is formed by glue dispensing. In some embodiments, the insulating encapsulation 150 includes an insulator material (such as epoxy-based polymer or the like), an insulator material having fillers (such as silica, alumina, or the like), or the like. Due to the insulating encapsulation 150, the adhesion degree of the integrated circuit component 130 and the underlying layer (e.g. the buffer layer 116) is further enhanced. In the disclosure, the material of the insulating encapsulation 150 is different from the material of the insulating encapsulation 160. That is, the sidewall 150S of the insulating encapsulation 150 is referred as an interface of the insulating encapsulation 150 and the insulating encapsulation 160, where the interface is clearly shown in FIG. 17.

In some embodiments, the insulating encapsulation 150 may differ from the insulating encapsulation 160 in modulus, CTE, and thermal conductivity.

In certain embodiments, there exists fillers in the insulating encapsulation 160 for advanced packaging, where the modulus of the insulating encapsulation 160 may approximately range from about 5 GPa to about 30 GPa, the CTE of the insulating encapsulation 160 may approximately range from about 5 ppm/K to about 20 ppm/K (below a glass transition temperature (Tg) of the insulating encapsulation 160), and the thermal conductivity of the insulating encapsulation 160 may approximately range from about 1 W/mK to about 20 W/mK. In an alternative embodiment of having fillers in the insulating encapsulation 160, the modulus of the insulating encapsulation 160 may be approximately greater than 30 GPa, the CTE of the insulating encapsulation 160 may be approximately greater than 20 ppm/K (below the Tg of the insulating encapsulation 160), and the thermal conductivity of the insulating encapsulation 160 may be approximately greater than 20 W/mK.

On the other hand, the insulating encapsulation 150, for example, does not necessarily bear these criteria in the advanced packaging; and that is, there may not be fillers in the insulating encapsulation 150, where the modulus of the insulating encapsulation 150 may approximately range from about 1 GPa to about 10 GPa, the CTE of the insulating encapsulation 150 may approximately range from about 20 ppm/K to about 60 ppm/K (below a Tg of the insulating encapsulation 150), and the thermal conductivity of the insulating encapsulation 150 may approximately range from about 0.1 W/mK to about 5 W/mK. In an alternative embodiment of having no filler in the insulating encapsulation 150, the modulus of the insulating encapsulation 150 may approximately range from about 1 GPa to about 10 GPa, the CTE of the insulating encapsulation 150 may be approximately greater than 60 ppm/K (below the Tg of the insulating encapsulation 150), and the thermal conductivity of the insulating encapsulation 150 may approximately range from about 0.1 W/mK to about 5 W/mK.

In an example, as shown in FIG. 17 and FIG. 18, some of the conductive pillars 120 and the integrated circuit component 130 are encapsulated in the insulating encapsulation 150, and some of the conductive pillars 120 are encapsulated in the insulating encapsulation 160, for instance.

Referring to FIG. 18, the conductive pillars 120 includes at least one first conductive pillar 120A and at least one second conductive pillar 120B. In some embodiments, the first conductive pillar 120A is encapsulated in the insulating encapsulation 150, where a sidewall 120AS of the first conductive pillar 120A is covered by the insulating encapsulation 150, such that the first conductive pillar 120A is separated from the insulating encapsulation 160 by the insulating encapsulation 150. In other words, the first conductive pillar 120A is surrounded by and in contact with the insulating encapsulation 150 and is free of the insulating encapsulation 160. In some embodiments, the second conductive pillar 120B is encapsulated in the insulating encapsulation 160, where a sidewall 120BS of the second conductive pillar 120B is covered by the insulating encapsulation 160, such that the second conductive pillar 120B is separated from the insulating encapsulation 150 by the insulating encapsulation 160. In other words, the second conductive pillar 120B is surrounded by and in contact with the insulating encapsulation 160 and is free of the insulating encapsulation 150. As shown in FIG. 18, the first conductive pillar 120A penetrates the insulating encapsulation 150, and the second conductive pillar 120B penetrates the insulating encapsulation 160.

In certain embodiments, as shown in FIG. 18, the sidewall 150S and the bottom surface 150b of the insulating encapsulation 150 constitute an angle θ1, where the angle θ1 is an acute angle. In one embodiment, a range of the angle θ1 is about from 0.5° to 30°, however the disclosure is not limited thereto. In an alternative embodiment, the range of the angle θ1 is about from 30° to 60°. In an alternative embodiment, the range of the angle θ1 is about from 60° to 85°. The disclosure is not limited thereto.

In some embodiments, a maximum lateral width W1 from the sidewall 150S of the insulating encapsulation 150 to the sidewall 130S of the integrated circuit component 130 may range approximately from 10 µm to 100 µm, however the disclosure is not limited thereto. In an alternative embodiment, the maximum lateral width W1 may range approximately from 100 µm to 500 µm. In an alternative embodiment, the maximum lateral width W1 may be approximately above 500 µm.

In some embodiments, a maximum lateral distance d from the sidewall 150S of the insulating encapsulation 150 to the sidewall 120BS of the second conductive pillar 120B (e.g. the conductive pillar(s) 120 not covered by the insulating encapsulation 150) may range approximately from 5 µm to 100 µm, however the disclosure is not limited thereto. In an alternative embodiment, the maximum lateral distance d may range approximately from 100 µm to 500 µm. In an alternative embodiment, the maximum lateral distance d may be approximately above 500 µm.

Additionally, some various modifications of the configuration relationship of the conductive pillars 120, the insulating encapsulation 150, and the insulating encapsulation 160 are shown in FIG. 19 to FIG. 21. However, the disclosure is not limited thereto.

Referring to FIG. 19, the conductive pillars 120 includes at least two first conductive pillars 120A. In some embodiments, the first conductive pillars 120A are encapsulated in the insulating encapsulation 150, where the sidewalls 120AS of the first conductive pillars 120A are covered by the insulating encapsulation 150, such that the first conductive pillars 120A are separated from the insulating encapsulation 160 by the insulating encapsulation 150. In other words, the first conductive pillars 120A are surrounded by and in contact with the insulating encapsulation 150 and are free of the insulating encapsulation 160. As shown in FIG. 19, the first conductive pillars 120A penetrate the insulating encapsulation 150.

Referring to FIG. 20, the conductive pillars 120 includes at least two second conductive pillars 120B. In some embodiments, the second conductive pillars 120B are encapsulated in the insulating encapsulation 160, where the sidewalls 120BS of the second conductive pillars 120B are covered by the insulating encapsulation 160, such that the second conductive pillars 120B are separated from the insulating encapsulation 150 by the insulating encapsulation 160. In other words, the second conductive pillars 120B are surrounded by and in contact with the insulating encapsulation 160 and are free of the insulating encapsulation 150. As shown in FIG. 20, the second conductive pillars 120B penetrate the insulating encapsulation 160.

In the disclosure, the angle θ1, the maximum lateral width W1, and/or the maximum lateral distance d described in FIG. 18 also applied to the angle θ1, the maximum lateral width W1, and/or the maximum lateral distance d depicted in FIG. 19 and FIG. 20; and thus will not be repeated herein.

Referring to FIG. 21, the conductive pillars 120 includes at least one first conductive pillar 120A and at least one third conductive pillar 120C. In some embodiments, the first conductive pillar 120A is encapsulated in the insulating encapsulation 150, where the sidewall 120AS of the first conductive pillar 120A is covered by the insulating encapsulation 150, such that the first conductive pillar 120A is separated from the insulating encapsulation 160 by the insulating encapsulation 150. In other words, the first conductive pillar 120A is surrounded by and in contact with the insulating encapsulation 150 and is free of the insulating encapsulation 160. As shown in FIG. 21, the first conductive pillar 120A penetrates the insulating encapsulation 150. In some embodiments, the third conductive pillar 120C is encapsulated in the insulating encapsulating 150 and the insulating encapsulation 160, where the sidewall 120CS of the third conductive pillar 120C is partially covered by the insulating encapsulation 150 and is partially covered by the insulating encapsulation 160. In other words, the third conductive pillar 120C is surrounded by and in contact with the insulating encapsulation 150 and the insulating encapsulation 160, simultaneously. As shown in FIG. 20, the third conductive pillar 120C penetrates the interface (e.g., the sidewall 150S of the insulating encapsulation 150) of the insulating encapsulation 150 and the insulating encapsulation 160.

In some embodiments, an angle θ2 is between the interface (e.g., the sidewall 150S) of the insulating encapsulation 150 and the insulating encapsulation 160 and the sidewall 120CS of the third conductive pillar 120C, where the angle θ2 is an acute angle. In one embodiment, a range of the angle θ2 is about from 1° to 30°. In an alternative embodiment, the range of the angle θ2 is about from 30° to 60°. In an alternative embodiment, the range of the angle θ2 is about from 60° to 89°.

In some embodiments, an angle θ3 is between the interface (e.g., the sidewall 150S) of the insulating encapsulation 150 and the insulating encapsulation 160 and the top surface 160a of the insulating encapsulation 160, where the angle θ3 is an acute angle, (e.g. θ3=90°−θ2).

In some embodiments, a maximum lateral width W2 measured from the sidewall 150S of the insulating encapsulation 150 to the sidewall 120CS of the third conductive pillar 120C (e.g. the conductive pillar(s) 120 penetrating the interface of two different insulating encapsulations) may approximately range from 10 μm to 100 μm, however the disclosure is not limited thereto. In an alternative embodiment, the maximum lateral width W2 may approximately range from 100 μm to 500 μm. In an alternative embodiment, the maximum lateral width W2 may be approximately above 500 μm.

In an alternative embodiment (not shown), the conductive pillars 120 may include at least one second conductive pillar 120B and at least one third conductive pillar 120C, and the second conductive pillar 120B penetrates the insulating encapsulation 160 while the third conductive pillar 120C penetrates the interface of the insulating encapsulation 150 and the insulating encapsulation 160. In an alternative embodiment (not shown), the conductive pillars 120 may include at least one first conductive pillar 120A, at least one second conductive pillar 120B and at least one third conductive pillar 120C, and the first conductive pillar 120A and the second conductive pillar 120B respectively penetrate the insulating encapsulation 150 and the insulating encapsulation 160 while the third conductive pillar 120C penetrates the interface of the insulating encapsulation 150 and the insulating encapsulation 160. The above embodiments may have the similar specifications of the angles θ1~θ3, the maximum lateral widths W1~W2, and/or the maximum lateral distance d described in FIG. 18 to FIG. 21. The disclosure is not limited thereto.

Figure 22:
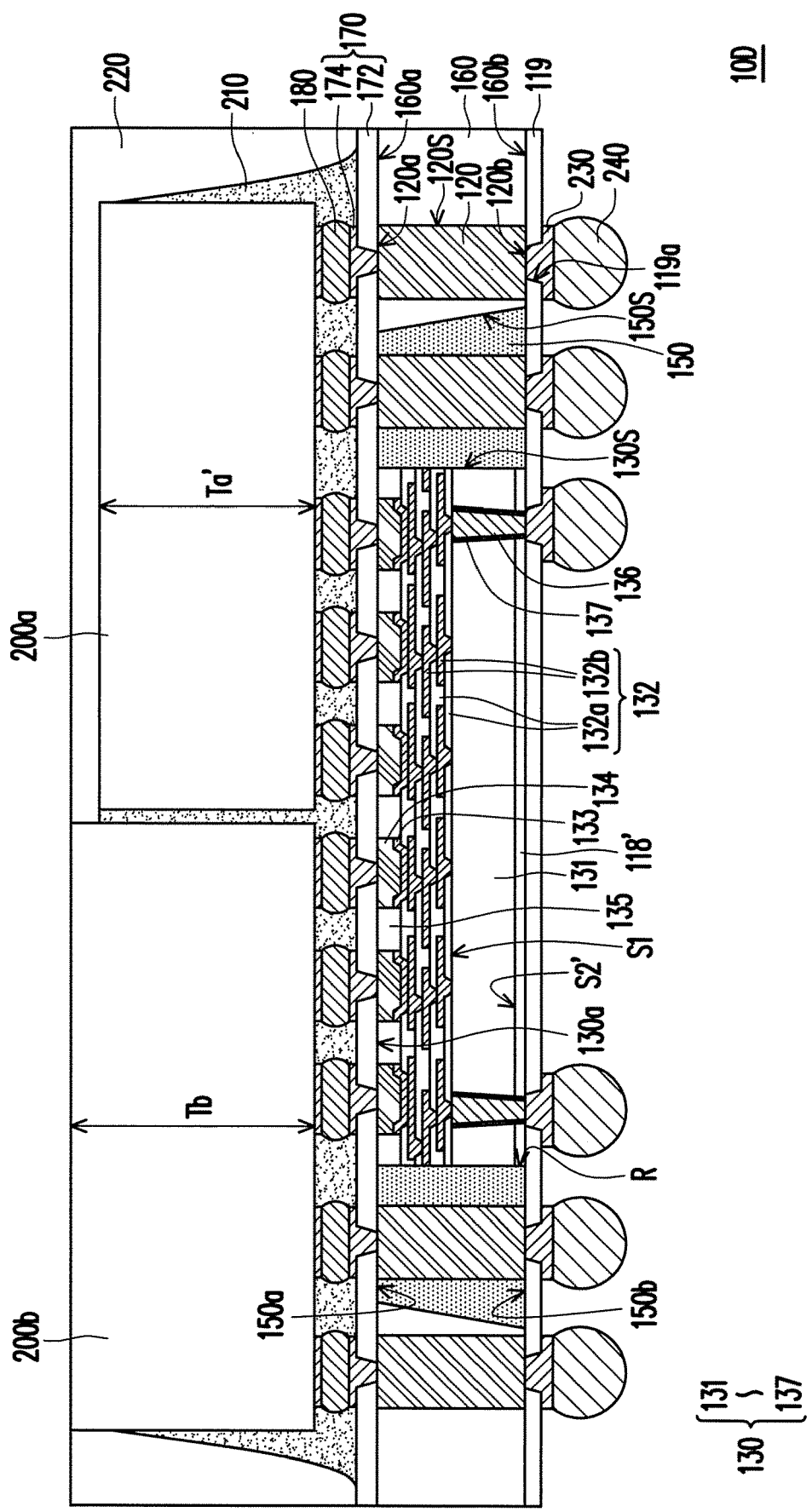
FIG. 22 is a schematic cross-sectional view of a semiconductor package in accordance with some exemplary embodiments of the disclosure.

FIG. 22 is a schematic cross-sectional view of a semiconductor package in accordance with some exemplary embodiments of the disclosure. Referring to FIG. 17 and FIG. 22 together, the semiconductor package 10C depicted in FIG. 17 and the semiconductor package 10D depicted in FIG. 22 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 17 and FIG. 22 together, the difference is that, for the semiconductor package 10D depicted in FIG. 22, the height Ta of the semiconductor device 200a is different from the height Tb of the semiconductor device 200b. As shown in FIG. 22, the height Ta of the semiconductor device 200a is less than the height Tb of the semiconductor device 200b. However the disclosure is not limited thereto, in an alternative embodiment (not shown), the height Ta of the semiconductor device 200a may be greater than the height Tb of the semiconductor device 200b.

Figure 23:
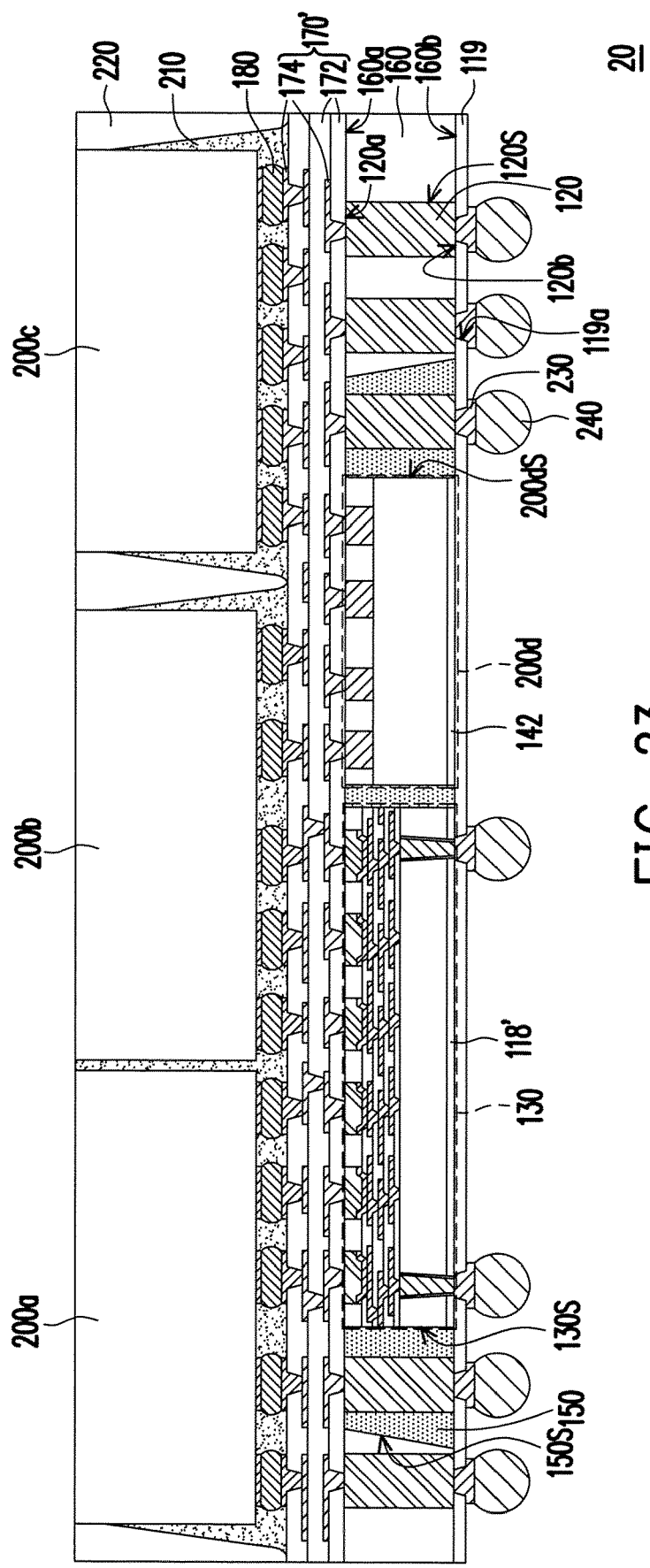
FIG. 23 is a schematic cross-sectional view of a semiconductor package in accordance with some exemplary embodiments of the disclosure.

During the packaging processes, the semiconductor packages 10A~10D respectively depicted in FIG. 14, FIG. 16, FIG. 17, and FIG. 22 may further include additional one or more semiconductor device(s) and additional one or more integrated circuit component(s). An exemplary embodiment is provided in FIG. 23, where the semiconductor package 20 depicted in FIG. 23 is a modification of the semiconductor package 10C depicted in FIG. 17, the disclosure is not limited thereto. Such modification may be also applied to the semiconductor packages 10A, 10B, and 10D respectively depicted in FIG. 14, FIG. 16, and FIG. 22.

FIG. 23 is a schematic cross-sectional view of a semiconductor package in accordance with some exemplary embodiments of the disclosure. Referring to FIG. 17 and FIG. 23 together, the semiconductor package 10C depicted in FIG. 17 and the semiconductor package 20 depicted in FIG. 23 are similar, additional elements, e.g. a semiconductor device 200c and a semiconductor device 200d, are further included in the semiconductor package 20, and the redistribution circuit structure 170 is replaced with the redistribution circuit structure 170'. The elements similar to or substantially the same as the elements described above will use the same reference numbers, and certain details or descriptions of the same elements and the relationship thereof (e.g. the relative positioning configuration and electrical connection) will not be repeated herein.

The formation of the redistribution circuit structure 170' includes sequentially forming one or more dielectric layers 172 and one or more metallization layers 174 in alternation. The material of the redistribution circuit structure 170' and formation method thereof are similar to the processes for forming the redistribution circuit structure 170 as described in FIG. 3 and the associated description, and thus may not be repeated herein. In certain embodiments, the top surface of the topmost layer of the metallization layers 174 is exposed to electrically connect to the semiconductor devices 200a~200c through the connectors 180, and the bottom surface of the lowest layer of the metallization layers 174 is exposed to directly connect to the integrated circuit component 130, the semiconductor device 200d, and the conductive pillars 120.

In some embodiments, as shown in FIG. 23, the semiconductor device 200d is arranged aside of the integrated circuit component 130 and encapsulated in the insulating encapsulation 150. In some embodiments, a connecting film 142 is located between the semiconductor device 200d and the passivation layer 119, and a sidewall 200dS of the semiconductor device 200d is in contact with the insulating encapsulation 150. In certain embodiments, the semiconductor device 200d is electrically connected to the redistribution circuit structure 170'. In some embodiments, through the redistribution circuit structure 170', the semiconductor device 200d is electrically connected to some of the conductive pillars 120. In some embodiments, through the redistribution circuit structure 170' and some of the conductive pillars 120, the semiconductor device 200d is electrically connected to some of the conductive elements 240. In some embodiments, through the redistribution circuit structure 170', the semiconductor device 200d is electrically connected to the integrated circuit component 130. In some embodiments, the materials of the connecting film 142 and the connecting film 140 may be the same or different, the disclosure is not limited thereto.

In some embodiments, the semiconductor device 200a is electrically connected to the integrated circuit component 130 through the connectors 180 and the redistribution circuit structure 170'. In some embodiments, the semiconductor device 200a is electrically connected to some of the conductive elements 240 through the connectors 180, the redistribution circuit structure 170', the integrated circuit component 130 (e.g., the TSVs 136), and the conductive patterns 230. In some embodiments, the semiconductor device 200a is electrically connected to some of the conductive elements 240 through the connectors 180, the redistribution circuit structure 170', some of the conductive pillars 120, and the conductive patterns 230.

In some embodiments, the semiconductor device 200b is electrically connected to the integrated circuit component 130 through the connectors 180 and the redistribution circuit structure 170'. In some embodiments, the semiconductor device 200b is electrically connected to some of the conductive elements 240 through the connectors 180, the redistribution circuit structure 170', the integrated circuit component 130 (e.g., the TSVs 136), and the conductive patterns 230. In some embodiments, the semiconductor device 200b is electrically connected to some of the conductive elements 240 through the connectors 180, the redistribution circuit structure 170', some of the conductive pillars 120, and the conductive patterns 230.

In some embodiments, as shown in FIG. 23, the semiconductor device 200c is arranged aside of the semiconductor device 200a and the semiconductor device 200b, and the semiconductor device 200c is electrically connected to the redistribution circuit structure 170' through the connectors 180. In certain embodiments, the semiconductor device 200c is encapsulated in the underfill material 210. In certain embodiments, the semiconductor device 200c is encapsulated in the insulating encapsulation 220. In some embodiments, the semiconductor device 200c is electrically connected to the integrated circuit component 130 through the connectors 180 and the redistribution circuit structure 170'. In some embodiments, the semiconductor device 200c is electrically connected to some of the conductive elements 240 through the connectors 180, the redistribution circuit structure 170', the integrated circuit component 130 (e.g., the TSVs 136), and the conductive patterns 230. In some embodiments, the semiconductor device 200c is electrically connected to some of the conductive elements 240 through the connectors 180, the redistribution circuit structure 170', some of the conductive pillars 120, and the conductive patterns 230.

As shown in FIG. 23, in some embodiments, the semiconductor device 200a, the semiconductor device 200b, the semiconductor device 200c and/or the semiconductor device 200d are electrically communicated to each other through the integrated circuit component 130 in the semiconductor package 20. For example, the semiconductor device 200c and the semiconductor device 200d may include digital chips, analog chips or mixed signal chips, such as application-specific integrated circuit ("ASIC") chips, sensor chips, wireless and radio frequency (RF) chips, MEMS chips, CIS chips, pre-assembled packages, memory chips, logic chips or voltage regulator chips. In certain embodiments, the semiconductor device 200a, the semiconductor device 200b, the semiconductor device 200c and/or the semiconductor device 200d may be the same type or different types. The disclosure is not limited thereto.

Figure 24:
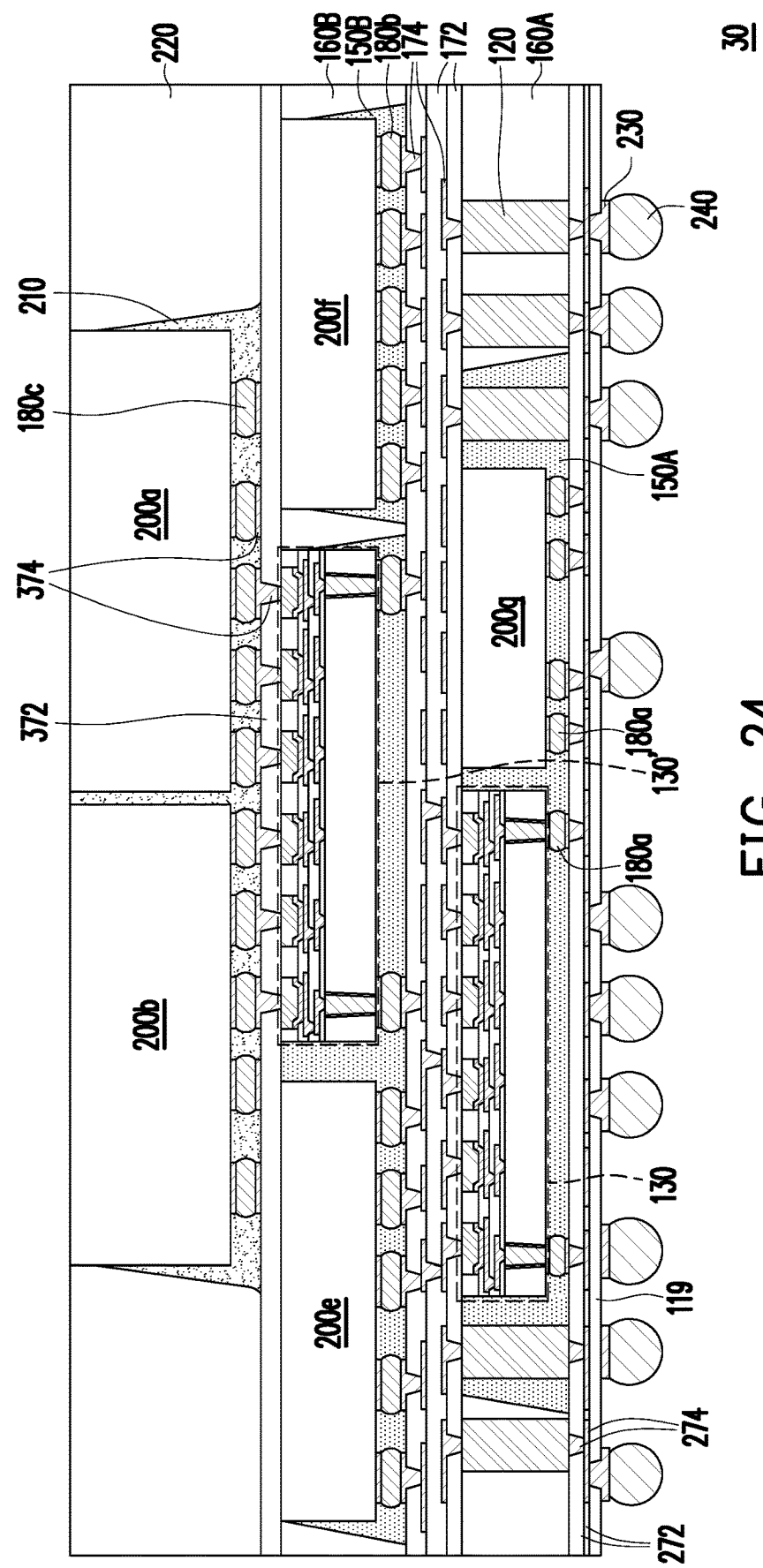
FIG. 24 is a schematic cross-sectional view of a semiconductor package in accordance with some exemplary embodiments of the disclosure.

During the packaging processes, the semiconductor packages 10A~10D respectively depicted in FIG. 14, FIG. 16, FIG. 17, and FIG. 22 may further include additional one or more semiconductor device(s) and additional one or more integrated circuit component(s) encapsulated in different layers of insulating encapsulations. An exemplary embodiment is provided in FIG. 24, where the semiconductor package 30 depicted in FIG. 24 is a modification of the semiconductor package 10C depicted in FIG. 17. In some embodiments, as shown in FIG. 24, there are three layers of insulating encapsulations, however the disclosure is not limited thereto; the number of the layers of the insulating encapsulations may be less than three or more than three. Such modification may be also applied to the semiconductor packages 10A, 10B, and 10D respectively depicted in FIG. 14, FIG. 16, and FIG. 22.

FIG. 24 is a schematic cross-sectional view of a semiconductor package in accordance with some exemplary embodiments of the disclosure. Referring to FIG. 17 and FIG. 24 together, the semiconductor package 10C depicted in FIG. 17 and the semiconductor package 30 depicted in FIG. 24 are similar, additional elements, e.g. a semiconductor devices 200e~200g, an additional integrated circuit components 130', and redistribution circuit structures 270, 370, are further included in the semiconductor package 30. The elements similar to or substantially the same as the elements described above will use the same reference numbers, and certain details or descriptions of the same elements and the relationship thereof (e.g. the relative positioning configuration and electrical connection) will not be repeated herein.

As shown in FIG. 24, the semiconductor package 30 at least includes the passivation layer 119, the conductive pillars 120, the integrated circuit components 130 and 130', the insulating encapsulation 150 including first portion 150A and a second portion 150B, the insulating encapsulation 160 including a first portion 160A and a second portion 160B, the redistribution circuit structures 170, 270, 370, the connectors 180 including first connectors 180a, second connectors 180b and third connectors 180c, the semiconductor devices 200a, 200b, 200e, 200f, 200g, the underfill material 210, the insulating encapsulation 220, the conductive patterns 230, and the conductive elements 240. Note that, the integrated circuit component 130' is the same as the integrated circuit component 130, and thus certain details or descriptions of the same elements and the relationship thereof (e.g. the relative positioning configuration and electrical connection) will not be repeated herein. However the disclosure is not limited thereto; in an alternative element, the integrated circuit component 130' may be different from the integrated circuit component 130.

In some embodiments, as shown in FIG. 24, the integrated circuit component 130 and the semiconductor device 200g are disposed on the passivation layer 119 and encapsulated in the first portion 150A of the insulating encapsulation 150, where the integrated circuit component 130 and the semiconductor device 200g are arranged aside to each other. In some embodiments, the first portion 150A of the insulating encapsulation 150 is encapsulated in the first portion 160A of the insulating encapsulation 160.

In some embodiments, the conductive pillars 120 are arranged aside of the integrated circuit component 130 and the semiconductor device 200g and are disposed on the passivation layer 119. As shown in FIG. 24, some of the conductive pillars 120 are encapsulated in the first portion 150A of the insulating encapsulation 150, and some of the conductive pillars 120 are encapsulated in the first portion 160A of the insulating encapsulation 160.

In some embodiments, the redistribution circuit structure 270 is between the passivation layer 119 and the integrated circuit component 130 and between the passivation layer 119 and the semiconductor device 200g. In some embodiments, the redistribution circuit structure 270 is between the passivation layer 119 and the first portion 150A of the insulating encapsulation 150 and between the passivation layer 119 and the first portion 160A of the insulating encapsulation 160. In some embodiments, the redistribution circuit structure 270 includes dielectric layers 272 and metallization layers 274 arranged in alternation, where a top surface of the topmost layer of the metallization layers 274 exposed by the topmost layer of the dielectric layers 272 is physically connected to the first connectors 180a and the conductive pillars 120, and a bottom surface of the lowest layer of the metallization layers 274 exposed by the lowest layer of the dielectric layers 272 is physically connected to the conductive patterns 230 connecting to the conductive elements 240. As shown in FIG. 24, the integrated circuit component 130 and the semiconductor device 200g are electrically connected to the redistribution circuit structure 270 through the first connectors 180a of the connectors 180. The material of the redistribution circuit structure 270 and formation method thereof are similar to the processes for forming the redistribution circuit structure 170' as described in FIG. 23, and thus may not be repeated herein.

In some embodiments, as shown in FIG. 24, the redistribution circuit structure 170' is disposed on the integrated circuit component 130, the semiconductor device 200g, the first portion 150A of the insulating encapsulation 150, and the first portion 160A of the insulating encapsulation 160. In some embodiments, the integrated circuit component 130 and the semiconductor device 200g are electrically connected to the redistribution circuit structure 170'. In certain embodiments, the redistribution circuit structure 170' includes the dielectric layers 172 and the metallization layers 174, where the top surface of the topmost layer of the metallization layers 174 is exposed to electrically connect to the semiconductor devices 200e, 200f and the integrated circuit components 130' through the second connectors 180b, and the bottom surface of the lowest layer of the metallization layers 174 is exposed to electrically connect to the integrated circuit component 130, the semiconductor device 200g, and the conductive pillars 120. The material of the redistribution circuit structure 170' and formation method thereof are similar to the processes for forming the redistribution circuit structure 170' as described in FIG. 23, and thus may not be repeated herein.

As shown in FIG. 24, in some embodiments, some of the conductive elements 240 are electrically connected to the integrated circuit component 130 through the conductive patterns 230, the redistribution circuit structure 270 and the first connectors 180a. In some embodiments, some of the conductive elements 240 are electrically connected to the integrated circuit component 130 through the conductive patterns 230, the redistribution circuit structure 270, some of the conductive pillars 120, the redistribution circuit structure 170', and the connecting pillars (not marked). In some embodiments, some of the conductive elements 240 are electrically connected to the semiconductor device 200g through the conductive patterns 230, the redistribution circuit structure 270 and the first connectors 180a.

As shown in FIG. 24, the integrated circuit component 130, the semiconductor device 200g, and the conductive pillars 120, the first portion 150A of the insulating encapsulation 150, and the first portion 160A of the insulating encapsulation 160 are located between the redistribution circuit structure 270 and the redistribution circuit structure 170'.

In some embodiments, as shown in FIG. 24, the integrated circuit component 130', the semiconductor device 200e, and the semiconductor device 200f are disposed on the redistribution circuit structure 170' and encapsulated in the second portion 150B of the insulating encapsulation 150, where the integrated circuit component 130', the semiconductor device 200e, and the semiconductor device 200f are arranged aside to each other and over the integrated circuit component 130 and the semiconductor device 200g. In some embodiments, the second portion 150B of the insulating encapsulation 150 is encapsulated in the second portion 160B of the insulating encapsulation 160.

In some embodiments, as shown in FIG. 24, the integrated circuit component 130', the semiconductor device 200e, and the semiconductor device 200f are electrically connected to the redistribution circuit structure 170' through the second connectors 180b. In certain embodiments, the integrated circuit component 130', the semiconductor device 200e, and the semiconductor device 200f may be electrically connected to the integrated circuit component 130 through the second connectors 180b, the redistribution circuit structure 170', the conductive pillars 120, the redistribution circuit structure 270, and the first connectors 180a. In certain embodiments, the integrated circuit component 130', the semiconductor device 200e, and the semiconductor device 200f may be electrically connected to the integrated circuit component 130 through the second connectors 180b and the redistribution circuit structure 170'. In certain embodiments, the integrated circuit component 130', the semiconductor device 200e, and the semiconductor device 200f may be electrically connected to some of the conductive elements 240 through the second connectors 180b, the redistribution circuit structure 170', some of the conductive pillars 120, the redistribution circuit structure 270, and the conductive patterns 230. In certain embodiments, the integrated circuit component 130', the semiconductor device 200e, and the semiconductor device 200f may be electrically connected to some of the conductive elements 240 through the second connectors 180b, the redistribution circuit structure 170', the integrated circuit component 130 (e.g. the TSVs 136), the first connectors 180a, the redistribution circuit structure 270, and the conductive patterns 230.

In other words, the integrated circuit component 130', the semiconductor device 200e, the semiconductor device 200f, and the semiconductor device 200g are electrically communicated to each other through the integrated circuit component 130.

In some embodiments, as shown in FIG. 24, the redistribution circuit structure 370 is disposed on the integrated circuit component 130', the semiconductor device 200e, the semiconductor device 200f, the second portion 150B of the insulating encapsulation 150, and the second portion 160B of the insulating encapsulation 160. In certain embodiments, the redistribution circuit structure 370 includes one dielectric layer 372 and one metallization layer 374, where the top surface of the metallization layer 374 is exposed to electrically connect to the semiconductor device 200a and the semiconductor device 200b through the third connectors 180c, and the bottom surface of the metallization layer 374 is exposed to electrically connect to the integrated circuit component 130'. The material of the redistribution circuit structure 370 and formation method thereof are similar to the processes for forming the redistribution circuit structure 170 as described in FIG. 3, and thus may not be repeated herein.

As shown in FIG. 24, the integrated circuit component 130', the semiconductor device 200e, and the semiconductor device 200f are located between the redistribution circuit structure 170' and the redistribution circuit structure 370.

In some embodiments, as shown in FIG. 24, the semiconductor device 200a and the semiconductor device 200b are disposed on and electrically connected to the redistribution circuit structure 370 through the third connectors 180c. In certain embodiments, the semiconductor device 200a and the semiconductor device 200b are encapsulated in the underfill material 210 and the insulating encapsulation 220. As shown in FIG. 24, the underfill material 210 is encapsulated in the insulating encapsulation 220. In some embodiments, the semiconductor device 200a and the semiconductor device 200b are electrically connected to the integrated circuit component 130' through the redistribution circuit structure 370 and the third connectors 180c. In other words, the semiconductor device 200a and the semiconductor device 200b are electrically communicated to each other through the integrated circuit component 130'.

In some embodiments, the electric signal (acted as input data or output data) may be transmitted from the semiconductor devices 200a, 200b, 200e, 200f, 200g and/or the integrated circuit components 130, 130' to the external elements connected to the conductive elements 240, or may be transmitted from the external elements connected to the conductive elements 240 to the semiconductor devices 200a, 200b, 200e, 200f, 200g and/or the integrated circuit components 130, 130'. The disclosure is not limited thereto.

For example, the semiconductor devices 200e, 200f, 200g may include digital chips, analog chips or mixed signal chips, such as application-specific integrated circuit ("ASIC") chips, sensor chips, wireless and radio frequency (RF) chips, MEMS chips, CIS chips, pre-assembled packages, memory chips, logic chips or voltage regulator chips. In certain embodiments, the semiconductor devices 200a, 200b, 200e, 200f, 200g may be the same type or different types. The disclosure is not limited thereto.

FIG. 25 to FIG. 29 are schematic cross-sectional views of various stages of manufacturing a semiconductor package in accordance with some exemplary embodiments of the disclosure. The semiconductor package 10A depicted in FIG. 1 to FIG. 14 are similar to the semiconductor package 40A depicted in FIG. 25 to FIG. 29, and one of the differences is that, for the semiconductor package 40A depicted in FIG. 25 to FIG. 29, the integrated circuit component 130 is replaced with the integrated circuit component 130". The elements similar to or substantially the same as the elements described above will use the same reference numbers, and certain details or descriptions of the same elements and the relationship thereof (e.g. the relative positioning configuration and electrical connection) will not be repeated herein. In some embodiments, prior to or after the formation of the conductive pillars 120 in FIG. 1, an integrated circuit component 130" is disposed on the carrier 112 instead of the integrated circuit component 130, and then the previously described manufacturing process as described in FIG. 2 to FIG. 6 and FIG. 25 to FIG. 29 above can be performed to obtain the semiconductor package 40A depicted in FIG. 29.

In some embodiments, the integrated circuit component 130" is similar to the integrated circuit component 130. The integrated circuit component 130" has the semiconductor substrate 131, the interconnection structure 132, the connecting pads 133, the connecting pillars 134, the protection layer 135 and has none of the TSVs 136 and the liners 137, for example.

Figure 25:
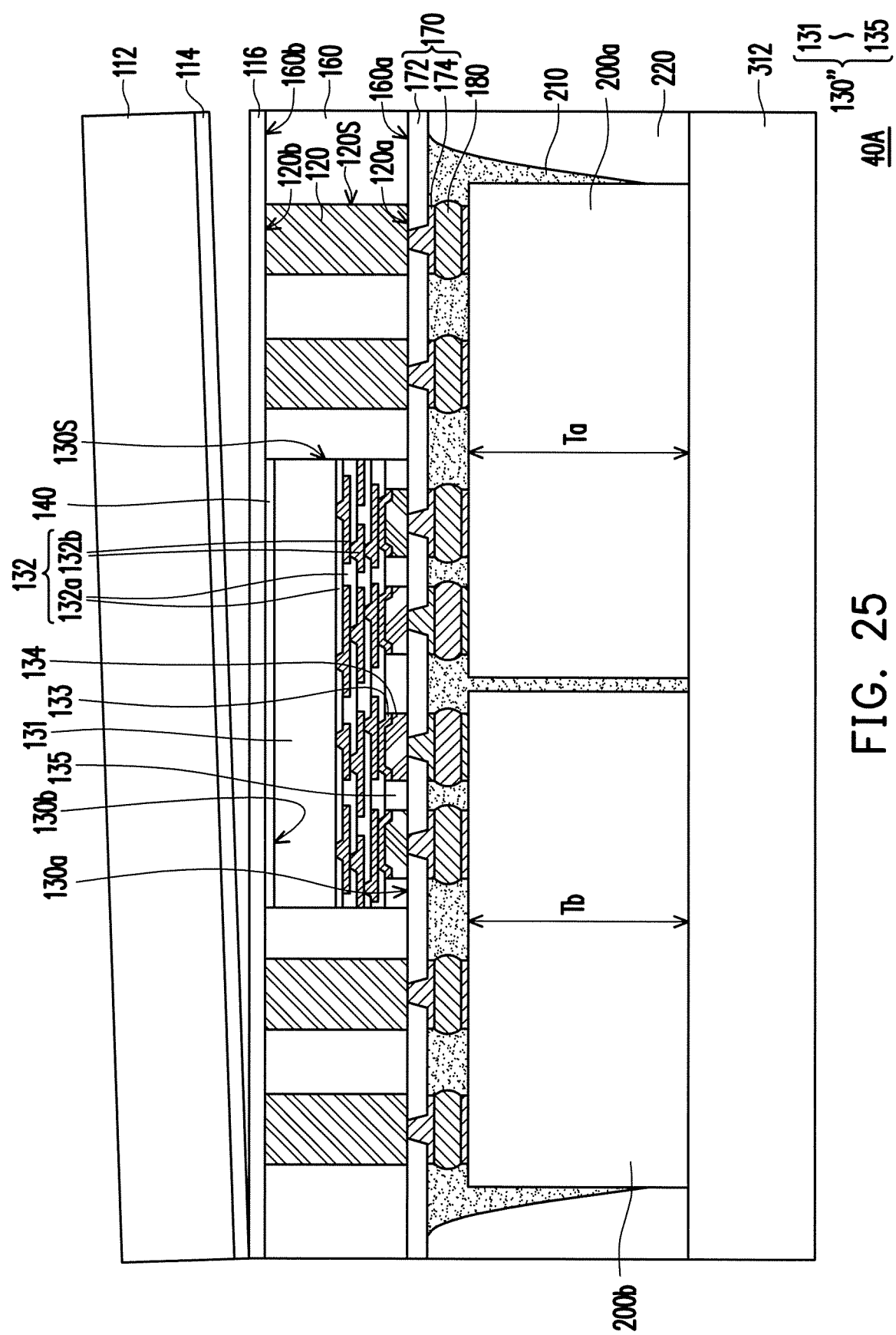
FIG. 25 to FIG. 29 are schematic cross-sectional views of various stages of manufacturing a semiconductor package in accordance with some exemplary embodiments of the disclosure.

Referring to FIG. 25, in some embodiments, the semiconductor package 40A is flipped (turned upside down) and placed on the carrier 312, and the carrier 112 is debonded from the buffer layer 116, following the process as described in FIG. 6. In some embodiments, the buffer layer 116 is easily separated from the carrier 112 due to the debond layer 114, and the buffer layer 116 is exposed. In some embodiments, the carrier 112 is detached from the buffer layer 116 through a debonding process, and the carrier 112 and the debond layer 114 are removed. As shown in FIG. 25, a surface of the connecting film 140 facing away from the backside 130b of the integrated circuit component 130" is substantially levelled with the bottom surfaces 120b of the conductive pillars 120. In the words, the surface of the connecting film 140 facing away from the backside 130b of the integrated circuit component 130" is coplanar to the bottom surfaces 120b of the conductive pillars 120.

Figure 26:
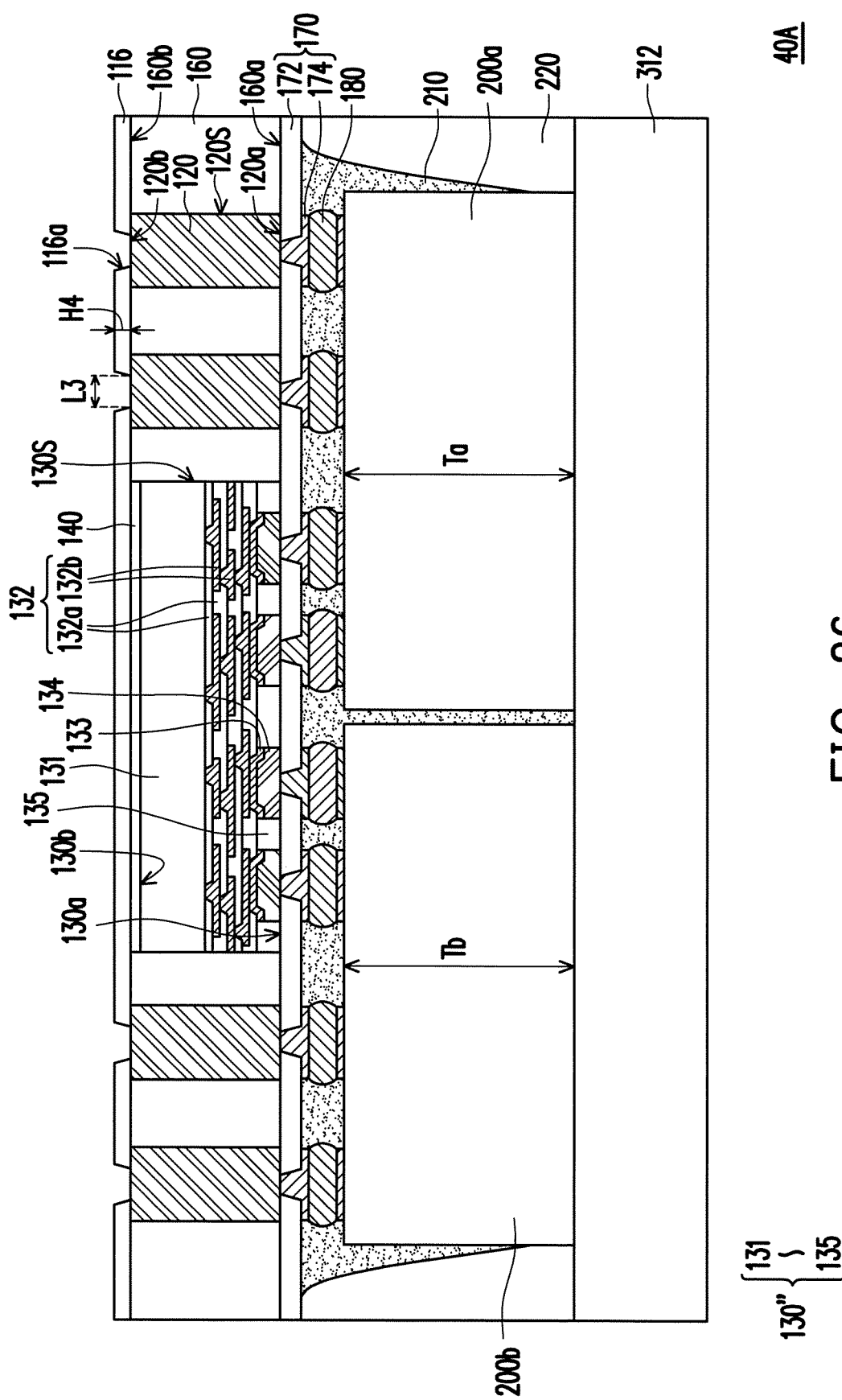

Referring to FIG. 26, in some embodiments, the buffer layer 116 is patterned to form a plurality of contact openings 116a in the buffer layer 116 exposing the bottom surfaces 120b of the conductive pillars 120. The number of the contact openings 116a may correspond to the number of the conductive pillars 120. In some embodiments, the contact openings 116a in the buffer layer 116 are formed by laser drilling process or other suitable processes. The disclosure is not limited thereto.

In some embodiments, as shown in FIG. 26, a maximum length L3 of the contact openings 116a may approximately range from 7 μm to 20 μm. In an alternative embodiment, the maximum length L3 may approximately range from 20 μm to 100 μm. In an alternative embodiment, the maximum length L3 may be approximately above 100 μm. In some embodiments, a height H4 of the buffer layer 116 may approximately range from 1 μm to 10 μm. In an alternative embodiment, the height H4 may approximately range from 10 μm to 50 μm.

Figure 27:
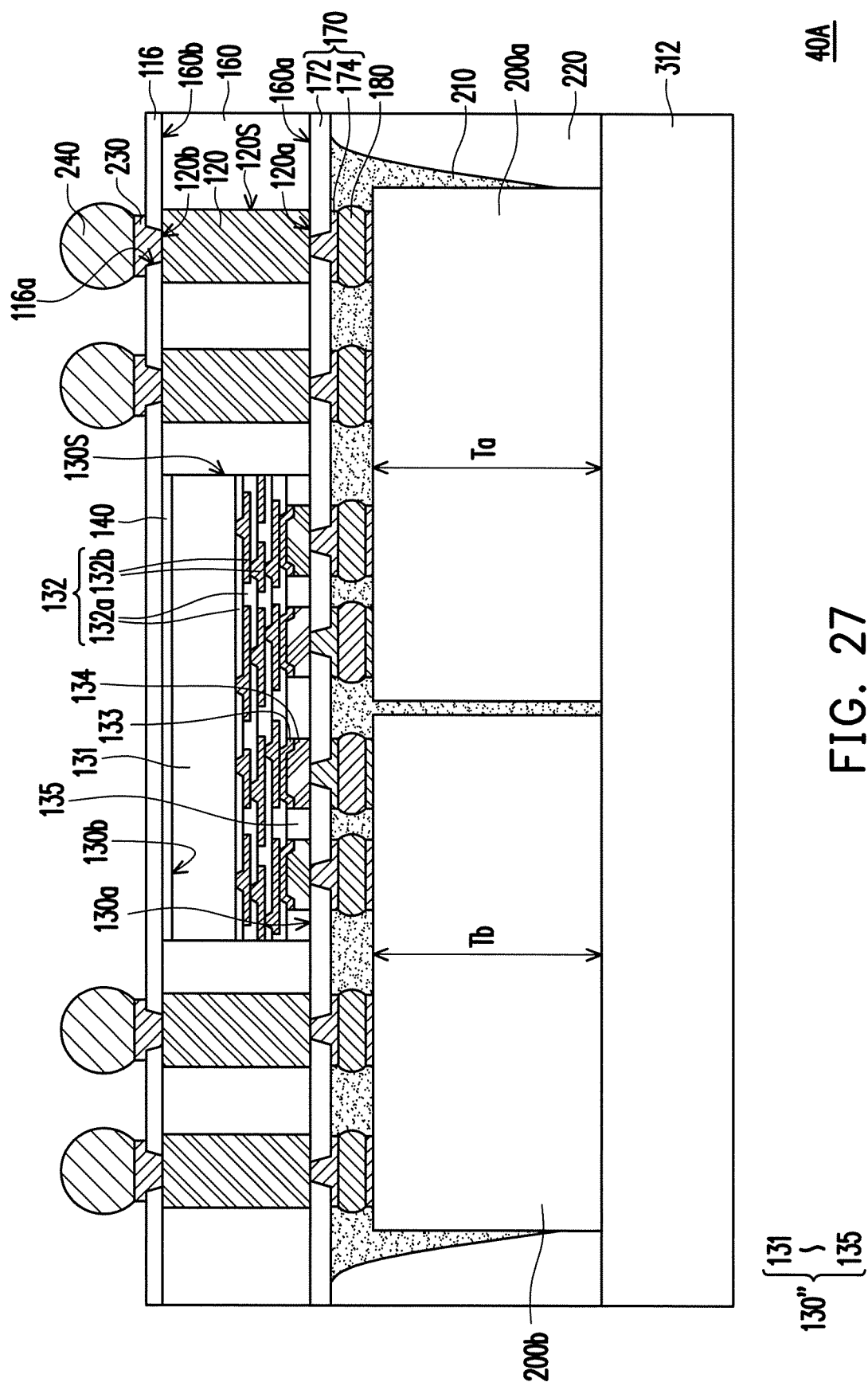

Referring to FIG. 27, in some embodiments, the conductive patterns 230 and the plurality of conductive elements 240 is disposed on the buffer layer 116. As shown in FIG. 27, in some embodiments, the conductive patterns 230 are directly disposed on the bottom surfaces 120b of the conductive pillars 120 by penetrating through the contact opening 116a formed in the buffer layer 116. In some embodiments, some of the conductive elements 240 are electrically connected to the integrated circuit component 130" through some of the conductive patterns 230, the conductive pillars 120, and the redistribution circuit structure 170. In some embodiments, some of the conductive elements 240 are electrically connected to the semiconductor device 200a and the semiconductor device 200b through some of the conductive patterns 230, the conductive pillars 120, the redistribution circuit structure 170, and the connectors 180. As shown in FIG. 27, the semiconductor device 200a and the semiconductor device 200b are electrically connected to the integrated circuit component 130" through the connectors 180 and the redistribution circuit structure 170, such that the semiconductor device 200a and the semiconductor device 200b are electrically communicated to each other through the integrated circuit component 130". The numbers of the conductive patterns 230 and the conductive elements 240 may correspond to the number of the conductive pillars 120. The disclosure is not limited thereto. The materials of the conductive patterns 230 and the conductive elements 240 and formation methods thereof are similar to the processes for forming the conductive patterns 230 and the conductive elements 240 as described in FIG. 12, and thus may not be repeated herein.

Figure 28:
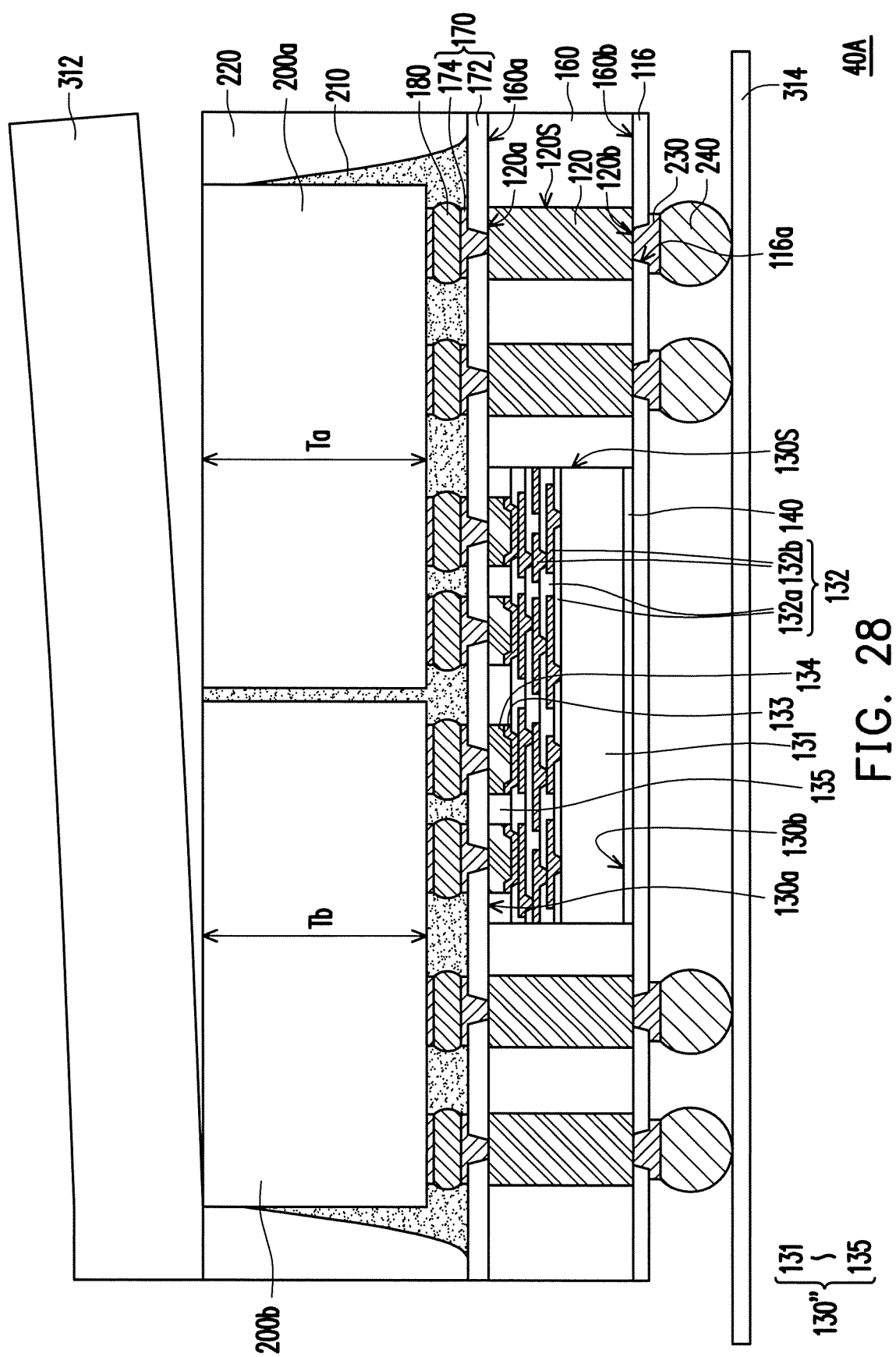

Referring to FIG. 28, in some embodiments, the carrier 312 is flipped (turned upside down) and then debonded from the semiconductor device 200a, the semiconductor device 200b, and the insulating encapsulation 220. In some embodiments, the carrier 312 is detached from the semiconductor device 200a, the semiconductor device 200b, and the insulating encapsulation 220 through a debonding process, where the carrier 312 is removed, and the semiconductor device 200a, the semiconductor device 200b, and the insulating encapsulation 220 are exposed. During the debonding step, a holding device 314 is adopted to secure the semiconductor package 40A before debonding the carrier 312. As shown in FIG. 28, for example, the holding device 314 may be an adhesive tape, an adhesive carrier or a suction pad.

Figure 29:
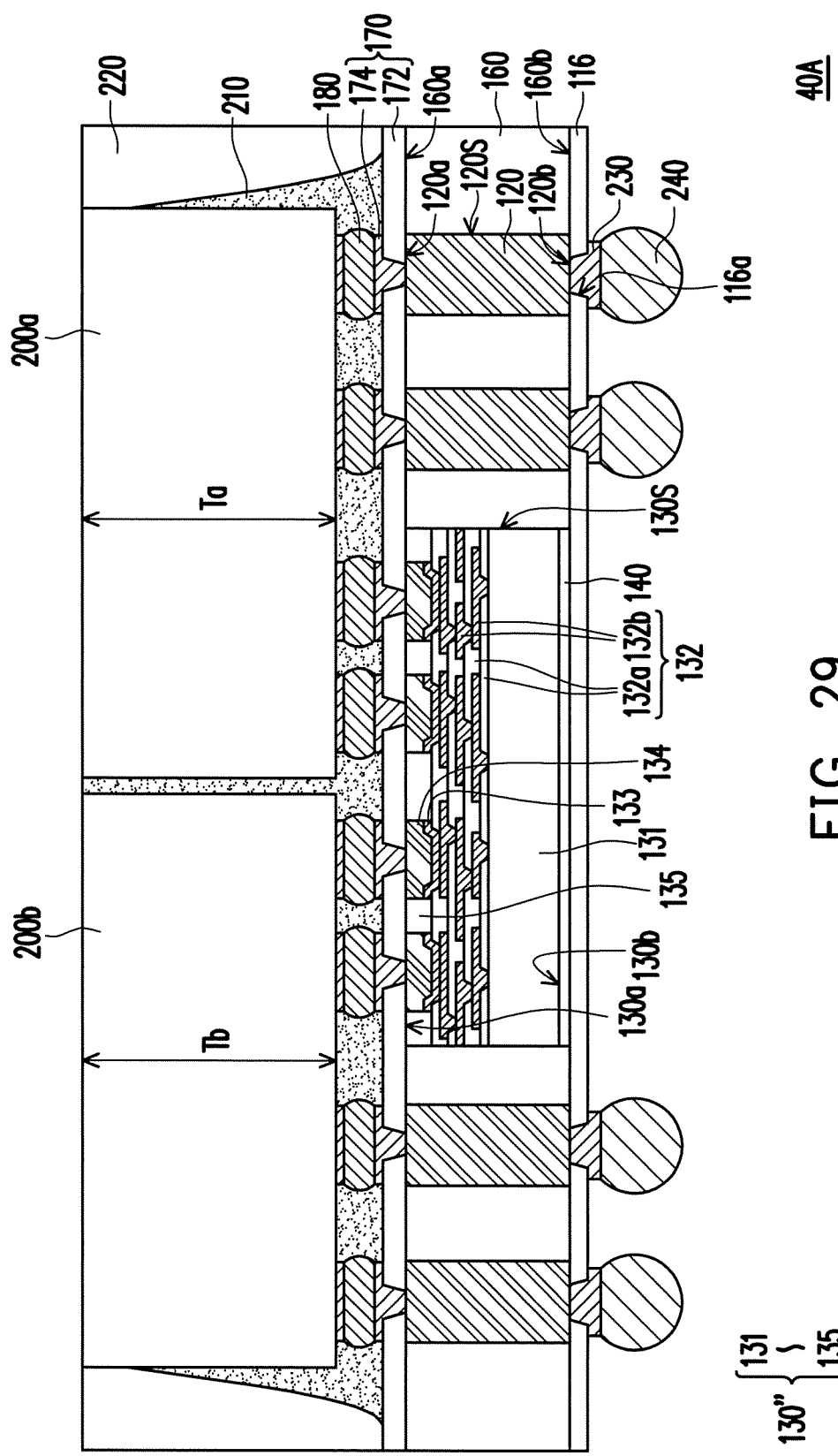

Referring to FIG. 29, in some embodiments, the conductive elements 240 is released from the holding device 314 to form the semiconductor package 40A. In some embodiments, a dicing process is performed to cut the wafer having a plurality of the semiconductor packages 40A into individual and separated semiconductor packages 40A. In one embodiment, the dicing process is a wafer dicing process including mechanical blade sawing or laser cutting. Up to here, the manufacture of the semiconductor package 40A is completed.

As shown in FIG. 29, the buffer layer 116 is remained in the semiconductor package 40A, where the buffer layer 116 prevents any possible damage(s) occurring on the conductive pillars 120; and in addition, the buffer layer 116 may further act as a passivation layer having a high degree of planarization and evenness, which is beneficial for later-formed components (such as the conductive patterns 230, etc).

Figure 30:
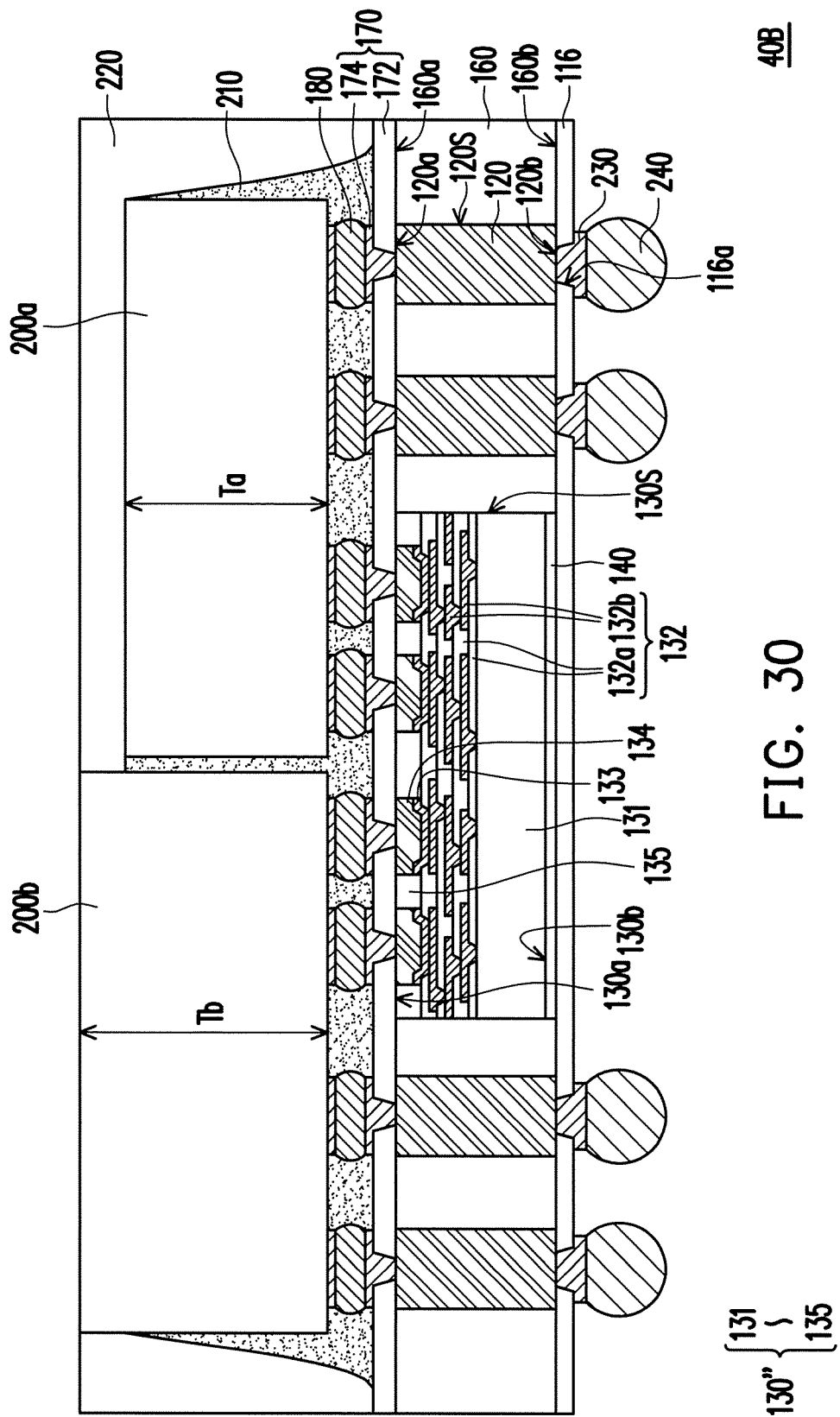
FIG. 30 is a schematic cross-sectional view of a semiconductor package in accordance with some exemplary embodiments of the disclosure.

FIG. 30 is a schematic cross-sectional view of a semiconductor package in accordance with some exemplary embodiments of the disclosure. Referring to FIG. 29 and FIG. 30 together, the semiconductor package 40A depicted in FIG. 29 and the semiconductor package 40B depicted in FIG. 30 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 29 and FIG. 30 together, the difference is that, for the semiconductor package 40B depicted in FIG. 30, the height Ta of the semiconductor device 200a is different from the height Tb of the semiconductor device 200b. As shown in FIG. 30, for example, the height Ta of the semiconductor device 200a is less than the height Tb of the semiconductor device 200b.

However, the disclosure is not limited thereto, in an alternative embodiment (not shown), the height Ta of the semiconductor device 200a may be greater than the height Tb of the semiconductor device 200b.

Figure 31:
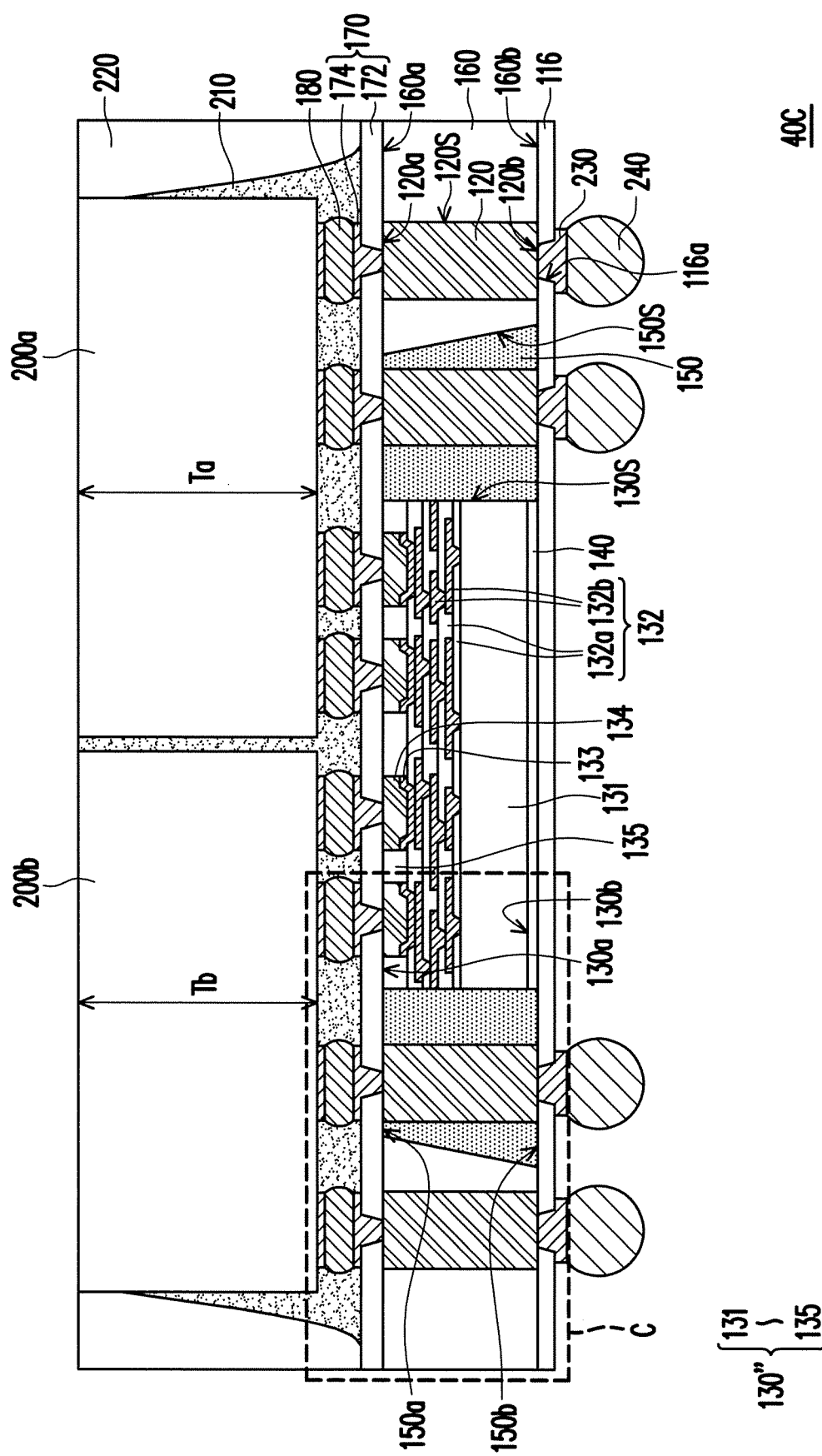
FIG. 31 is a schematic cross-sectional view of a semiconductor package in accordance with some exemplary embodiments of the disclosure.
Figure 32:
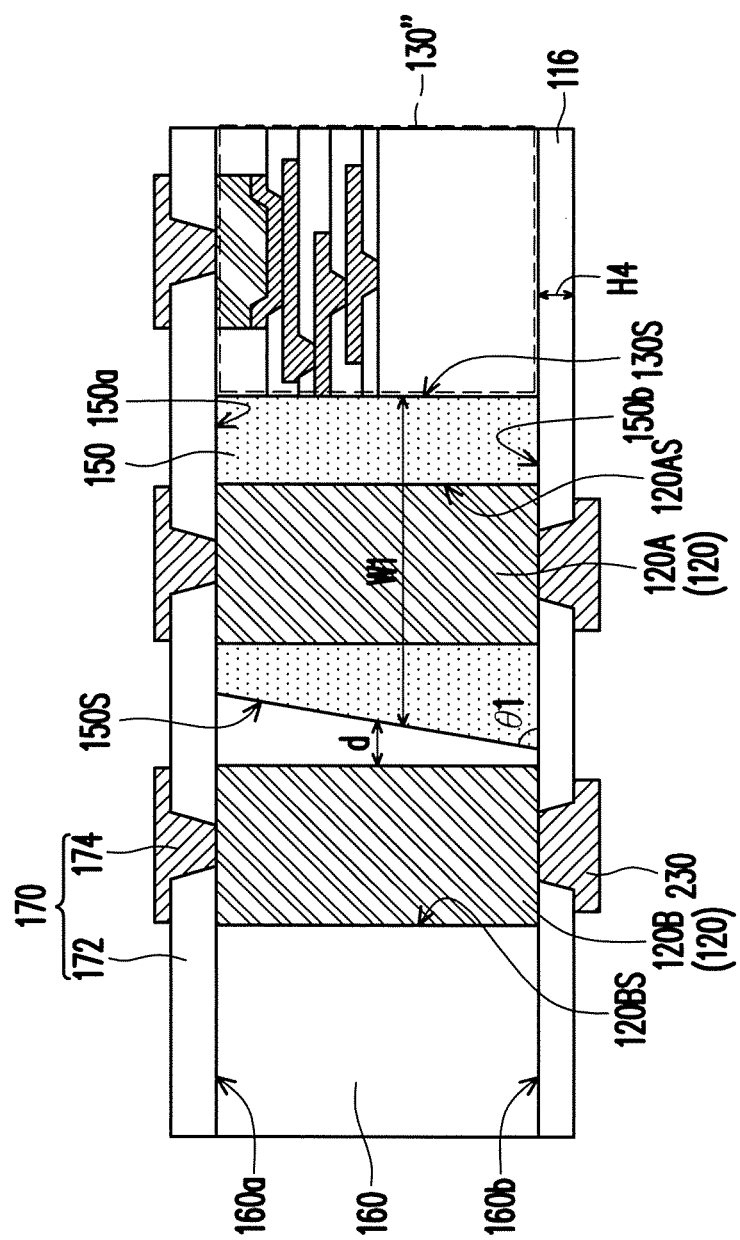
FIG. 32 is a schematic enlarged cross-sectional view illustrating a part of the semiconductor package depicted in FIG. 31.
Figure 33:
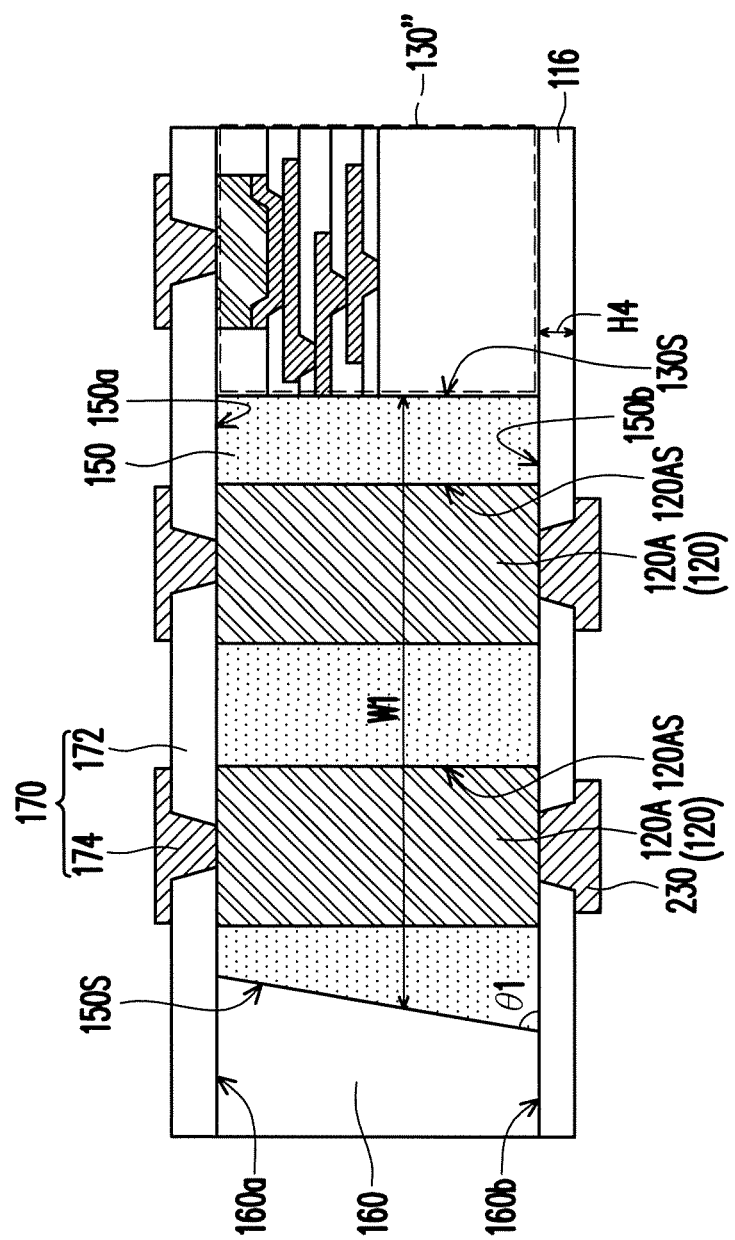
FIG. 33 is a schematic enlarged cross-sectional view illustrating a part of the semiconductor package in accordance with some exemplary embodiments of the disclosure.
Figure 34:
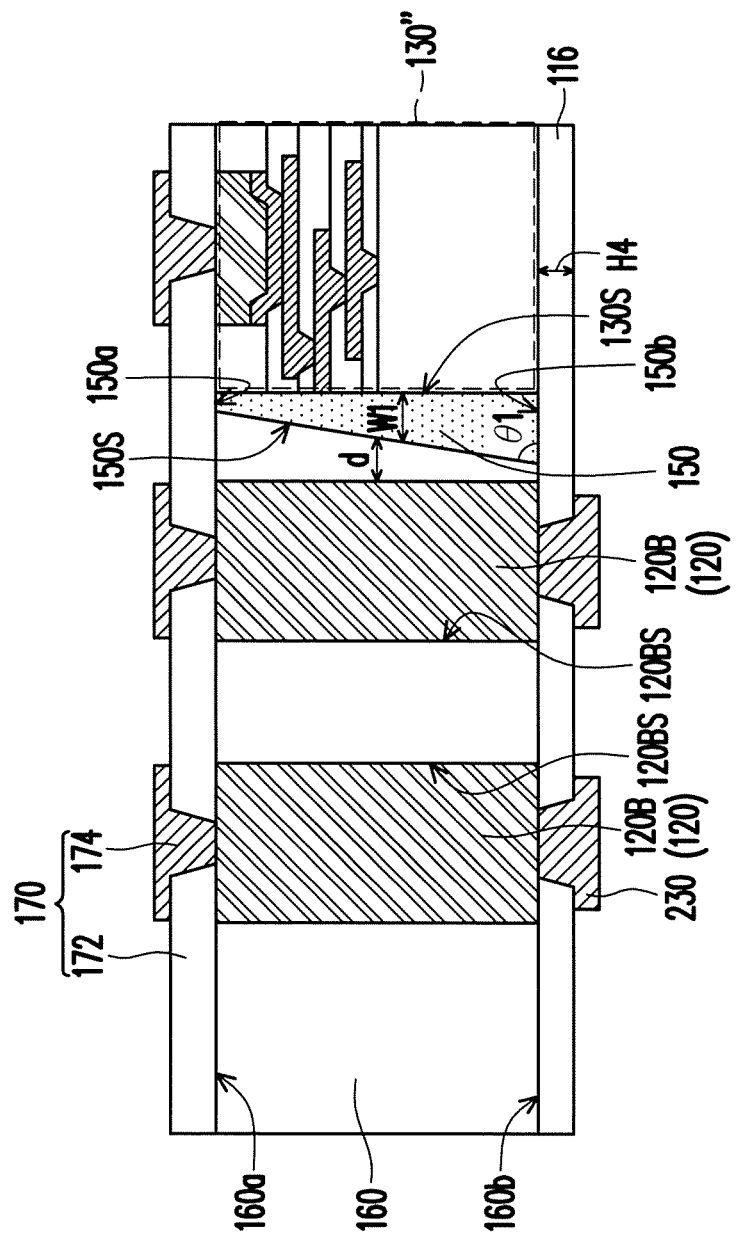
FIG. 34 is a schematic enlarged cross-sectional view illustrating a part of the semiconductor package in accordance with some exemplary embodiments of the disclosure.
Figure 35:
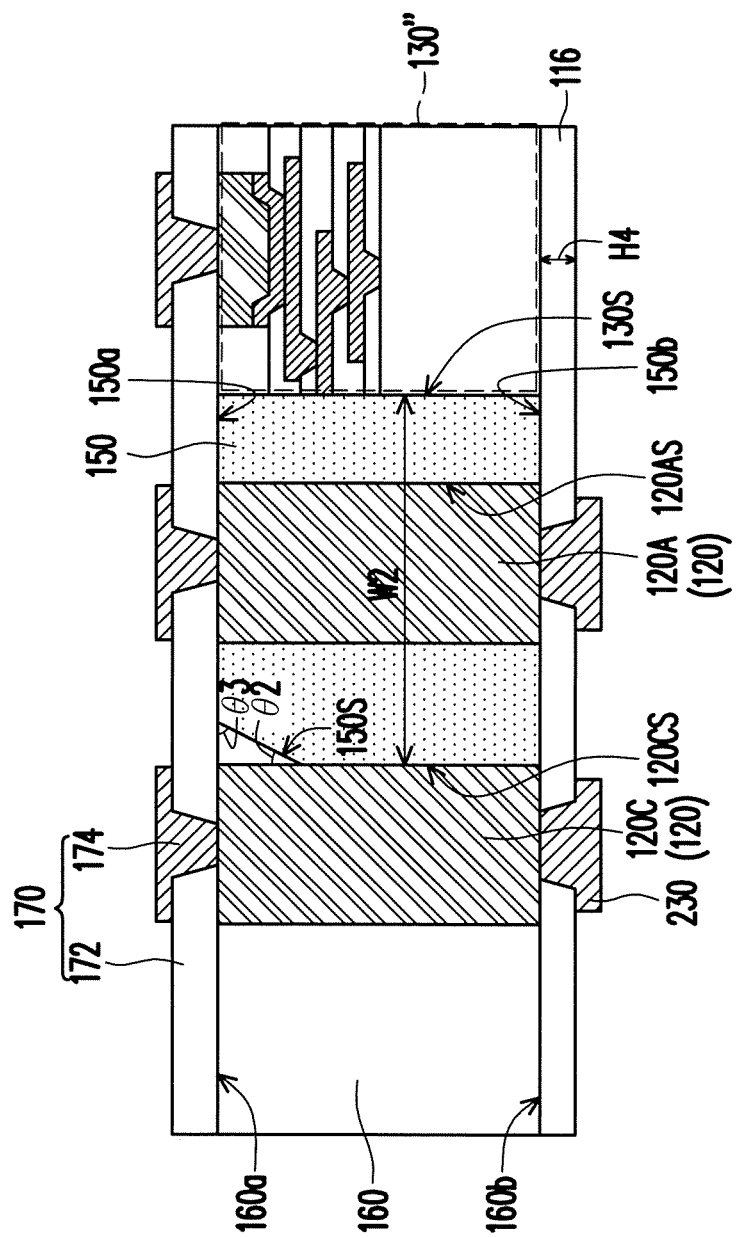
FIG. 35 is a schematic enlarged cross-sectional view illustrating a part of the semiconductor package in accordance with some exemplary embodiments of the disclosure.

FIG. 31 is a schematic cross-sectional view of a semiconductor package in accordance with some exemplary embodiments of the disclosure. FIG. 32 is a schematic enlarged cross-sectional view illustrating a part of the semiconductor package depicted in FIG. 31, where FIG. 32 illustrates an enlarged cross-sectional view of a portion of the semiconductor package depicted in FIG. 31 indicated by a dotted box C. FIG. 33 is a schematic enlarged cross-sectional view illustrating a part of the semiconductor package in accordance with some exemplary embodiments of the disclosure. FIG. 34 is a schematic enlarged cross-sectional view illustrating a part of the semiconductor package in accordance with some exemplary embodiments of the disclosure. FIG. 35 is a schematic enlarged cross-sectional view illustrating a part of the semiconductor package in accordance with some exemplary embodiments of the disclosure. In FIG. 32 to FIG. 35, only certain structural features including the buffer layer 116, the conductive pillars 120, the integrated circuit component 130", the insulating encapsulation 160, the redistribution circuit structure 170, and the conductive patterns 230 are stressed for illustration purposes, and only two conductive pillars 120 are illustrated for easy illustration.

Referring to FIG. 29 and FIG. 31 together, the semiconductor package 40A depicted in FIG. 29 and the semiconductor package 40C depicted in FIG. 31 are similar, the difference is that, for the semiconductor package 40C depicted in FIG. 31, an additional element, e.g. an insulating encapsulation 150, is further formed to warp at least a sidewall 130S of the integrated circuit component 130". The elements similar to or substantially the same as the elements described above will use the same reference numbers, and certain details or descriptions of the same elements and the relationship thereof (e.g. the relative positioning configuration and electrical connection) will not be repeated herein.

Referring to FIG. 31, in some embodiments, prior to the formation of the insulating encapsulation 160 described in FIG. 2, an insulating encapsulation 150 is formed over the carrier 112, and then the previously described manufacturing process as described in FIG. 2 to FIG. 6 and FIG. 25 to FIG. 29 above can be performed to obtain the semiconductor package 40C depicted in FIG. 31.

In some embodiments, a top surface 150a of the insulating encapsulation 150 is substantially levelled with the top surface 160a of the insulating encapsulation 160 and the top surfaces 120a of the conductive pillars 120, and a bottom surface 150b of the insulating encapsulation 150 is substantially levelled with the bottom surface 160b of the insulating encapsulation 160, the bottom surfaces 120b of the conductive pillars 120, and the surface of the connecting film 140 facing away from the backside 130b of the integrated circuit component 130". In other words, the top surface 150a of the insulating encapsulation 150 is coplanar to the top surface 160a of the insulating encapsulation 160 and the top surfaces 120a of the conductive pillars 120, and the bottom surface 150b of the insulating encapsulation 150 is coplanar to the bottom surface 160b of the insulating encapsulation 160, the bottom surfaces 120b of the conductive pillars 120, and the surface of the connecting film 140 facing away from the backside 130b of the integrated circuit component 130", as shown in FIG. 31.

Due to the insulating encapsulation 150, the adhesion degree of the integrated circuit component 130" and the buffer layer 116 is further enhanced. In the disclosure, the material of the insulating encapsulation 150 is different from the material of the insulating encapsulation 160. That is, the sidewall 150S of the insulating encapsulation 150 is referred as an interface of the insulating encapsulation 150 and the insulating encapsulation 160, where the interface is clearly shown in FIG. 31. The material the insulating encapsulation 150 and formation method thereof are similar to the processes for forming the insulating encapsulation 150 as described in FIG. 17, and thus may not be repeated herein.

In an example, as shown in FIG. 31 and FIG. 32, some of the conductive pillars 120 and the integrated circuit component 130" are encapsulated in the insulating encapsulation 150, and some of the conductive pillars 120 are encapsulated in the insulating encapsulation 160.

Referring to FIG. 32, the conductive pillars 120 includes at least one first conductive pillar 120A and at least one second conductive pillar 120B. In some embodiments, the first conductive pillar 120A is encapsulated in the insulating encapsulation 150, where a sidewall 120AS of the first conductive pillar 120A is covered by the insulating encapsulation 150, such that the first conductive pillar 120A is separated from the insulating encapsulation 160 by the insulating encapsulation 150. In other words, the first conductive pillar 120A is surrounded by and in contact with the insulating encapsulation 150 and is free of the insulating encapsulation 160. In some embodiments, the second conductive pillar 120B is encapsulated in the insulating encapsulation 160, where a sidewall 120BS of the second conductive pillar 120B is covered by the insulating encapsulation 160, such that the second conductive pillar 120B is separated from the insulating encapsulation 150 by the insulating encapsulation 160. In other words, the second conductive pillar 120B is surrounded by and in contact with the insulating encapsulation 160 and is free of the insulating encapsulation 150. As shown in FIG. 32, the first conductive pillar 120A penetrates the insulating encapsulation 150, and the second conductive pillar 120B penetrates the insulating encapsulation 160.

In certain embodiments, as shown in FIG. 32, the sidewall 150S and the bottom surface 150b of the insulating encapsulation 150 constitute an angle $\theta 1$, where the angle $\theta 1$ is an acute angle. In one embodiment, a range of the angle $\theta 1$ is about from 0.5° to 30°, however the disclosure is not limited thereto. In an alternative embodiment, the range of the angle $\theta 1$ is about from 30° to 60°. In an alternative embodiment, the range of the angle $\theta 1$ is about from 60° to 85°. The disclosure is not limited thereto.

In some embodiments, a maximum lateral width W1 from the sidewall 150S of the insulating encapsulation 150 to the sidewall 130S of the integrated circuit component 130" may range approximately from 10 µm to 100 µm, however the disclosure is not limited thereto. In an alternative embodiment, the maximum lateral width W1 may range approximately from 100 µm to 500 µm. In an alternative embodiment, the maximum lateral width W1 may be approximately above 500 µm.

In some embodiments, a maximum lateral distance d from the sidewall 150S of the insulating encapsulation 150 to the sidewall 120BS of the second conductive pillar 120B (e.g. the conductive pillar(s) 120 not covered by the insulating encapsulation 150) may range approximately from 5 µm to 100 µm, however the disclosure is not limited thereto. In an alternative embodiment, the maximum lateral distance d may range approximately from 100 µm to 500 µm. In an alternative embodiment, the maximum lateral distance d may be approximately above 500 µm.

Additionally, some various modifications of the configuration relationship of the conductive pillars 120, the insulating encapsulation 150, and the insulating encapsulation 160 are shown in FIG. 33 to FIG. 35. However, the disclosure is not limited thereto.

Referring to FIG. 33, the conductive pillars 120 includes at least two first conductive pillars 120A. In some embodiments, the first conductive pillars 120A are encapsulated in the insulating encapsulation 150, where the sidewalls 120AS of the first conductive pillars 120A are covered by the insulating encapsulation 150, such that the first conductive pillars 120A are separated from the insulating encapsulation 160 by the insulating encapsulation 150. In other words, the first conductive pillars 120A are surrounded by and in contact with the insulating encapsulation 150 and are free of the insulating encapsulation 160. As shown in FIG. 33, the first conductive pillars 120A penetrate the insulating encapsulation 150.

Referring to FIG. 34, the conductive pillars 120 includes at least two second conductive pillars 120B. In some embodiments, the second conductive pillars 120B are encapsulated in the insulating encapsulation 160, where the sidewalls 120BS of the second conductive pillars 120B are covered by the insulating encapsulation 160, such that the second conductive pillars 120B are separated from the insulating encapsulation 150 by the insulating encapsulation 160. In other words, the second conductive pillars 120B are surrounded by and in contact with the insulating encapsulation 160 and are free of the insulating encapsulation 150. As shown in FIG. 34, the second conductive pillars 120B penetrate the insulating encapsulation 160.

In the disclosure, the angle $\theta 1$, the maximum lateral width W1, and/or the maximum lateral distance d described in FIG. 32 also applied to the angle $\theta 1$, the maximum lateral width W1, and/or the maximum lateral distance d depicted in FIG. 33 and FIG. 34 and thus will not be repeated herein.

Referring to FIG. 35, the conductive pillars 120 includes at least one first conductive pillar 120A and at least one third conductive pillar 120C. In some embodiments, the first conductive pillar 120A is encapsulated in the insulating encapsulation 150, where the sidewall 120AS of the first conductive pillar 120A is covered by the insulating encapsulation 150, such that the first conductive pillar 120A is separated from the insulating encapsulation 160 by the insulating encapsulation 150. In other words, the first conductive pillar 120A is surrounded by and in contact with the insulating encapsulation 150 and is free of the insulating encapsulation 160. As shown in FIG. 35, the first conductive pillar 120A penetrates the insulating encapsulation 150. In some embodiments, the third conductive pillar 120C is encapsulated in the insulating encapsulating 150 and the insulating encapsulation 160, where the sidewall 120CS of the third conductive pillar 120C is partially covered by the insulating encapsulation 150 and is partially covered by the insulating encapsulation 160. In other words, the third conductive pillar 120C is surrounded by and in contact with the insulating encapsulation 150 and the insulating encapsulation 160, simultaneously. As shown in FIG. 35, the third conductive pillar 120C penetrates the interface (e.g., the sidewall 150S) of the insulating encapsulation 150 and the insulating encapsulation 160.

In some embodiments, an angle θ2 is between the interface (e.g., the sidewall 150S) of the insulating encapsulation 150 and the insulating encapsulation 160 and the sidewall 120CS of the third conductive pillar 120C, where the angle θ2 is an acute angle. In one embodiment, a range of the angle θ2 is about from 1° to 30°. In an alternative embodiment, the range of the angle θ2 is about from 30° to 60°. In an alternative embodiment, the range of the angle θ2 is about from 60° to 89°.

In some embodiments, an angle θ3 is between the interface (e.g., the sidewall 150S) of the insulating encapsulation 150 and the insulating encapsulation 160 and the top surface 160a of the insulating encapsulation 160, where the angle θ3 is an acute angle (e.g. θ3=90°−θ2).

In some embodiments, a maximum lateral width W2 measured from the sidewall 150S of the insulating encapsulation 150 to the sidewall 120CS of the third conductive pillar 120C (e.g. the conductive pillar(s) 120 penetrating the interface of two different insulating encapsulations) may approximately range from 10 μm to 100 μm, however the disclosure is not limited thereto. In an alternative embodiment, the maximum lateral width W2 may approximately range from 100 μm to 500 μm. In an alternative embodiment, the maximum lateral width W2 may be approximately above 500 μm.

In an alternative embodiment (not shown), the conductive pillars 120 may include at least one second conductive pillar 120B and at least one third conductive pillar 120C, and the second conductive pillar 120B penetrates the insulating encapsulation 160 while the third conductive pillar 120C penetrates the interface of the insulating encapsulation 150 and the insulating encapsulation 160. In an alternative embodiment (not shown), the conductive pillars 120 may include at least one first conductive pillar 120A, at least one second conductive pillar 120B and at least one third conductive pillar 120C, and the first conductive pillar 120A and the second conductive pillar 120B respectively penetrate the insulating encapsulation 150 and the insulating encapsulation 160 while the third conductive pillar 120C penetrates the interface of the insulating encapsulation 150 and the insulating encapsulation 160. The above not shown embodiments may have the similar specifications of the angles θ1~θ3, the maximum lateral widths W1~W2, and/or the maximum lateral distance d described in FIG. 32 to FIG. 35. The disclosure is not limited thereto.

Figure 36:
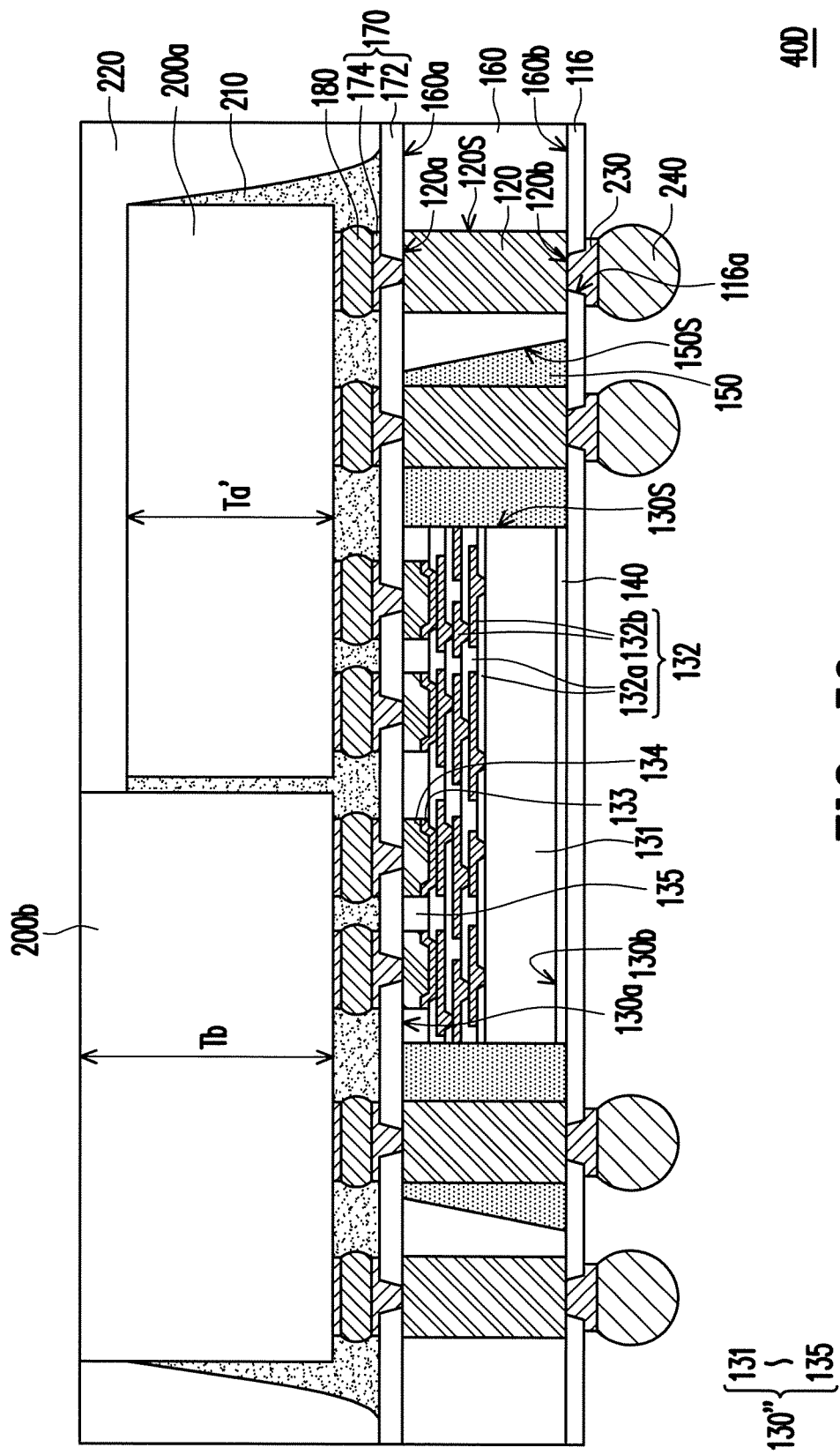
FIG. 36 is a schematic cross-sectional view of a semiconductor package in accordance with some exemplary embodiments of the disclosure.

FIG. 36 is a schematic cross-sectional view of a semiconductor package in accordance with some exemplary embodiments of the disclosure. Referring to FIG. 31 and FIG. 36 together, the semiconductor package 40C depicted in FIG. 31 and the semiconductor package 40D depicted in FIG. 36 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 31 and FIG. 36 together, the difference is that, for the semiconductor package 40D depicted in FIG. 36, the height Ta of the semiconductor device 200a is different from the height Tb of the semiconductor device 200b. As shown in FIG. 36, the height Ta of the semiconductor device 200a is less than the height Tb of the semiconductor device 200b. However the disclosure is not limited thereto; in an alternative embodiment (not shown), the height Ta of the semiconductor device 200a may be greater than the height Tb of the semiconductor device 200b.

According to some embodiments, a semiconductor package including an insulating encapsulation, an integrated circuit component, and conductive elements is provided. The integrated circuit component is encapsulated in the insulating encapsulation, wherein the integrated circuit component has at least one through silicon via protruding from the integrated circuit component. The conductive elements are located on the insulating encapsulation, wherein one of the conductive elements is connected to the at least one through silicon via, and the integrated circuit component is electrically connected to the one of the conductive elements through the at least one through silicon via.

According to some embodiments, a semiconductor package including an insulating encapsulation, at least one integrated circuit component, at least two semiconductor devices, a plurality of conductive pillars and conductive elements is provided. The at least one integrated circuit component is encapsulated in the insulating encapsulation. The at least two semiconductor devices are disposed on the at least one integrated circuit component and electrically communicate to each other through the at least one integrated circuit component. The plurality of conductive pillars is encapsulated in the insulating encapsulation and electrically connected to the at least two semiconductor devices. The conductive elements are respectively electrically connected to the plurality of conductive pillars, wherein the plurality of conductive pillars is located between the conductive elements and the at least two semiconductor devices.

According to some embodiments, a method of fabricating a semiconductor package is provided with the following steps, providing at least one integrated circuit component comprising a semiconductor substrate, an interconnection structure disposed on a first surface of the semiconductor substrate, and at least one through silicon via embedded in the semiconductor substrate and connected to the interconnection structure; laterally encapsulating the at least one integrated circuit component with an insulating encapsulation; providing at least two semiconductor devices and forming connectors between the at least one integrated circuit component and at least two semiconductor devices to electrically communicate the at least two semiconductor devices therebetween through the at least one integrated circuit component and the connectors; partially removing a portion of the semiconductor substrate to reveal the at least one through silicon via, such that a portion of the at least one through silicon via protrudes from a second surface of the semiconductor substrate, wherein the second surface is opposite to the first surface; forming conductive elements on the insulating encapsulation, wherein one of the conductive elements is connected to the portion of the at least one through silicon via protruding from the second surface of the semiconductor substrate.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
an insulating encapsulation having a first side and a second side opposite to the first side;
an integrated circuit component, encapsulated in the insulating encapsulation and exposed by the first side of the insulating encapsulation, wherein the integrated circuit component has at least one through silicon via protruding from the integrated circuit component; and
conductive elements, located on the second side of the insulating encapsulation, wherein one of the conductive elements is connected to the at least one through silicon via, and the integrated circuit component is electrically connected to the one of the conductive elements through a portion of the at least one through silicon via protruding from the integrated circuit component, wherein a surface of the at least one through silicon via connected to the one of the conductive elements is substantially levelled with the second side of the insulating encapsulation; and
a redistribution circuit structure, physically connected to the integrated circuit component and the insulating encapsulation, and the insulating encapsulation being located between the redistribution circuit structure and the conductive elements.

2. The semiconductor package as claimed in claim 1, further comprising a plurality of conductive pillars arranged aside the integrated circuit component, wherein the plurality of conductive pillars is electrically connected to the conductive elements, respectively.

3. The semiconductor package as claimed in claim 2, further comprising a glue material covering a sidewall of the integrated circuit component and encapsulated in the insulating encapsulation,
wherein an interface is between the glue material and the insulating encapsulation, and the plurality of conductive pillars penetrates and is in contact with the glue material, and the plurality of conductive pillars and the insulating encapsulation are separated by the glue material.

4. The semiconductor package as claimed in claim 2, further comprising a glue material covering a sidewall of the integrated circuit component and encapsulated in the insulating encapsulation,
wherein an interface is between the glue material and the insulating encapsulation, and the plurality of conductive pillars comprises:
at least one first conductive pillar, wherein the at least one first conductive pillar penetrates and is in contact with the glue material, and the at least one first conductive pillar and the insulating encapsulation are separated by the glue material; and
at least one second conductive pillar, wherein the at least one second conductive pillar penetrates and is in contact with the insulating encapsulation, and the at least one second conductive pillar and the glue material are separated by the insulating encapsulation.

5. The semiconductor package as claimed in claim 4, wherein the plurality of conductive pillars further comprises at least one third conductive pillar penetrating the interface, wherein the at least one third conductive pillar is in contact with the glue material and the insulating encapsulation.

6. The semiconductor package as claimed in claim 2, further comprising a glue material covering a sidewall of the integrated circuit component and encapsulated in the insulating encapsulation,
wherein an interface is between the glue material and the insulating encapsulation, and the plurality of conductive pillars penetrates and is in contact with the insulating encapsulation, and the plurality of conductive pillars and the glue material are separated by the insulating encapsulation.

7. The semiconductor package as claimed in claim 1, further comprising at least two semiconductor devices disposed on the integrated circuit component and electrically connected to the integrated circuit component, wherein the at least two semiconductor devices electrically communicate to each other through the integrated circuit component.

8. The semiconductor package as claimed in claim 7, further comprising a plurality of conductive pillars arranged aside the integrated circuit component, wherein each of the at least two semiconductor devices is electrically connected to at least one of the plurality of conductive pillars, and the plurality of conductive pillars is electrically connected to the conductive elements, respectively.

9. A semiconductor package, comprising:
an insulating encapsulation having a first side and a second side opposite to the first side;
at least one integrated circuit component having a first surface and a second surface opposite to the first surface and encapsulated in the insulating encapsulation, wherein the first surface of the at least one integrated circuit component is substantially levelled with the first side of the insulating encapsulation;
at least two semiconductor devices, disposed on the first side of the insulating encapsulation and electrically communicating to each other through the at least one integrated circuit component;
a plurality of conductive pillars, encapsulated in the insulating encapsulation and electrically connected to the at least two semiconductor devices;
conductive elements, located on the second side of the insulating encapsulation and electrically connected to the plurality of conductive pillars, wherein the plurality of conductive pillars is located between the conductive elements and the at least two semiconductor devices;
a redistribution circuit structure, located on and electrically coupled to the at least one integrated circuit component and the plurality of conductive pillars, and the redistribution circuit structure located between the insulating encapsulation and the at least two semiconductor devices; and a glue material, covering a sidewall of the at least one integrated circuit component and laterally located between the at least one integrated circuit component and the insulating encapsulation, wherein the glue material has a third surface substantially levelled with the first side of the insulating encapsulation and a fourth surface substantially levelled with the second side of the insulating encapsulation, the third surface is opposite to the fourth surface, and a lateral size of the third surface in a cross-section is smaller than a lateral size of the fourth surface in the cross-section.

10. The semiconductor package as claimed in claim 9, the plurality of conductive pillars are arranged aside the integrated circuit component, wherein each of the at least two semiconductor devices is electrically connected to at least one of the plurality of conductive pillars.

11. The semiconductor package as claimed in claim 10, wherein an interface is between the glue material and the insulating encapsulation, and the plurality of conductive pillars penetrates and is in contact with the glue material, and the plurality of conductive pillars and the insulating encapsulation are separated by the glue material.

12. The semiconductor package as claimed in claim 10, wherein an interface is between the glue material and the insulating encapsulation, and the plurality of conductive pillars comprises:
at least one first conductive pillar, wherein the at least one first conductive pillar penetrates and is in contact with the glue material, and the at least one first conductive pillar and the insulating encapsulation are separated by the glue material; and
at least one second conductive pillar, wherein the at least one second conductive pillar penetrates and is in contact with the insulating encapsulation, and the at least one second conductive pillar and the glue material are separated by the insulating encapsulation.

13. The semiconductor package as claimed in claim 12, wherein the plurality of conductive pillars further comprises at least one third conductive pillar penetrating the interface, wherein the at least one third conductive pillar is in contact with the glue material and the insulating encapsulation.

14. The semiconductor package as claimed in claim 10, wherein an interface is between the glue material and the insulating encapsulation, and the plurality of conductive pillars penetrates and is in contact with the insulating encapsulation, and the plurality of conductive pillars and the glue material are separated by the insulating encapsulation.

15. The semiconductor package as claimed in claim 9, further comprising:
connectors, wherein the connectors are located between and electrically connects the at least one integrated circuit component and the at least two second semiconductor devices; and
an underfill material, wherein the underfill material at least encapsulates the connectors.

16. The semiconductor package as claimed in claim 9, wherein the at least one integrated circuit component comprising:
a semiconductor substrate having a frontside surface and a backside surface opposite to the frontside surface; and
an interconnection structure covering the frontside surface of the semiconductor substrate.

17. A method of manufacturing a semiconductor package, comprising:
providing at least one integrated circuit component comprising a semiconductor substrate, an interconnection structure disposed on a first surface of the semiconductor substrate, and at least one through silicon via embedded in the semiconductor substrate and connected to the interconnection structure;
laterally encapsulating the at least one integrated circuit component with an insulating encapsulation;
forming a redistribution circuit structure on the at least one integrated circuit component and the insulating encapsulation, the redistribution circuit structure being physically connecting to the interconnection structure and the insulating encapsulation;
providing at least two semiconductor devices and forming connectors between the redistribution circuit structure electrically connected to the at least one integrated circuit component and the at least two semiconductor devices to electrically communicate the at least two semiconductor devices therebetween through the at least one integrated circuit component and the connectors, the interconnection structure being between the at least two semiconductor devices and the semiconductor substrate;
performing a planarizing process on the insulating encapsulation to expose a second surface of the semiconductor substrate and substantially level the second surface of the semiconductor substrate with a surface of the insulating encapsulation and a bottom surface of the at least one through silicon via, wherein the second surface of the semiconductor substrate is opposite to the first surface of the semiconductor substrate, the bottom surface of the at least one through silicon via is farther away from the interconnection structure with respect to a top surface of the at least one through silicon via;
partially removing a portion of the semiconductor substrate to have a portion of the at least one through silicon via protrudes from the second surface of the semiconductor substrate; and
forming conductive elements on the insulating encapsulation, wherein one of the conductive elements is connected to the portion of the at least one through silicon via protruding from the second surface of the semiconductor substrate.

18. The method as claimed in claim 17, further comprising:
forming a plurality of conductive pillars aside the at least one integrated circuit component before encapsulating the at least one integrated circuit component, wherein the plurality of conductive pillars is electrically connected to the conductive elements, respectively.

19. The method as claimed in claim 18, further comprising:
laterally encapsulating sidewalls of the at least one integrated circuit component with a glue material before encapsulating the at least one integrated circuit component with the insulating encapsulation; and
laterally encapsulating sidewalls of at least one of the plurality of conductive pillars with the insulating encapsulation or the glue material.

20. The method as claimed in claim 19, wherein the first insulating material is formed by glue dispensing.

* * * * *